United States Patent
Kang et al.

(10) Patent No.: US 12,074,157 B2
(45) Date of Patent: Aug. 27, 2024

(54) ELECTROSTATIC DISCHARGE PROTECTION DEVICES

(71) Applicant: SAMSUNG ELECTRONICS CO., LTD., Suwon-si (KR)

(72) Inventors: Dae-Lim Kang, Hwaseong-si (KR); Hyun-Jo Kim, Seoul (KR); Jong-Mil Youn, Yongin-si (KR); Soo-Hun Hong, Gunpo-si (KR)

(73) Assignee: Samsung Electronics Co., Ltd. (KR)

( * ) Notice: Subject to any disclaimer, the term of this patent is extended or adjusted under 35 U.S.C. 154(b) by 638 days.

(21) Appl. No.: 17/320,477

(22) Filed: May 14, 2021

(65) Prior Publication Data
US 2021/0272950 A1 Sep. 2, 2021

Related U.S. Application Data

(60) Continuation of application No. 16/167,117, filed on Oct. 22, 2018, now Pat. No. 11,011,511, which is a
(Continued)

(30) Foreign Application Priority Data

Jun. 3, 2014 (KR) ........................ 10-2014-0067691

(51) Int. Cl.
*H01L 27/02* (2006.01)
*H01L 21/02* (2006.01)
(Continued)

(52) U.S. Cl.
CPC .... *H01L 27/0266* (2013.01); *H01L 21/02293* (2013.01); *H01L 27/0248* (2013.01);
(Continued)

(58) Field of Classification Search
CPC ................................................ H01L 27/0266
See application file for complete search history.

(56) References Cited

U.S. PATENT DOCUMENTS 7,964,893 B2  6/2011 Lee
8,039,899 B2  10/2011 Lim
(Continued)

FOREIGN PATENT DOCUMENTS

CN  103199012 A  7/2013

OTHER PUBLICATIONS

Machine translation, First Office Action, The State Intellectual Property Office of the People's Republic of China, Application No. 201510292031.3, issued Mar. 7, 2019, all pages. (Year: 2019).*
(Continued)

*Primary Examiner* — Victoria K. Hall
(74) *Attorney, Agent, or Firm* — Fish & Richardson P.C.

(57) ABSTRACT

An ESD protection device includes a substrate having an active fin extending in a first direction, a plurality of gate structures extending in a second direction at a given angle with respect to the first direction and partially covering the active fin, an epitaxial layer in a recess on a portion of the active fin between the gate structures, an impurity region under the epitaxial layer, and a contact plug contacting the epitaxial layer. A central portion of the impurity region is thicker than an edge portion of the impurity region, in the first direction. The contact plug lies over the central portion of the impurity region.

10 Claims, 47 Drawing Sheets

Related U.S. Application Data division of application No. 14/599,593, filed on Jan. 19, 2015, now Pat. No. 10,153,270.

(51) Int. Cl.
*H01L 27/088* (2006.01)
*H01L 29/08* (2006.01)
*H01L 29/16* (2006.01)
*H01L 29/78* (2006.01)

(52) U.S. Cl.
CPC ...... *H01L 27/0886* (2013.01); *H01L 29/0847* (2013.01); *H01L 29/1608* (2013.01); *H01L 29/7831* (2013.01); *H01L 29/785* (2013.01)

(56) References Cited

U.S. PATENT DOCUMENTS

| | | | |
|---|---|---|---|
| 8,169,760 B2 | 5/2012 | Chang et al. | |
| 8,426,916 B2 | 4/2013 | Kim et al. | |
| 8,455,947 B2 | 6/2013 | Shrivastava et al. | |
| 8,570,698 B2 | 10/2013 | Lee et al. | |
| 8,587,071 B2 | 11/2013 | Tsai et al. | |
| 8,597,993 B2 | 12/2013 | Chang et al. | |
| 8,598,656 B2 | 12/2013 | Zhu et al. | |
| 8,754,486 B2 | 6/2014 | Lee et al. | |
| 9,117,669 B2* | 8/2015 | Lin | H01L 29/66136 |
| 9,397,098 B2* | 7/2016 | Lin | H01L 29/45 |
| 10,153,270 B2* | 12/2018 | Kang | H01L 27/0886 |
| 11,011,511 B2* | 5/2021 | Kang | H01L 29/1608 |
| 2008/0042207 A1 | 2/2008 | Wu et al. | |
| 2009/0258463 A1* | 10/2009 | Kim | H01L 29/78 438/142 |
| 2012/0280288 A1 | 11/2012 | Ando et al. | |
| 2013/0149830 A1 | 6/2013 | Rhee et al. | |
| 2013/0187232 A1 | 7/2013 | Takasu | |
| 2013/0193526 A1 | 8/2013 | Lo et al. | |
| 2013/0234250 A1* | 9/2013 | Lin | H01L 21/823437 257/E27.06 |
| 2014/0008736 A1 | 1/2014 | Li et al. | |
| 2014/0306296 A1* | 10/2014 | Jeon | H01L 29/66795 438/283 |
| 2015/0236124 A1 | 8/2015 | Chang | |
| 2015/0270342 A1* | 9/2015 | Tsai | H01L 29/1608 438/283 |

OTHER PUBLICATIONS

Chinese Office Action Dated Mar. 7, 2019 in Related Chinese Application No. 201510292031.3.

* cited by examiner

US 12,074,157 B2

ELECTROSTATIC DISCHARGE PROTECTION DEVICES

PRIORITY STATEMENT

This is a Continuation of U.S. application Ser. No. 16/167,117, filed Oct. 22, 2018, and issued as U.S. Pat. No. 11,011,511 on May 18, 2021, which is a Divisional of U.S. application Ser. No. 14/599,593, filed Jan. 19, 2015, and issued as U.S. Pat. No. 10,153,270 on Dec. 11, 2018, and a claim of priority under 35 USC § 119 is made to Korean Patent Application No. 10-2014-0067691, filed on Jun. 3, 2014 in the Korean Intellectual Property Office (KIPO), the contents of which are hereby incorporated by reference in their entirety.

BACKGROUND

1. Field

The inventive concepts relate to electrostatic discharge (ESD) protection devices. More particularly, the inventive concepts relate to finFET type of ESD protection devices.

2. Description of the Related Art

An ESD protection device may have gate structures formed as spaced apart from each other. In finFET type of ESD devices, these gate structures may be spaced from each other by relatively large distances. An epitaxial layer may be grown to fill a recess between the gate structures, and a contact plug may be formed on the epitaxial layer. An external voltage may be applied to the contact plug to facilitate an electrostatic discharge of the gate structures.

SUMMARY

According to an embodiment according to the inventive concepts, there is provided an ESD protection device including a substrate including an active fin extending in a first direction, a plurality of gate structures each extending in a second direction subtending an angle with the first direction and covering parts of the active fin, respectively, an epitaxial layer on a portion of the active fin between the gate structures, an impurity region under the epitaxial layer, and a contact plug contacting a top of the epitaxial layer, and in which a central portion of the impurity region, in the first direction, is thicker than an edge portion of the impurity region located to the side of the central portion in the first direction, and the contact plug overlies the central portion of the impurity region.

According to another embodiment according to the inventive concepts, there is provided an electrostatic discharge (ESD) protection device which includes a substrate including an active fin extending in a first direction, a plurality of gate structures arranged in the first direction, each of the gate structures extending in a second direction subtending a given angle with the first direction and covering a respective part of the active fin, an epitaxial layer having portions, spaced from each other in the first direction, on a portion of the active fin between neighboring ones of the gate structures, a first impurity region at an upper portion of the active fin between the portions of the epitaxial layer; and a contact plug contacting a top of the impurity region.

According to another embodiment according to the inventive concepts, there is provided an electrostatic discharge (ESD) protection device which includes a substrate including an active fin extending longitudinally in a first direction, the substrate having at least one recess therein extending in at least an upper portion of the active fin, and the substrate having at least one region of impurities, a pair of gate structures disposed on the active fin, the gate structures spaced from each other in the lengthwise direction of the active fin, each said at least one recess located between the gate structures in the lengthwise direction, and each said at least one region of impurities located in a portion of the active fin between the gate structures in the lengthwise direction, an epitaxial layer extending over lower portions of sides of the gates structures that face each other and into each said at least one recess, a contact plug extending vertically between the gate structures and contacting a top of the epitaxial layer or the top of the region of impurities, and an isolation layer that covers opposite sides of the lower portion of the active fin.

BRIEF DESCRIPTION OF THE DRAWINGS

An embodiment according to the inventive concepts will be more clearly understood from the following detailed description taken in conjunction with the accompanying drawings.

FIG. 1 is a plan view illustrating an electrostatic discharge (ESD) protection device in accordance with an embodiment according to the inventive concepts;

FIGS. 65, 66 and 67 are cross-sectional views of the ESD protection device taken along lines A-A', B-B' and D-D' of FIG. 54, respectively.

DETAILED DESCRIPTION OF THE PREFERRED EMBODIMENTS

Figure 1:
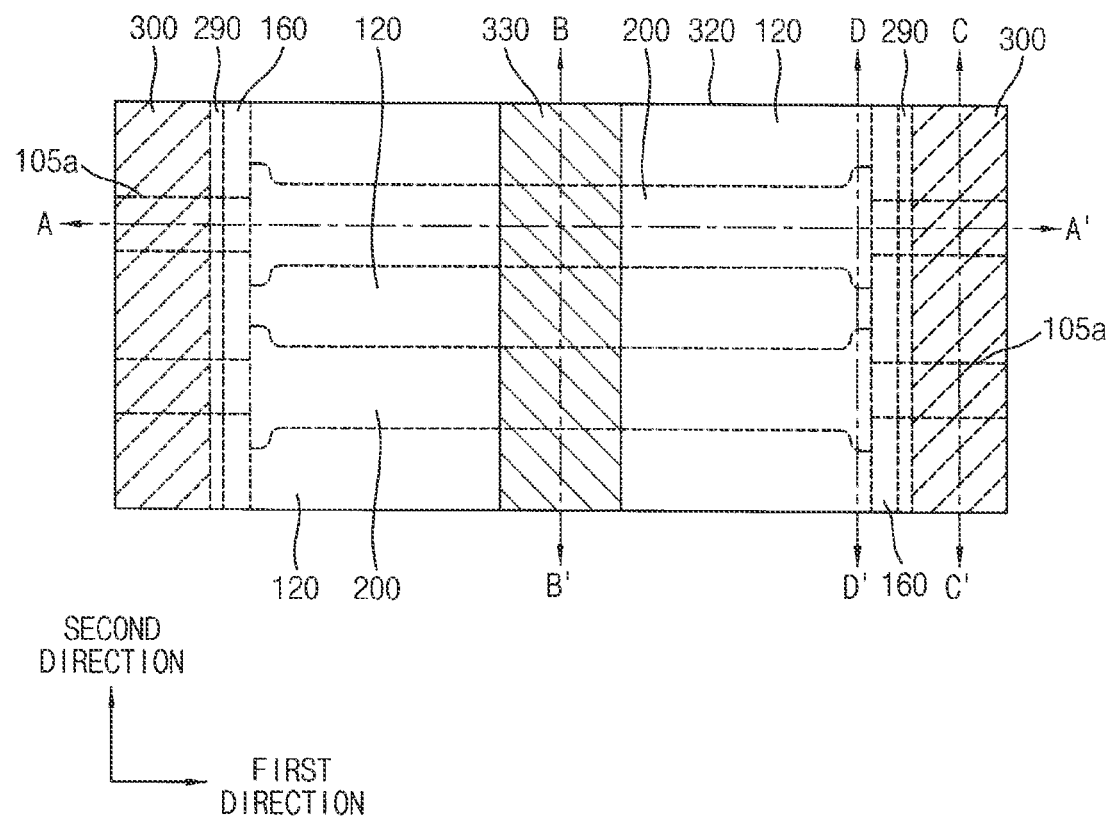
FIGS. 1 to 67 represent non-limiting, an embodiment according to the inventive concepts as described herein.

Various an embodiment according to the inventive concepts will be described more fully hereinafter with reference to the accompanying drawings, in which some an embodiment according to the inventive concepts are shown. The present inventive concept may, however, be embodied in many different forms and should not be construed as limited to the embodiments according to the inventive concepts set forth herein. Rather, these an embodiment according to the inventive concepts are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. The term "extending" when not qualified will generally reference the lengthwise or longitudinal direction, i.e., the greatest dimension, of an element or feature having a line-shaped form, or will reference the vertical direction of features such as openings, trenches, recesses and the like in a layer(s), as the context and drawings will make clear. Like numerals refer to like elements throughout. As used herein, the term "and/or" includes any and all combinations of one or more of the associated listed items.

It will be understood that, although the terms first, second, third, fourth or the like. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular an embodiment according to the inventive concepts only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

An embodiment according to the inventive concepts are described herein with reference to cross-sectional illustrations that are schematic illustrations of idealized an embodiment according to the inventive concepts (and intermediate structures). As such, variations from the shapes of the illustrations as a result, for example, of manufacturing techniques and/or tolerances, are to be expected. Thus, an embodiment according to the inventive concepts should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An embodiment of an electrostatic discharge (ESD) protection device in accordance with the inventive concepts will now be described in detail with reference to FIGS. 1 to 5.

The ESD protection device may include a substrate 100, a gate structure, an epitaxial layer 200, an impurity region 240, and a contact plug 330. The ESD protection device may further include an isolation layer 120, a gate spacer 160, and first and second insulating interlayers 270 and 320.

The substrate 100 may be a silicon substrate, a germanium substrate, a silicon-germanium substrate, a silicon-on-insulator (SOI) substrate, a germanium-on-insulator (GOI) substrate, or the like. The substrate 100 may include a well region (not shown) and/or a halo region (not shown) doped with p-type impurities, for example, boron, aluminum, or the like.

A field region whose top surface may be covered by the isolation layer 120 and an active region whose top surface may be exposed by the isolation layer 120 may be defined in the substrate 100. The active region may protrude from the isolation layer 120 and have the shape of a fin and so may be referred to hereinafter as an active fin 105. The active fin 105 may include a lower portion 105b whose sides are covered by the isolation layer 120, and an upper portion 105a whose sides are not covered by the isolation layer 120 but which protrudes upwardly from the isolation layer 120.

The active fin 105 may extend in a first direction substantially parallel to a top surface of the substrate 100, and a plurality of the active fins 105 may be spaced apart from each other in a second direction substantially parallel to the top surface of the substrate 100 and subtending a given angle with the first direction. In an example of the illustrated embodiment, the second direction subtends an angle of about 90 degrees with the first direction, and thus the first and second directions are substantially perpendicular to each other.

The isolation layer 120 may include an oxide, for example, silicon oxide.

In an embodiment according to the inventive concepts, the gate structure may extend in the second direction over part of each active fin 105, and a plurality of gate structures may be spaced from each other in the first direction.

In an embodiment according to the inventive concepts, the gate structure may include a gate insulation layer pattern 130, a high-k dielectric layer pattern 290, and a gate electrode 300 sequentially stacked on the active fin 105 and the isolation layer 120. The high-k dielectric layer pattern 290 may cover the bottom and sides of the gate electrode 300. The gate insulation layer pattern 130 may include an oxide, e.g., silicon oxide; the high-k dielectric layer pattern 290 may include a metal oxide having a high dielectric constant, e.g., hafnium oxide, tantalum oxide, zirconium oxide, or the like; and the gate electrode 300 may include a material having a low resistance, e.g., a metal such as aluminum, copper, tantalum, or the like, or a metal nitride thereof.

The gate spacer 160 may be formed on sides of the gate structure, and may include a nitride, e.g., silicon nitride.

The epitaxial layer 200 may be formed on a portion of the active fin 105 in a recess 180 between the gate structures.

In the illustrated embodiment according to the inventive concepts, the bottom of the recess 180 is disposed at a level beneath that of a top surface of the lower portion 105b of the active fin 105. Alternatively, the bottom of the recess 180 may be disposed at a level above that of the bottom of the upper portion 105a of the active fin 105.

In an embodiment according to the inventive concepts, the epitaxial layer 200 may extend in the first direction as viewed in plan, and a portion thereof adjacent to the gate structure may be relatively wide. The cross section of an upper portion of the epitaxial layer 200, in the second direction, may have the shape of a pentagon or hexagon. In an embodiment according to the inventive concepts, the top of the portion of the epitaxial layer 200 adjacent to the gate structure may be disposed at a level above the tops of other portions of the epitaxial layer 200. Thus, the top surface of a central portion of the epitaxial layer 200, in the first direction, may be disposed at a level beneath the level of the top surface of edge portions of the epitaxial layer 200.

That is, the epitaxial layer 200 may not completely fill the recess 180. Thus, the top surface of the central portion of the epitaxial layer 200 may be disposed at a level beneath that of the top surface of a portion of the active fin 105. The top surfaces of the edge portions of the epitaxial layer 200 may be disposed at a level above that of the top surface of the portion of the active fin 105. Thus, the edge portions of the epitaxial layer 200 may cover a lower part of the side of the gate spacer 160.

In an embodiment according to the inventive concepts, the epitaxial layer 200 may include single crystalline silicon or single crystalline silicon carbide, and may be doped with n-type impurities, e.g., phosphorus or arsenic.

Figure 2:
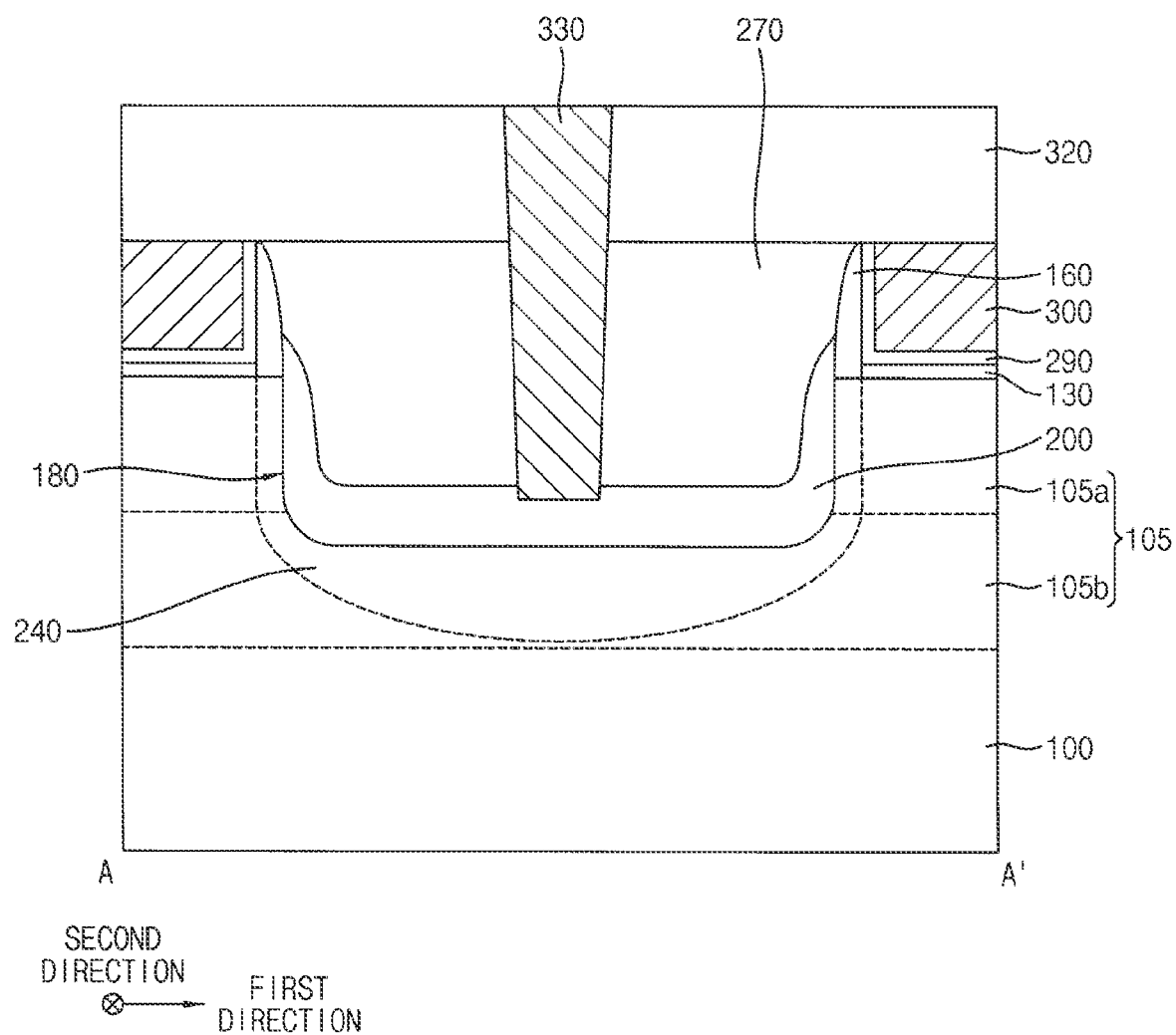
FIGS. 2 to 5 are cross-sectional views taken along lines A-A', B-B', C-C' and D-D', respectively, in FIG. 1.
Figure 3:
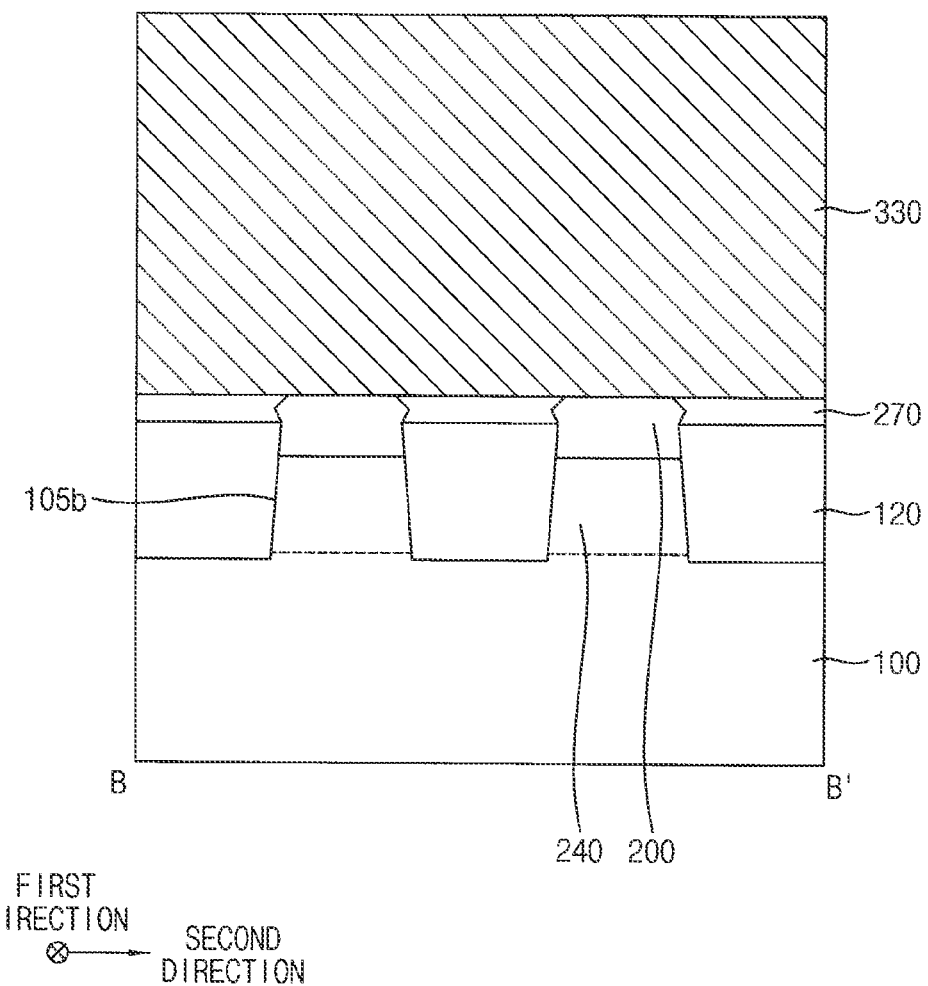
Figure 4:
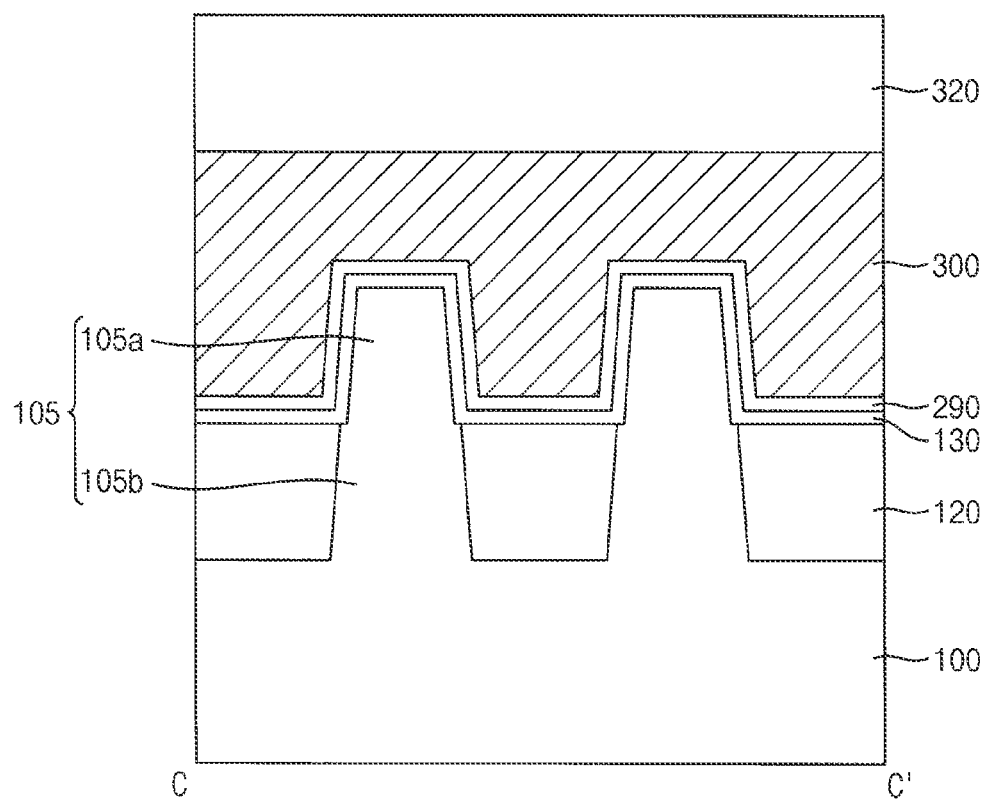
Figure 4:
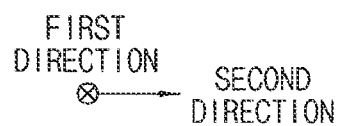
Figure 5:
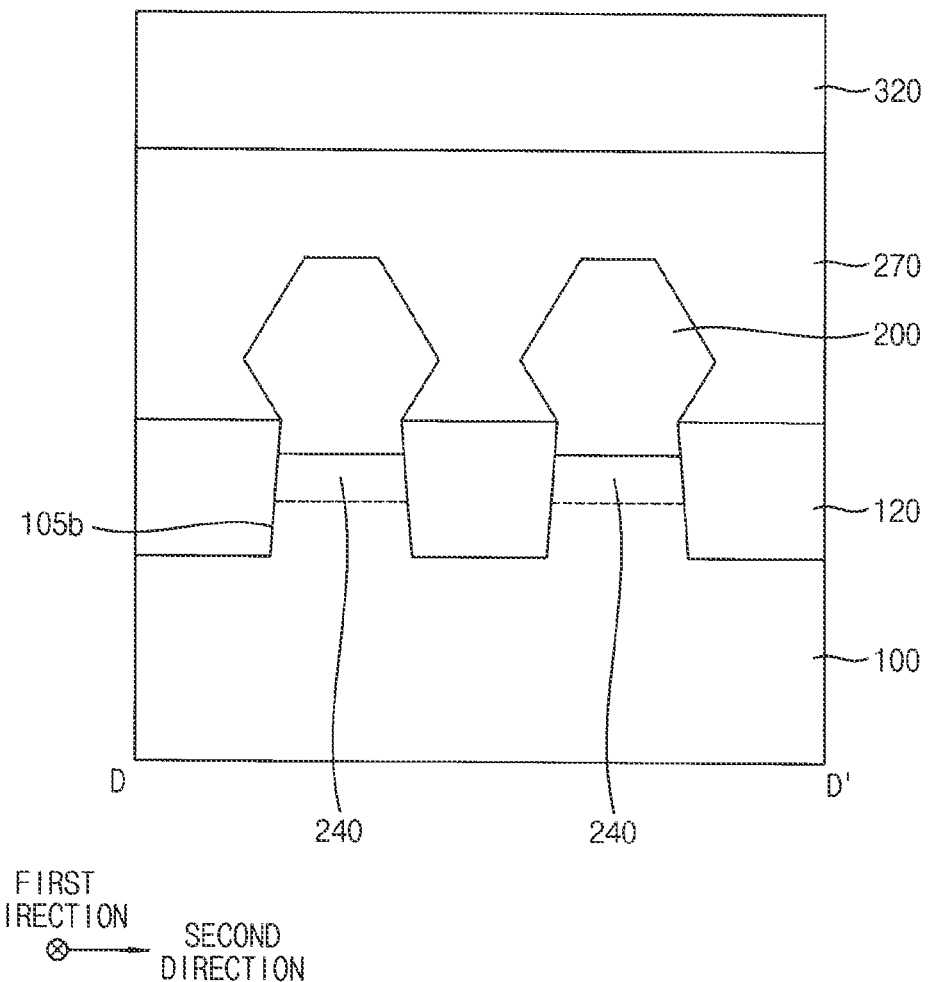

The impurity region 240 may be formed at a portion of the active fin 105 under the epitaxial layer 200, and may be doped with n-type impurities, e.g., phosphorus or arsenic. In an embodiment according to the inventive concepts, the impurity region 240 may have a thickness greater at a central portion than at edge portions along the first direction. As shown in FIG. 2, the bottom of the central portion of the impurity region 240 may be disposed at a level beneath that of those of the edge portions thereof. The slope of the bottom of the impurity region 240 may be flat or relatively gentle in the first direction, which may prevent or reduce a junction leakage.

The epitaxial layer 200 and the impurity region 240 may serve as a source/drain region of the ESD protection device. The gate structure and the source/drain region may form a negative-channel metal oxide semiconductor (NMOS).

The contact plug 330 may be formed through the first and second insulating interlayers 270 and 320, and contact a top surface of the epitaxial layer 200. In an embodiment according to the inventive concepts, the contact plug 330 may penetrate through an upper portion of the epitaxial layer 200 so as to sufficiently contact the epitaxial layer 200.

In an embodiment according to the inventive concepts, the contact plug 330 may be formed on the epitaxial layer 200 to overlap the central portion of the relatively thick impurity region 240. Thus, even though a high voltage may be applied to the impurity region 240 via the contact plug 330, the junction leakage may be prevented or reduced.

That is, when a high voltage is applied via the contact plug 330 to the ESD protection device, the junction leakage may be prevented or reduced by the relatively thick impurity region 240 having a flat or gently sloped bottom.

FIGS. 6 to 28 illustrate an embodiment of a method of manufacturing an ESD protection device in accordance with the inventive concepts.

This method may be used for manufacturing the ESD protection device illustrated in FIGS. 1 to 5, but is not be limited thereto.

Figure 6:
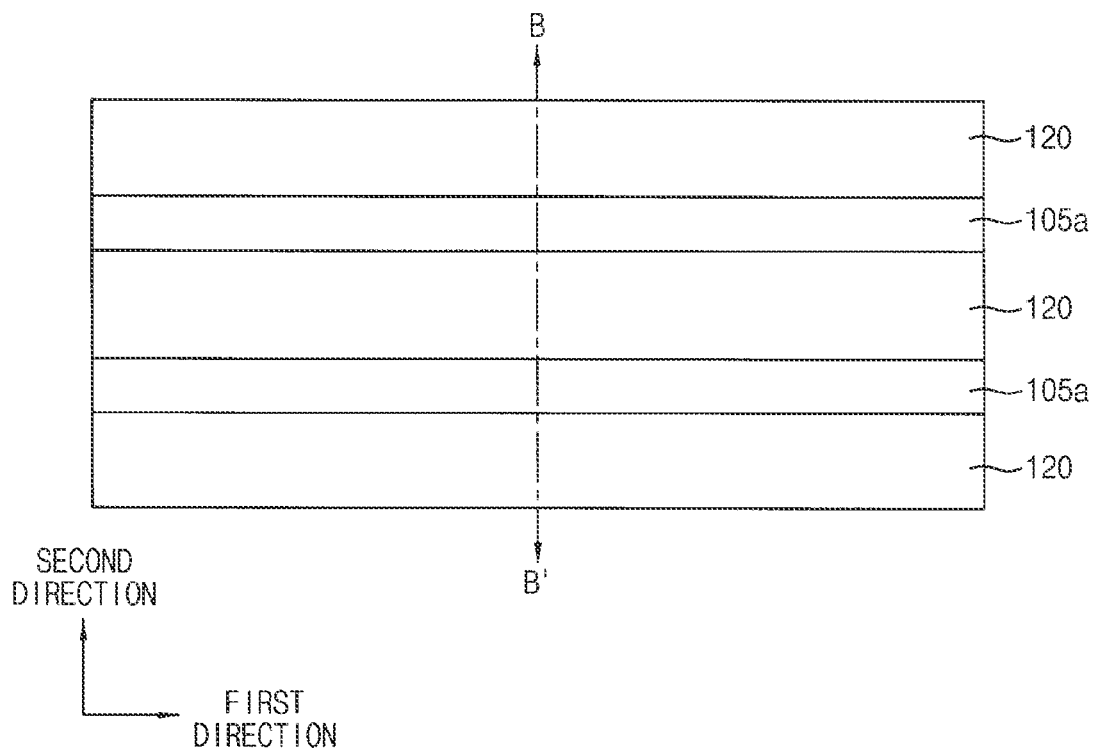
FIGS. 6 to 28 illustrate stages of an embodiment of a method of manufacturing an ESD protection device in accordance with the inventive concepts, with FIG. 6 being a plan view, with FIGS. 9, 12, 14, 16, 18, 21, 23 and 27 being cross-sectional views each taken along a line corresponding to line A-A' of FIG. 1, FIGS. 7, 15, 19 and 24 being cross-sectional views each taken along a line corresponding to line B-B' of FIG. 1, FIGS. 10, 25 and 28 being cross-sectional views each taken along a line corresponding to line C-C' of FIG. 1, and FIG. 20 being a cross-sectional view taken along a line corresponding to line D-D' of FIG. 1.
Figure 7:
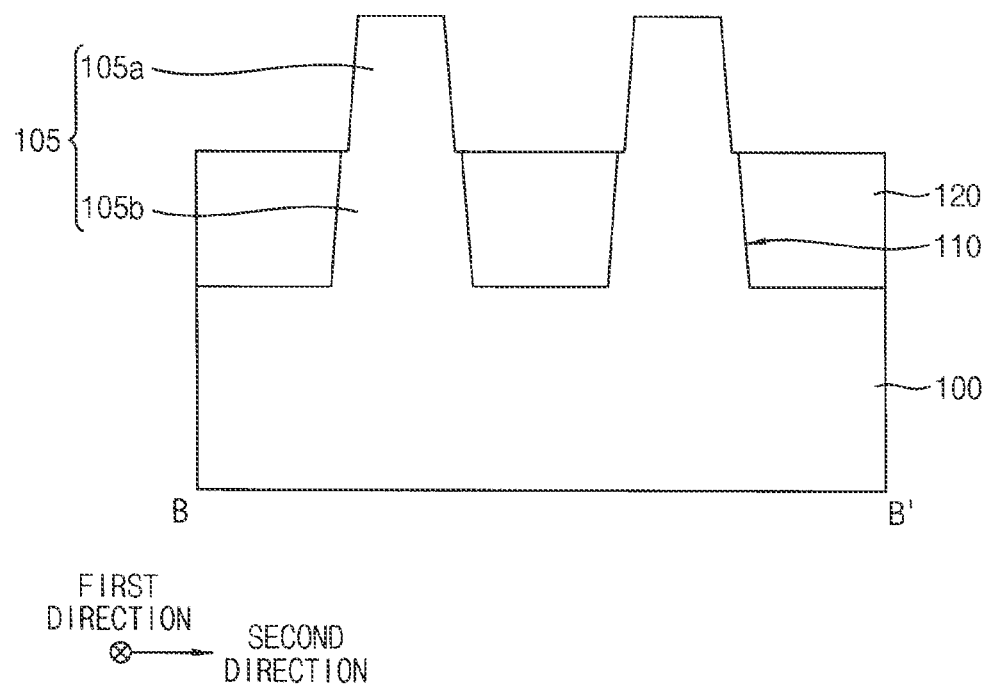

Referring to FIGS. 6 and 7, an upper portion of a substrate 100 may be partially removed to form a trench 110, and an isolation layer 120 may be formed to fill a lower portion of the trench 110.

Before forming the trench 110, impurities may be implanted into the substrate 100 to form a well region (not shown). In an embodiment according to the inventive concepts, the well region may be formed by implanting p-type impurities, e.g., boron or aluminum.

In an embodiment according to the inventive concepts, the isolation layer 120 may be formed by forming an insulation layer on the substrate 100 to sufficiently fill the trench 110, planarizing the insulation layer until a top surface of the substrate 100 may be exposed, and removing an upper portion of the insulation layer to expose an upper portion of the trench 110. When the upper portion of the planarized insulation layer is removed, an upper portion of the substrate 100 may be partially removed also. The insulation layer may be formed of an oxide, for example, silicon oxide.

As the isolation layer 120 is formed, a field region whose top surface is covered by the isolation layer 120 and an active region whose top surface is not be covered by the isolation layer 120 may be defined in the substrate 100. The active region may protrude from the isolation layer 120 and have a fin shape so as to constitute an active fin 105. The active fin 105 may include a lower portion 105b whose sides are covered by the isolation layer 120, and an upper portion 105a whose sides are not be covered by the isolation layer 120 but protrude upwardly from the isolation layer 120.

In an embodiment according to the inventive concepts, the active fin 105 may extend in a first direction substantially parallel to the top surface of the substrate 100, and a plurality of active fins 105 may be formed as spaced from each other in a second direction substantially parallel to the top surface of the substrate 100 and at a given angle with respect to the first direction. In an example of the illustrated embodiment, the second direction may subtend an angle of about 90 degrees with the first direction, and thus the first and second directions may be substantially perpendicular to each other.

After forming the active fin 105, impurities may be implanted into the substrate 100 to form a halo region (not shown). In an embodiment according to the inventive concepts, the halo region may be formed by implanting p-type impurities, e.g., boron or aluminum.

Figure 8:
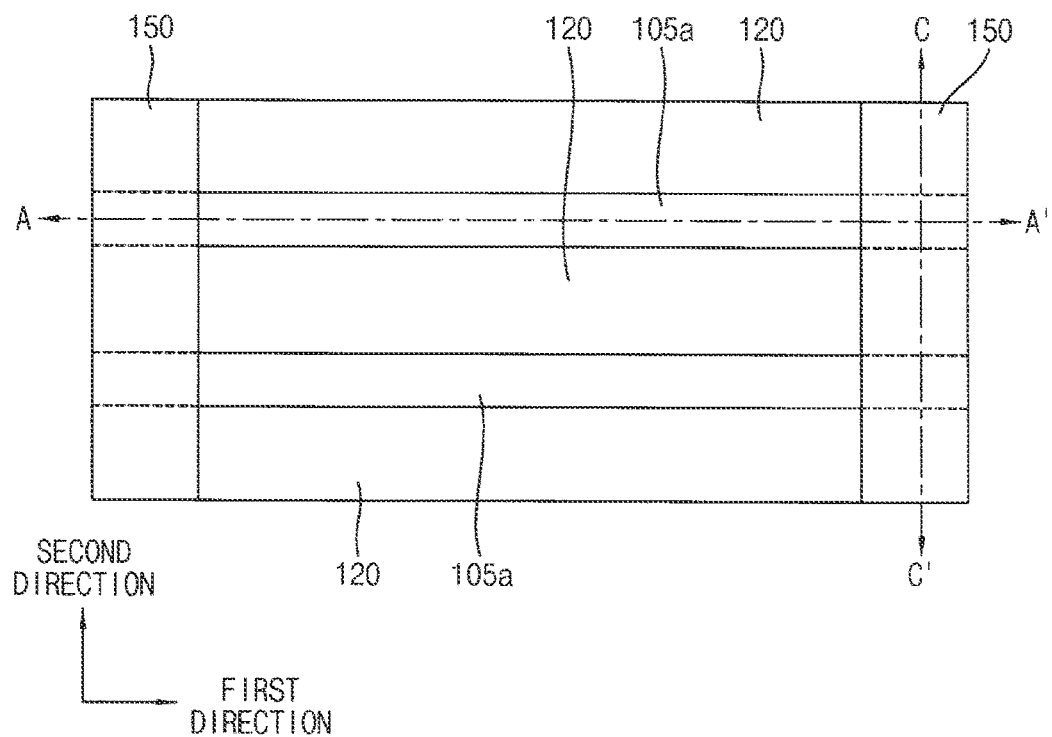
Figure 9:
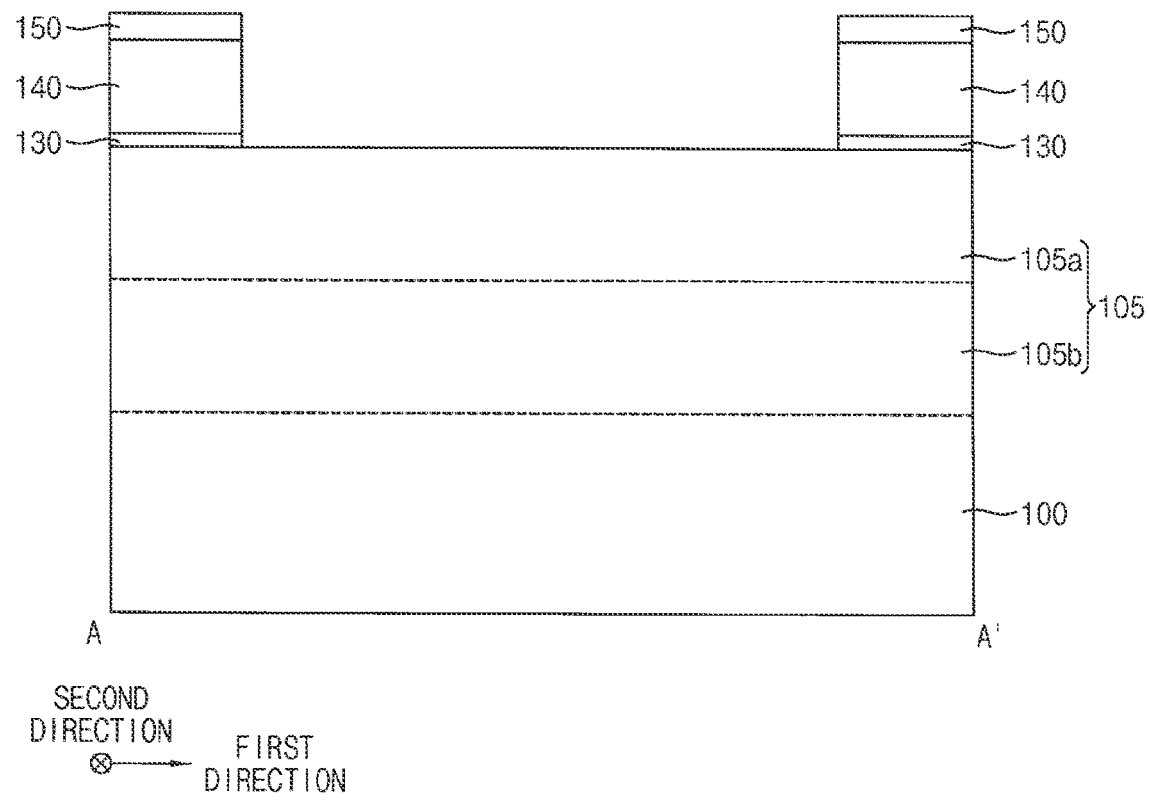
Figure 10:
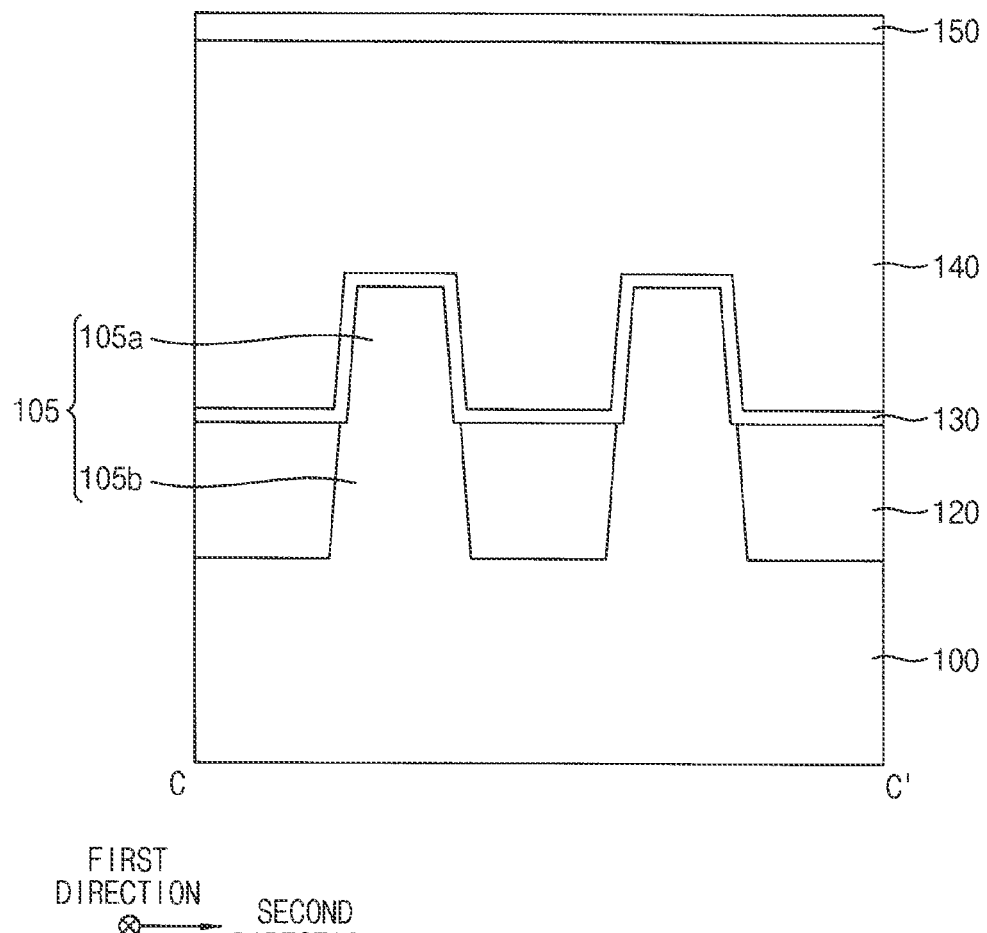

Referring to FIGS. 8 to 10, a plurality of dummy gate structures may be formed on the substrate 100.

The dummy gate structures may be formed by sequentially stacking a gate insulation layer, and a dummy gate electrode layer and a gate mask layer on the active fin 105 and the isolation layer 120, patterning the gate mask layer by a photolithography process using a photoresist pattern (not shown) to form a gate mask 150, and sequentially etching the dummy gate electrode layer and the gate insulation layer using the gate mask 150 as an etch mask. Thus, the dummy gate structure may be formed to include a gate insulation layer pattern 130, a dummy gate electrode 140 and the gate mask 150 sequentially stacked on the active fin 105 and a portion of the isolation layer 120 adjacent to the active fin 105 in the second direction. The gate insulation layer may be formed of an oxide, e.g., silicon oxide; the dummy gate electrode layer may be formed of, for example, polysilicon, and the gate mask layer may be formed of a nitride, e.g., silicon nitride. The gate insulation layer may be formed by a chemical vapor deposition (CVD) process, an atomic layer deposition (ALD) process, or the like. Alternatively, the gate insulation layer may be formed by a thermal oxidation process carried out on an upper portion of the substrate 100. The dummy gate electrode layer and the gate mask layer may be also formed by a CVD process, an ALD process, or the like.

In an embodiment according to the inventive concepts, each of the dummy gate structures may be formed to extend in the second direction on the active fins 105 of the substrate 100 and the isolation layer 120, and the dummy gate structures may be formed at uniform intervals from each other in the first direction.

Figure 11:
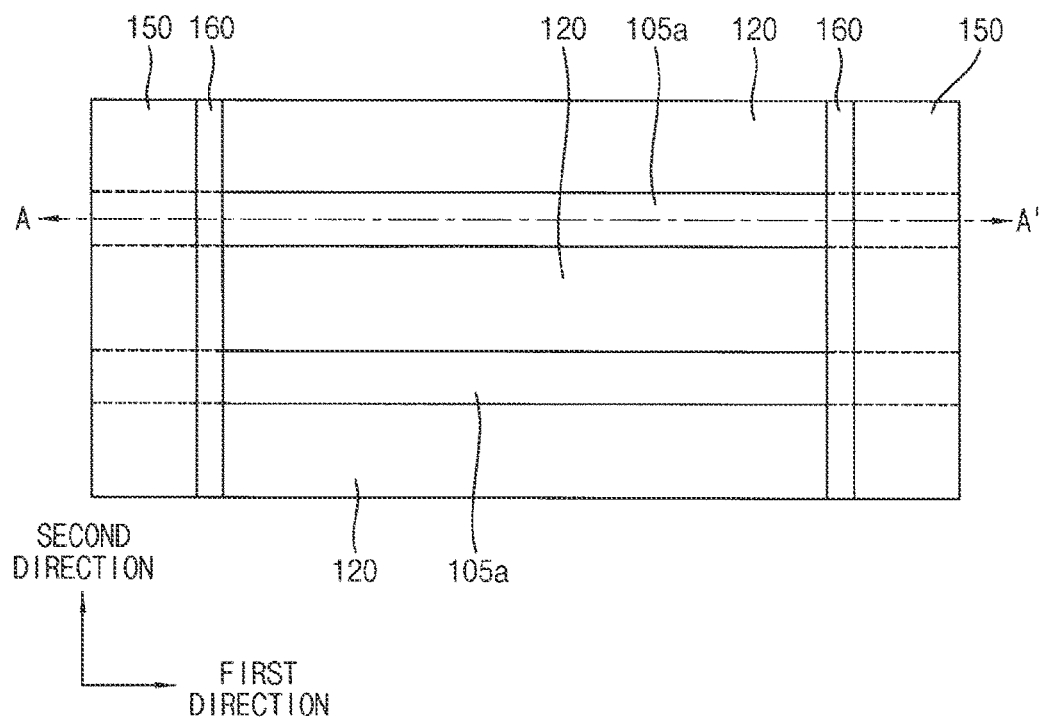
Figure 12:
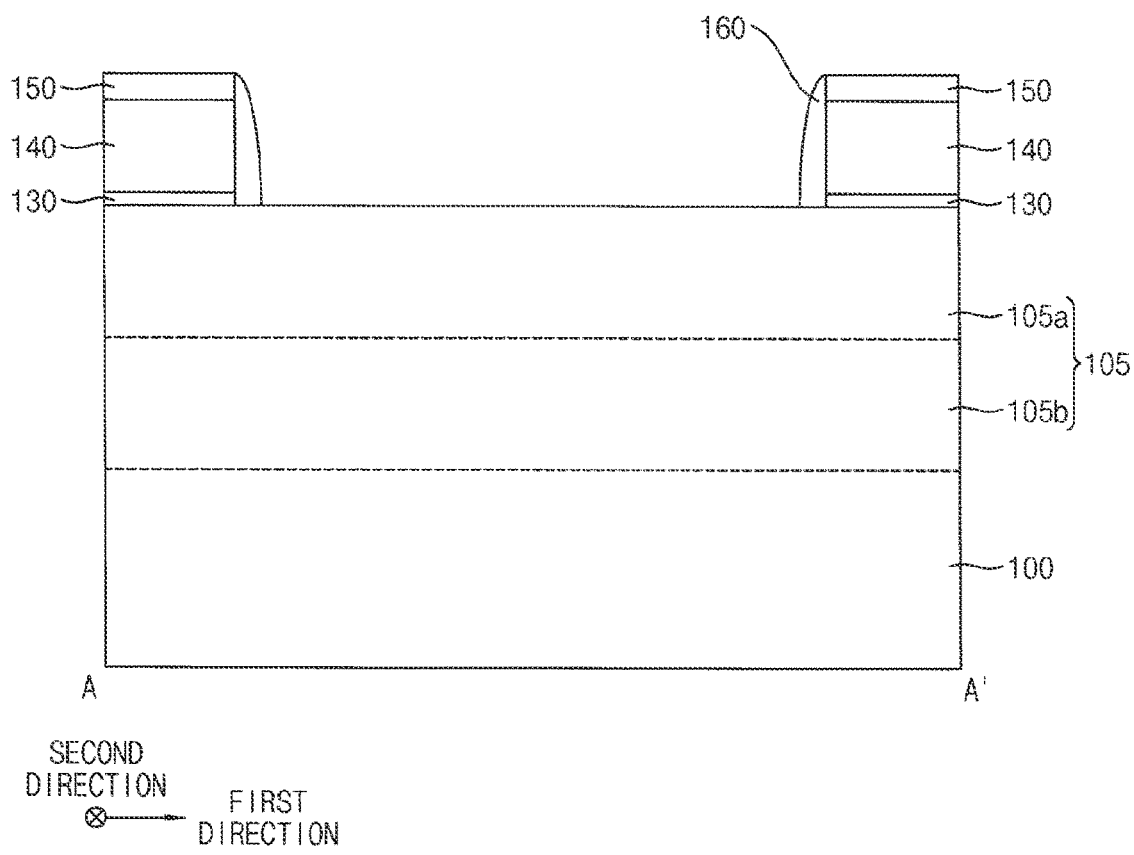

Referring to FIGS. 11 and 12, a gate spacer 160 may be formed on the sides of each of the dummy gate structures, and another spacer (not shown) may be also formed on the sides of each active fin 105.

In an embodiment according to the inventive concepts, the gate spacer 160 may be formed by forming a spacer layer on the dummy gate structures, the active fin 105 and the isolation layer 120, and anisotropically etching the spacer layer. The spacer layer may be formed of a nitride, e.g., silicon nitride or silicon oxycarbonitride.

In an embodiment according to the inventive concepts, the gate spacer 160 may be formed on both sides of each of the dummy gate structures in the first direction.

Figure 13:
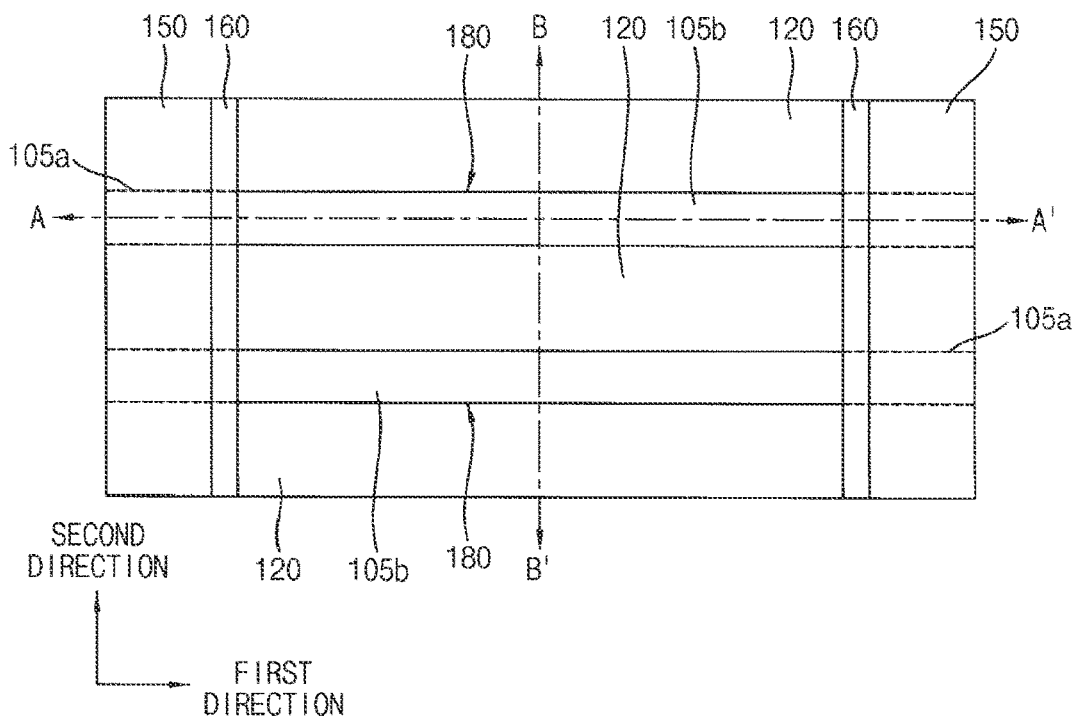
Figure 14:
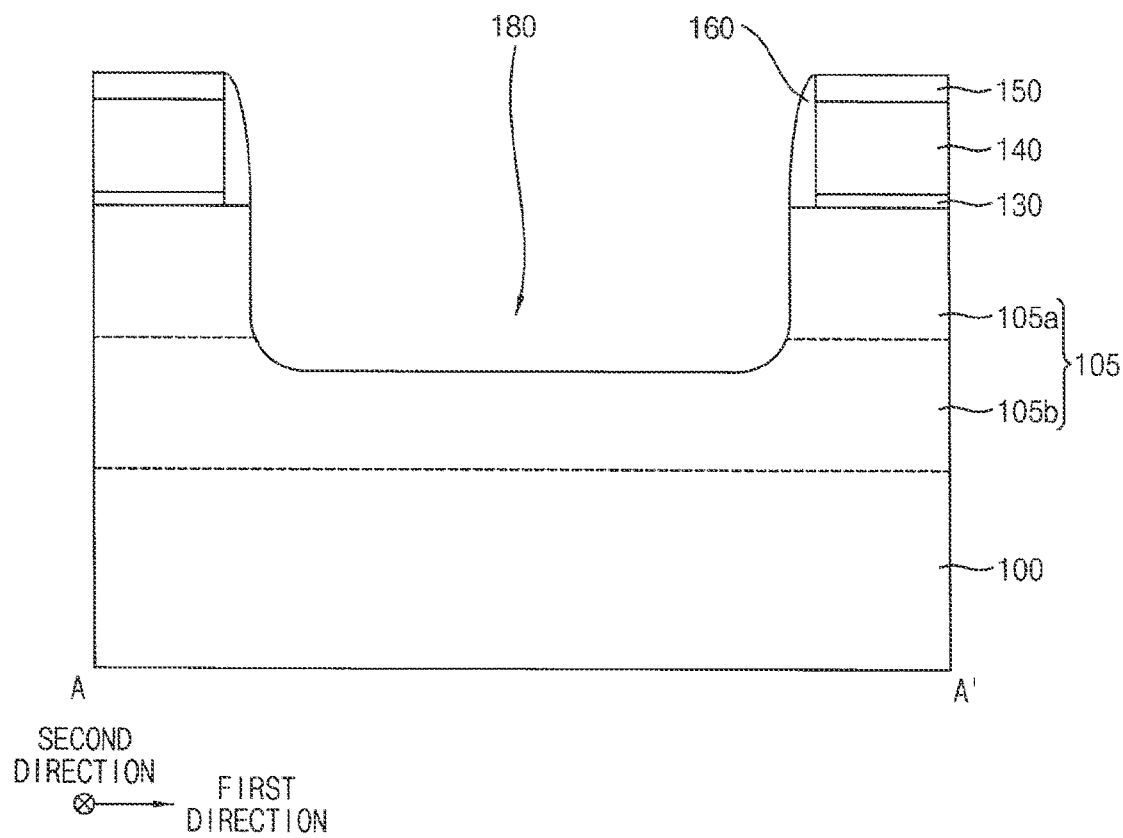
Figure 15:
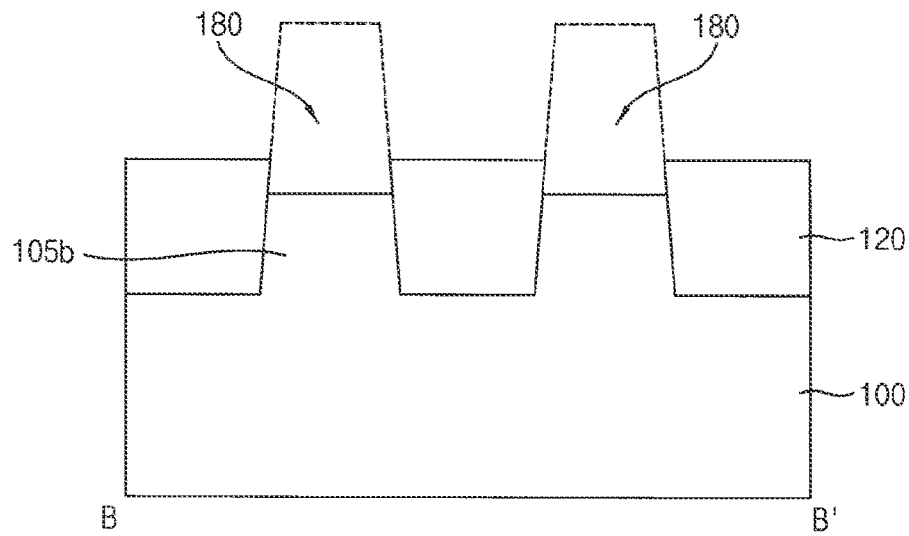

Referring to FIGS. 13 to 15, the active fin 105 may be partially removed using the dummy gate structures and the gate spacers 160 as an etch mask to form a recess 180.

In an embodiment according to the inventive concepts, the recess 180 may be formed by removing parts of both the upper portion 105a and the lower portion 105b of the active fin 105, and thus a bottom of the recess 180 may be disposed at a level beneath that of the top surface of the lower portion 105b of the active fin 105.

Figure 16:
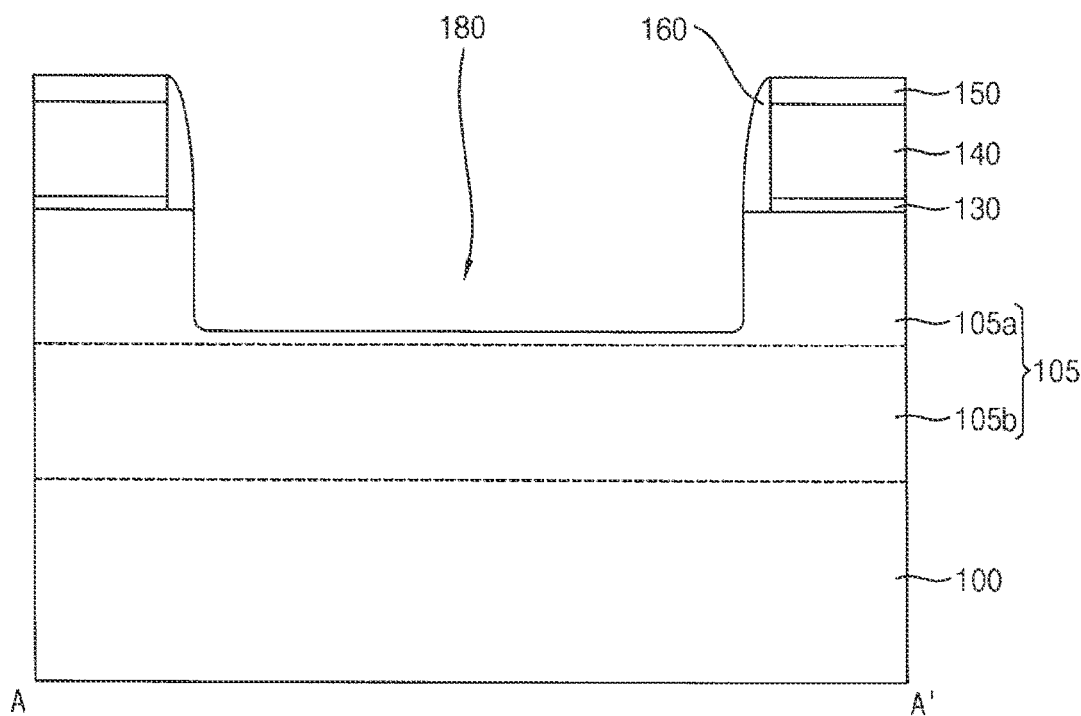
Figure 17:
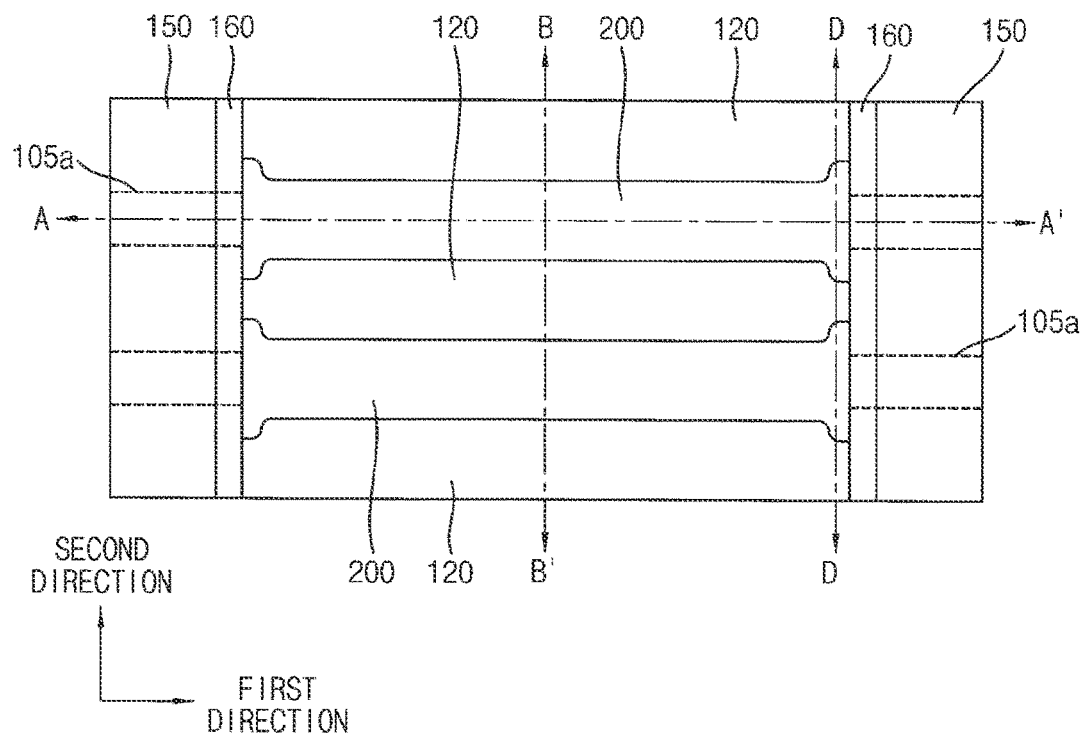
Figure 18:
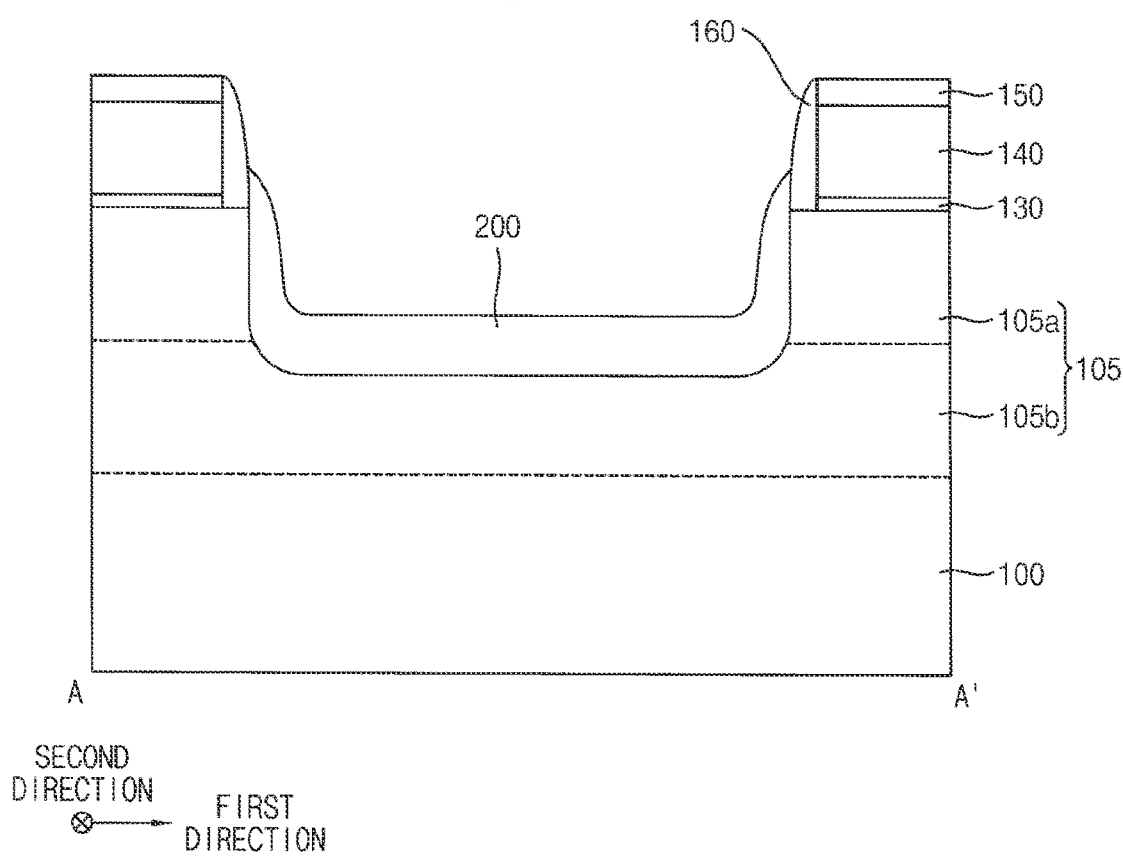
Figure 19:
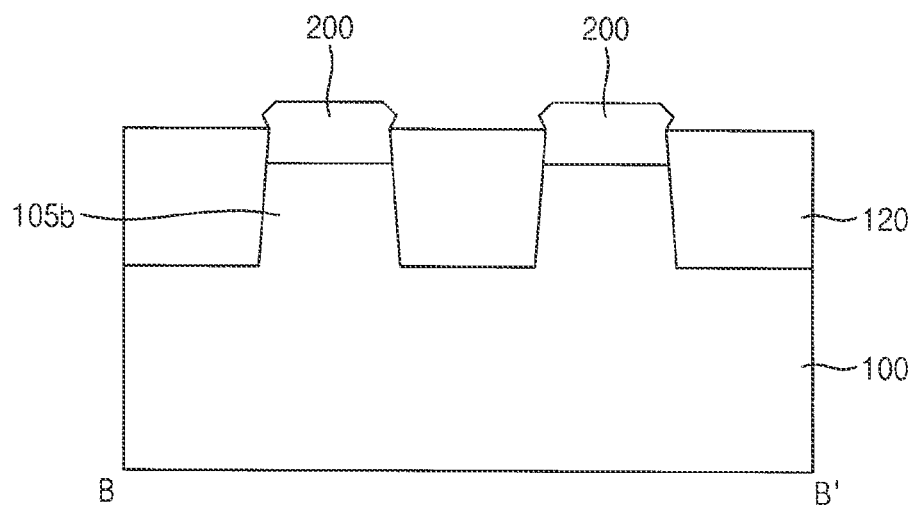
Figure 20:
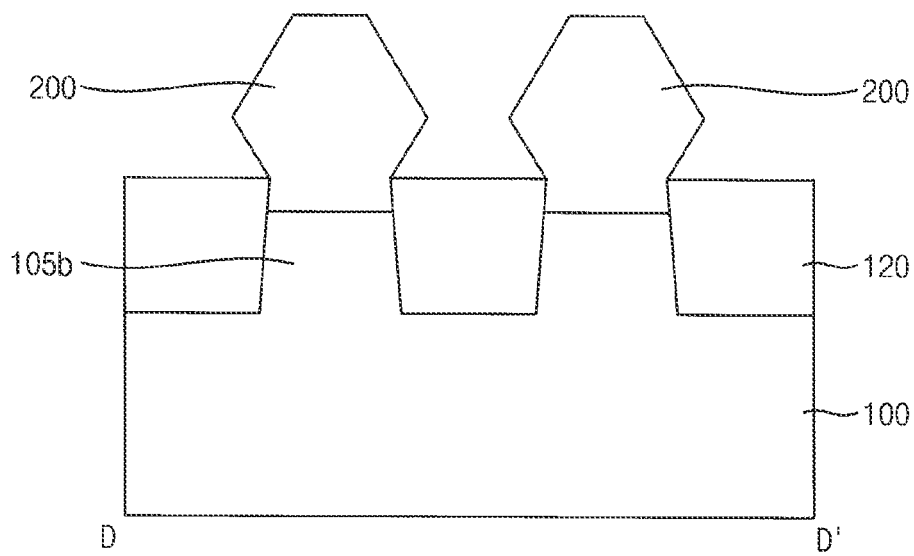

Alternatively, referring to FIG. 16, the recess 180 may be formed by removing only part of the upper portion 105a of the active fin 105, and thus the bottom of the recess 180 may be disposed at a level above that of the bottom of the upper portion 105a of the active fin 105.

Hereinafter, only the case in which the bottom of the recess 180 is disposed at a level beneath that of the top surface of the lower portion 105b of the active fin 105 will be described.

In an embodiment according to the inventive concepts, the anisotropic etching process for forming the gate spacer 160 as illustrated in FIGS. 11 and 12 and the etching process for forming the recess 180 may be performed in-situ.

Referring to FIGS. 17 to 20, an epitaxial layer 200 may be formed on the top surface of the active fin 105 to partially fill the recess 180.

In an embodiment according to the inventive concepts, a first selective epitaxial growth (SEG) process may be performed using a portion of the active fin 105 exposed by the recess 180, i.e., a top surface of the lower portion 105b of the active fin 105 and side surfaces of the upper portion 105a of the active fin 105 as a seed to form the epitaxial layer 200.

The SEG process may be performed using a silicon source gas, e.g., disilane ($Si_2H_6$), so that a single crystalline silicon layer may be formed. In an embodiment according to the inventive concepts, an n-type impurity source gas, e.g., phosphine ($PH_3$), may be also used to form a single crystalline silicon layer doped with n-type impurities. Alternatively, the SEG process may be performed using not only a silicon source gas such as disilane ($Si_2H_6$) but also a carbon source gas, e.g., methylsilane ($SiH_3CH_3$), to form a single crystalline silicon carbide layer. In an embodiment according to the inventive concepts, an n-type impurity source gas, e.g., phosphine ($PH_3$), may be also used to form a single crystalline silicon carbide layer doped with n-type impurities.

The epitaxial layer 200 including the single crystalline silicon layer doped with n-type impurities or the single crystalline silicon carbide layer doped with n-type impurities may be grown not only in a vertical direction but also in a horizontal direction, and thus an upper portion of the epitaxial layer 200 may be formed to have a cross section, in the second direction, in the shape of a pentagon or hexagon. The epitaxial layer 200 may be grown using not only the top surface of the lower portion 105b of the active fin 105 exposed by the recess 180 but also the side surfaces of the upper portion 105a exposed by the recess 180 as a seed, and thus a portion of the epitaxial layer 200 adjacent to each of the dummy gate structures may be formed to have a top surface disposed at a level above those of other portions of the layer 200. That is, along the first direction, a central portion of the epitaxial layer 200 may have a top surface disposed at a level beneath that of edge portions of the layer 200. The epitaxial layer 200 may be formed to extend in the first direction as viewed in plan, and may be relatively wide at the portion thereof adjacent to each of the dummy gate structures.

In the ESD protection device, the dummy gate structures may be spaced apart from each other in the first direction, and thus the epitaxial layer 200, which may be formed by an SEG process, does not completely fill the recess 180. Thus, in an embodiment according to the inventive concepts, a top surface of the central portion of the epitaxial layer 200 may be formed to be disposed at a level beneath that of the top surface of the active fin 105, while top surfaces of the edge portions of the epitaxial layer 200 may be formed to be disposed at a level above that of the top surface of the active fin 105.

Figure 21:
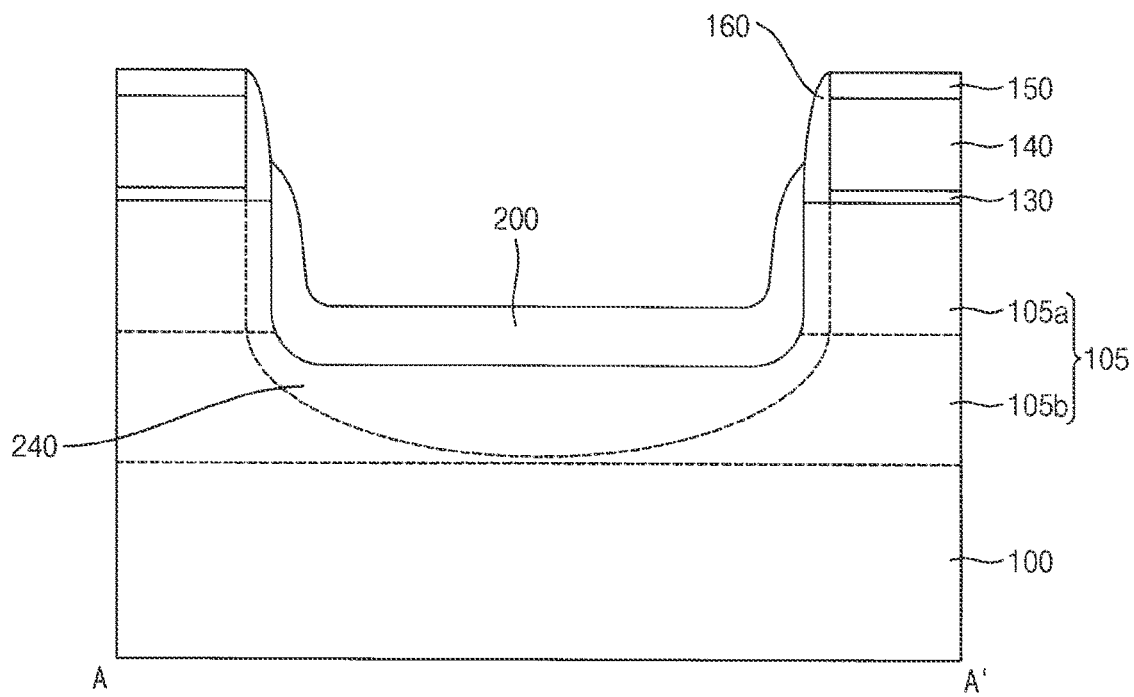
Figure 22:
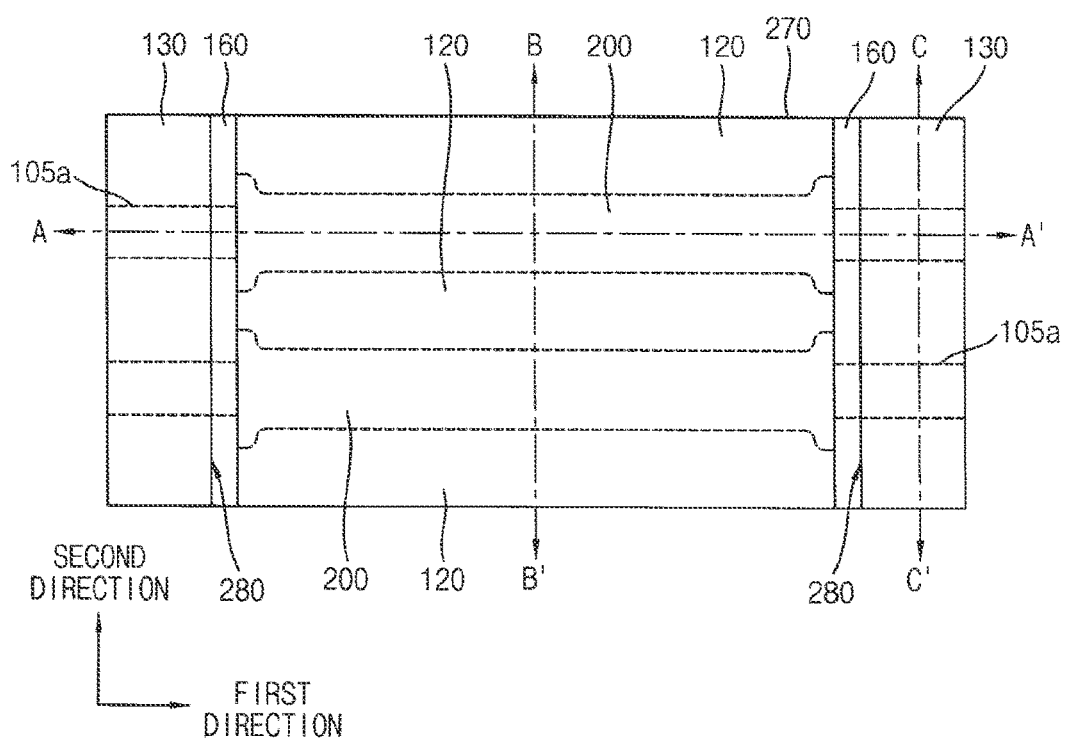
Figure 23:
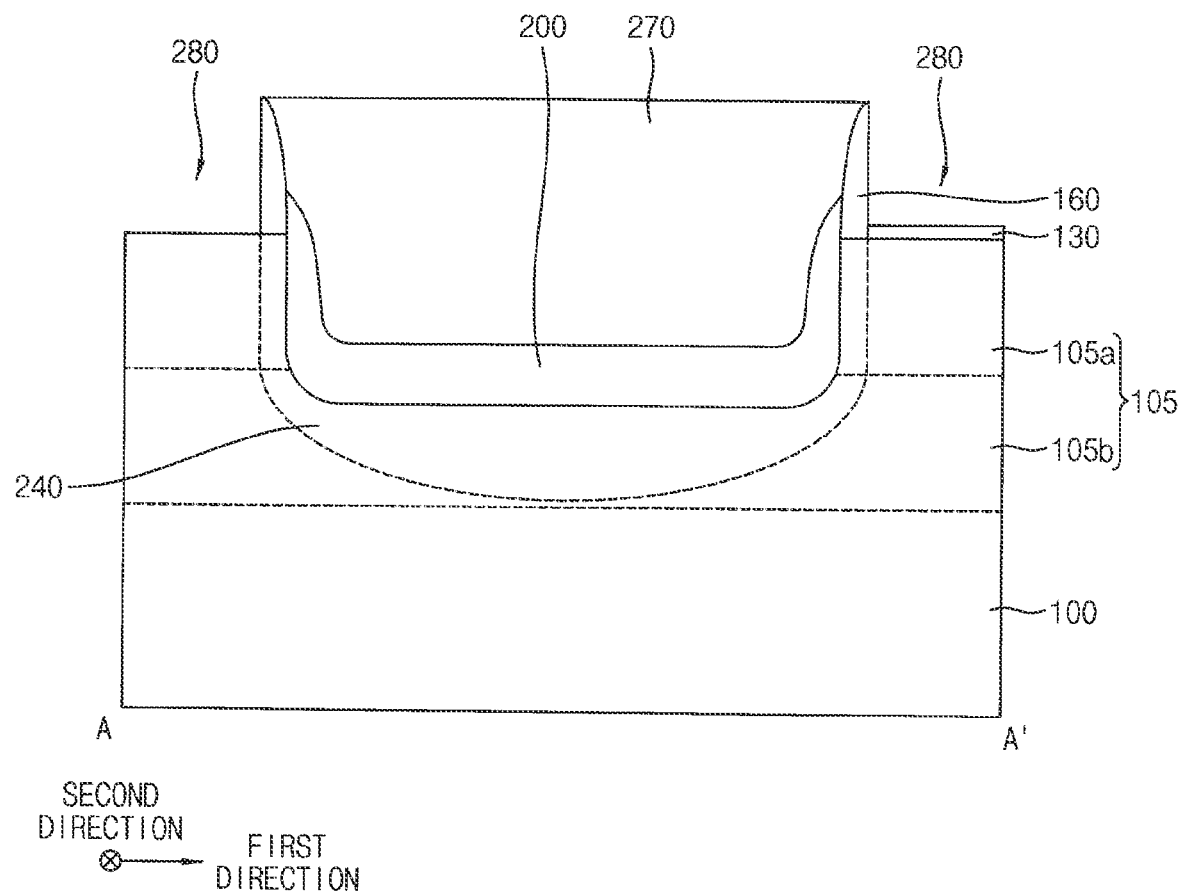
Figure 24:
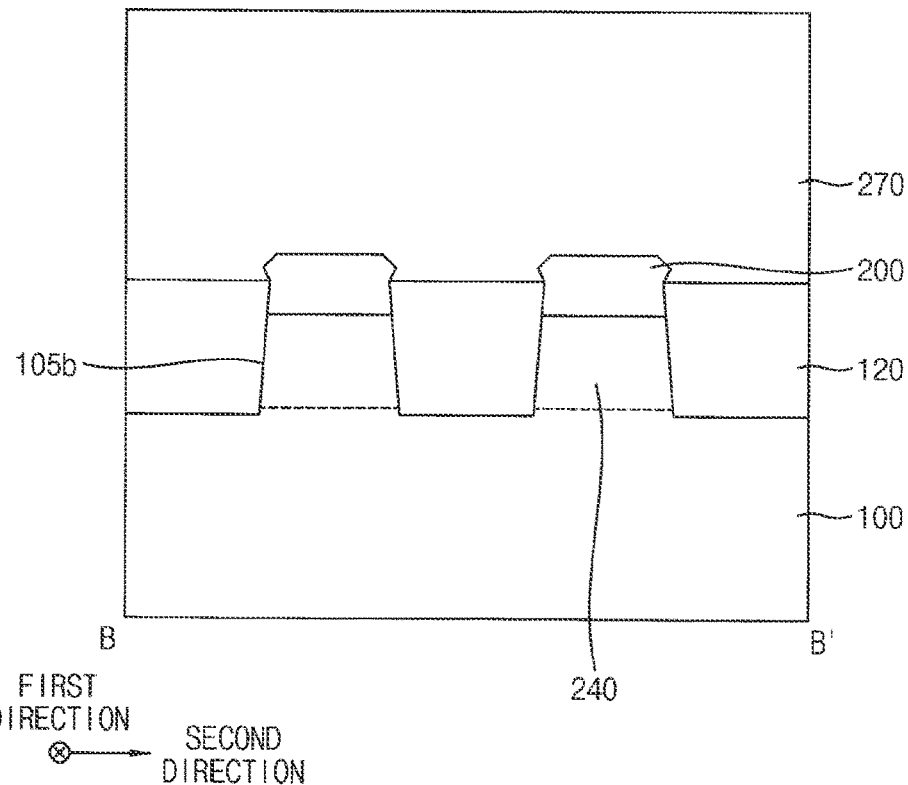
Figure 25:
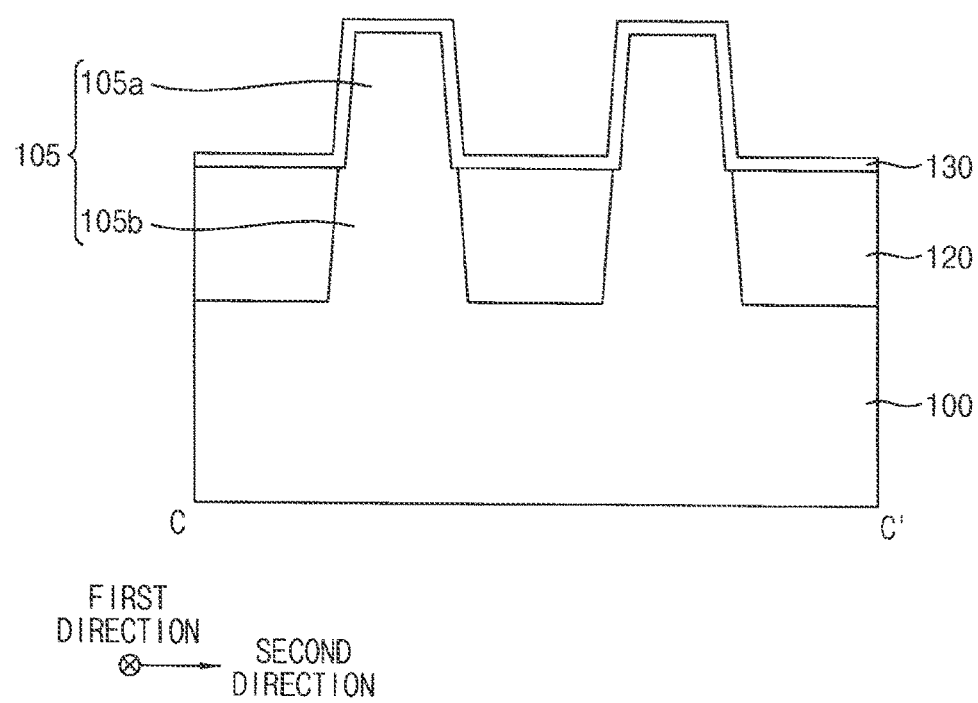

Referring to FIG. 21, impurities may be implanted into the active fin 105 to form an impurity region 240.

In an embodiment according to the inventive concepts, the impurity region 240 may be formed by implanting n-type impurities, e.g., phosphorus or arsenic, into the active fin 105. The ion implantation process may be performed using the dummy gate structures and the gate spacer 160 as an ion implantation mask, and an annealing process may be further performed so that the impurities may diffuse into neighboring portions of the active fin 105.

Thus, the impurities may be implanted into the epitaxial layer 200 and a portion of the active fin 105 under the epitaxial layer 200, and hereinafter, the portion of the active fin 105 into which the impurities will be referred to as an impurity region 240. In an embodiment according to the inventive concepts, the impurity region 240 may be formed to have a central portion thicker than that of edge portions thereof. As shown in FIG. 21, the bottom of the central portion of the impurity region 240 may be formed to be disposed at a level beneath that of the edge portions of the region 240. The slope of the bottom of the impurity region 240 may be flat or gentle in the first direction, which may prevent or reduce a junction leakage.

The epitaxial layer 200 and the impurity region 240 may serve as a source/drain region of the ESD protection device.

Referring to FIGS. 22 to 25, a first insulating interlayer 270 covering the dummy gate structures, the gate spacers 160, the epitaxial layer 200 and the isolation layer 120 may be formed, and an upper portion of the first insulating interlayer 270 may be planarized until a top surface of the gate masks 150 of the dummy gate structures may be exposed. In an embodiment according to the inventive concepts, the planarization process may be performed by a chemical mechanical polishing (CMP) process and/or an etch back process.

The exposed gate masks 150 and the dummy gate electrodes 140 thereunder may be removed to form openings 280 exposing top surfaces of the gate insulation layer patterns 130, respectively.

In an embodiment according to the inventive concepts, the gate masks 150 may be removed by a dry etch process, and the dummy gate electrodes 140 may be removed by performing a dry etch process first, and performing a wet etch process later.

Alternatively, after removing the gate masks 150 and the dummy gate electrodes 140, the gate insulation layer patterns 130 may be also removed to expose top surfaces of the upper portion 105a of the active fin 105 and the isolation layer 120. The exposed top surface of the upper portion 105a of the active fin 105 may be thermally oxidized, for example, to form a gate insulation layer pattern again. In this case, even though the original gate insulation layer pattern 130 may be damaged when removing the dummy gate electrodes 140, a new gate insulation layer pattern having good electrical characteristics may be formed. The gate insulation layer pattern 130 may be removed by a wet etch process using HF solution.

Figure 26:
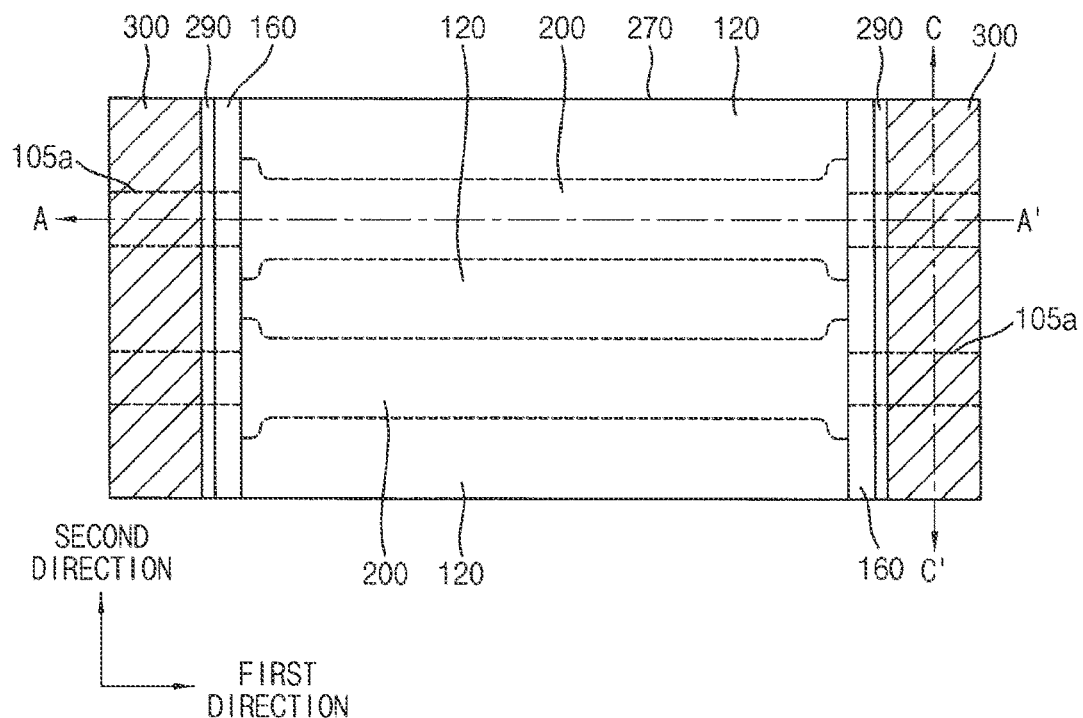
Figure 27:
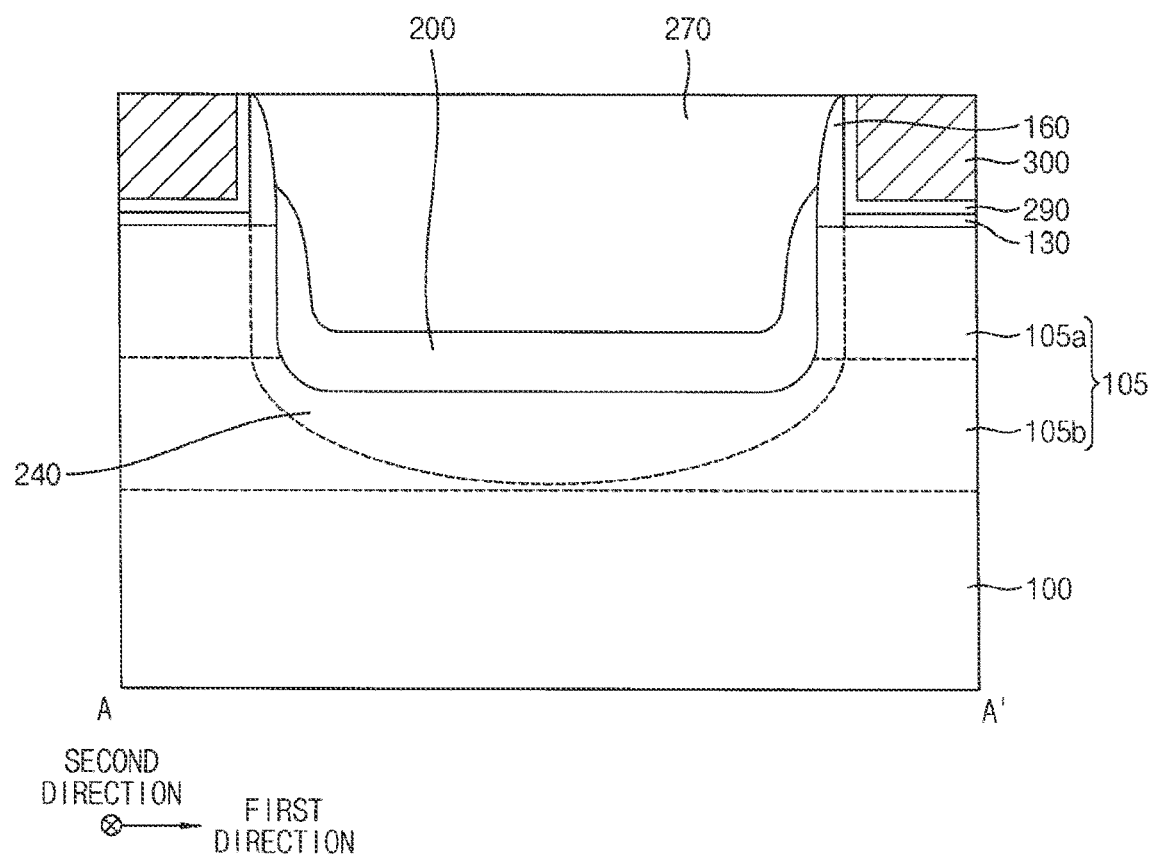
Figure 28:
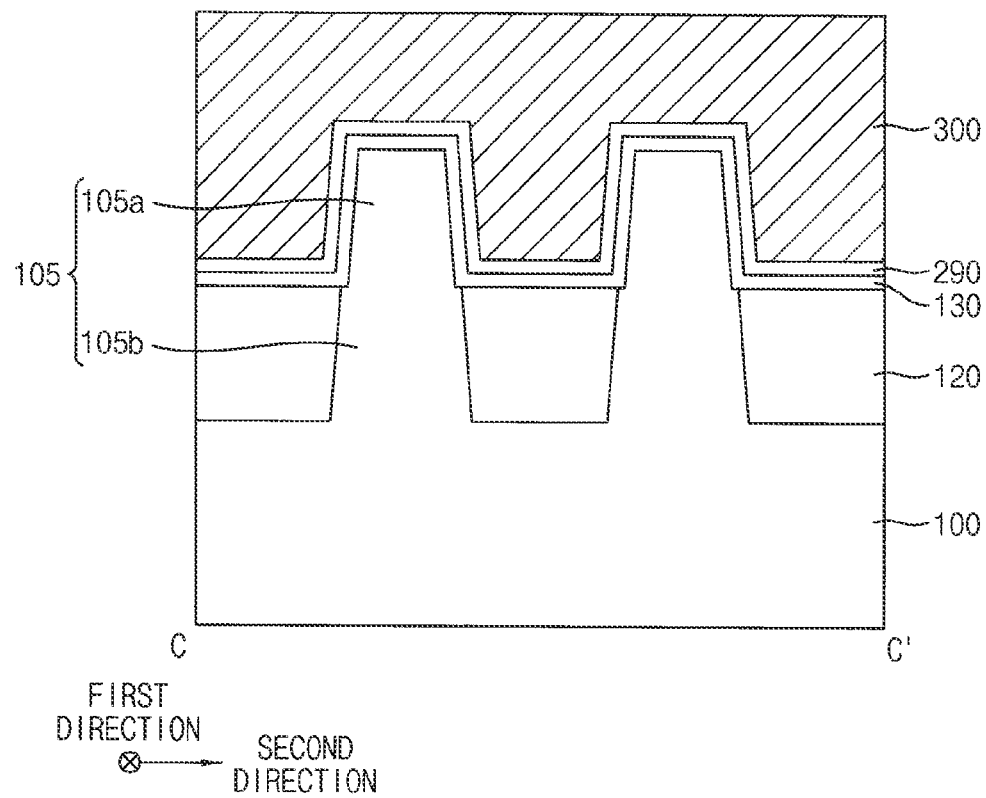
Figure 29:
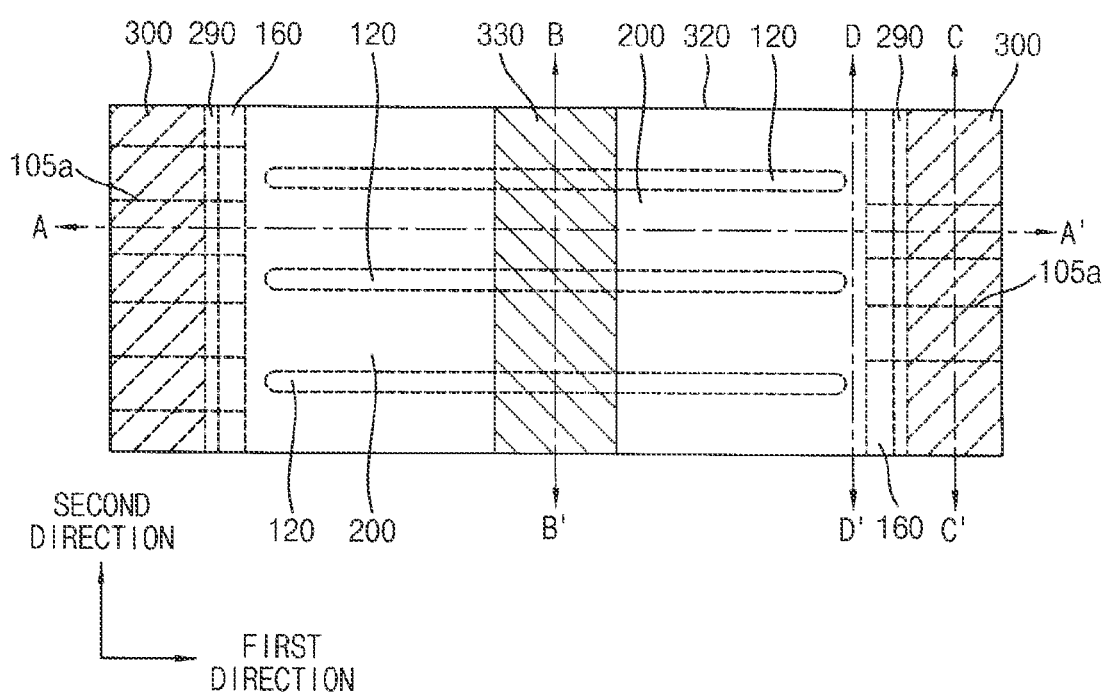
FIG. 29 is a plan view illustrating an ESD protection device in accordance with an embodiment according to the inventive concepts.
Figure 30:
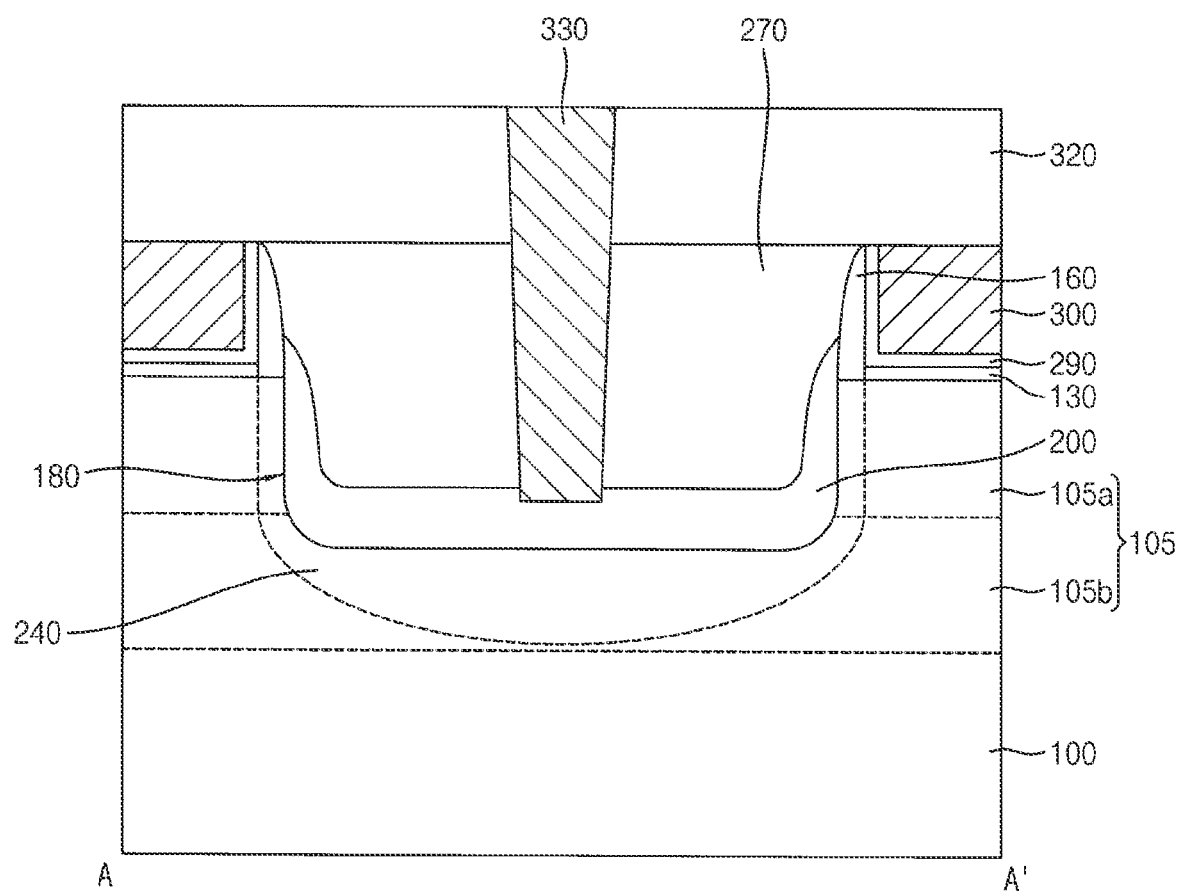
FIGS. 30 to 33 are cross-sectional views taken along lines A-A', B-B', C-C' and D-D', respectively, in FIG. 29.
Figure 31:
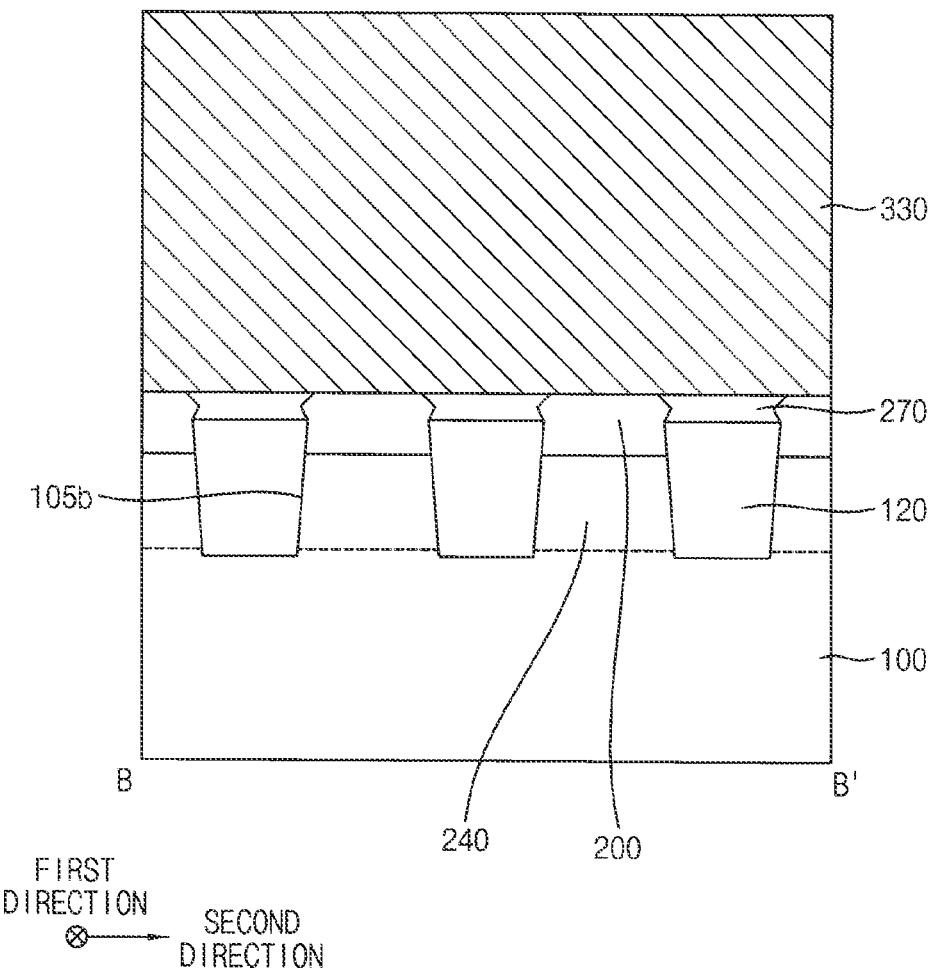
Figure 32:
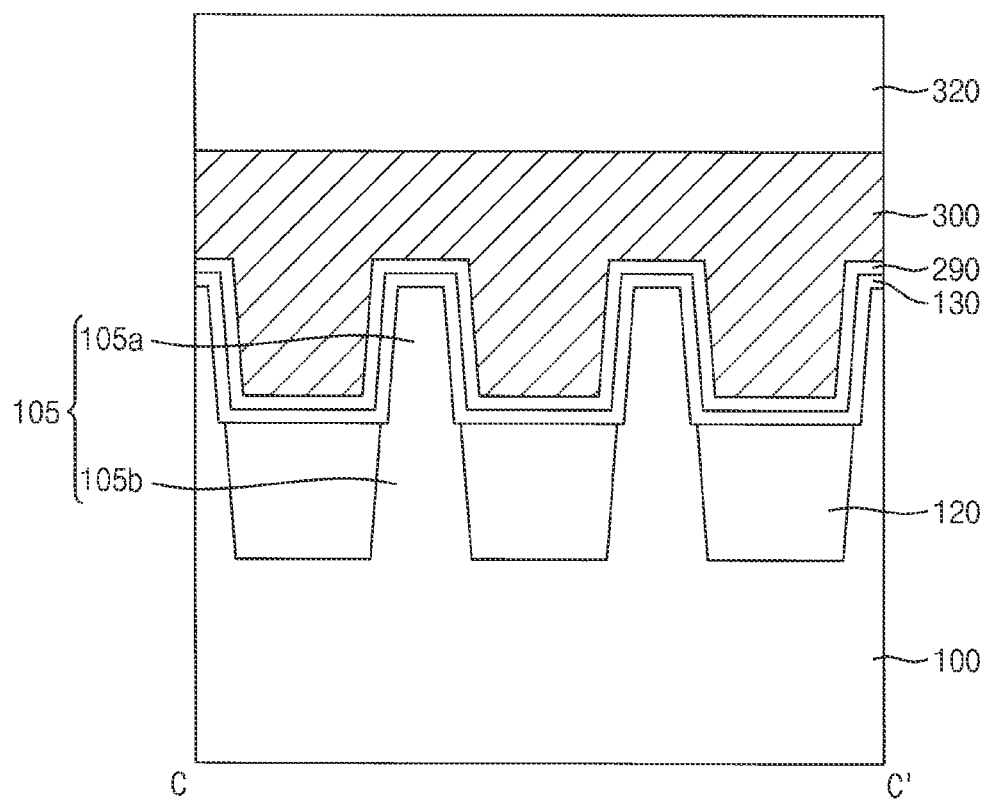
Figure 33:
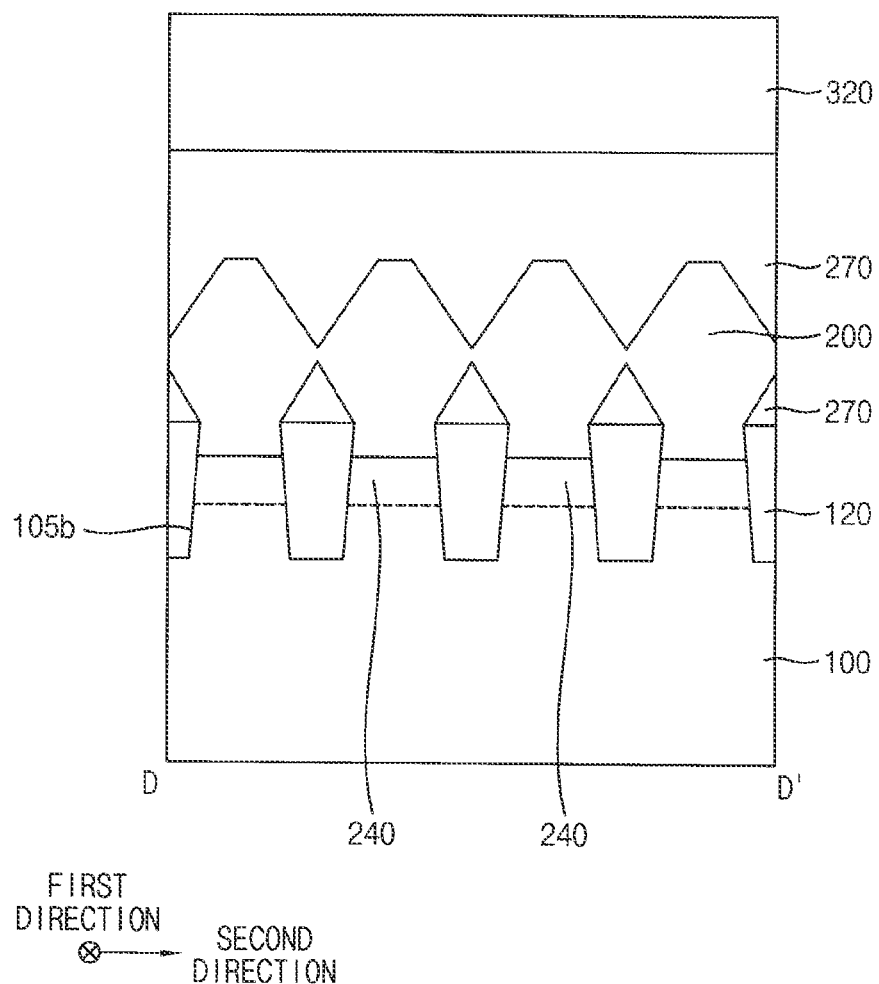
Figure 34:
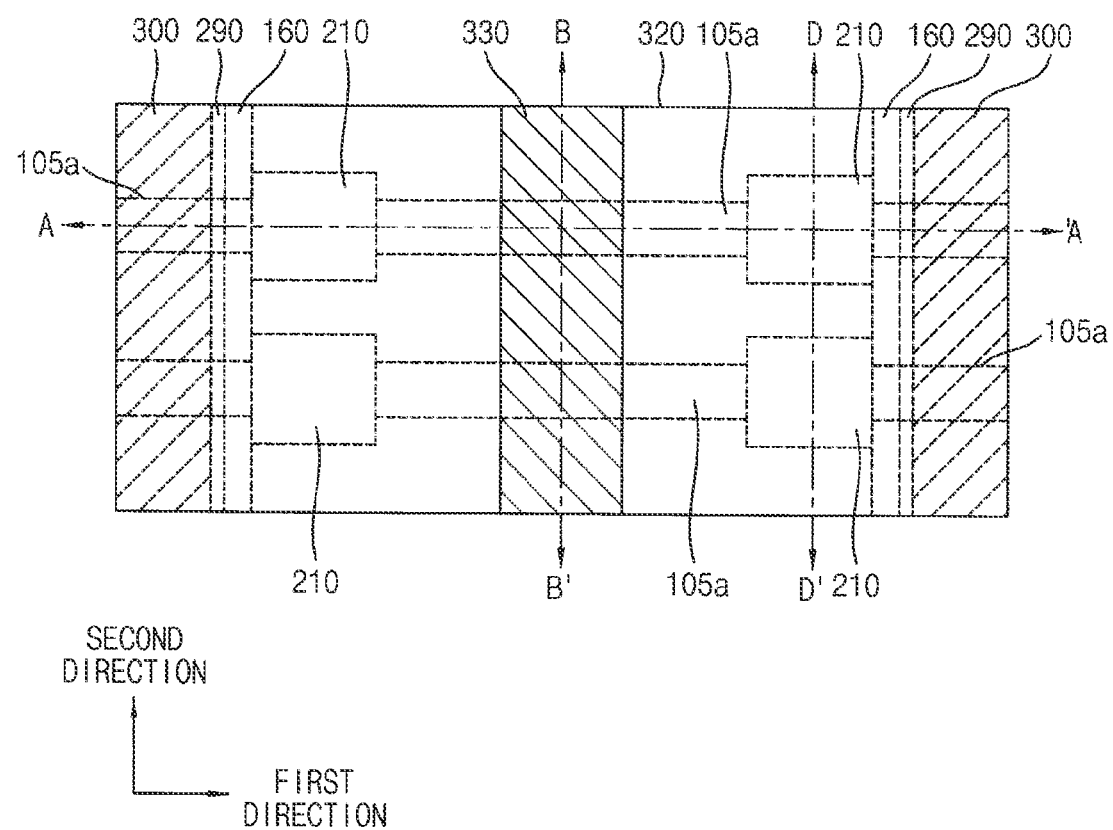
FIG. 34 is a plan view illustrating another embodiment of an ESD protection device in accordance with the inventive concepts.
Figure 35:
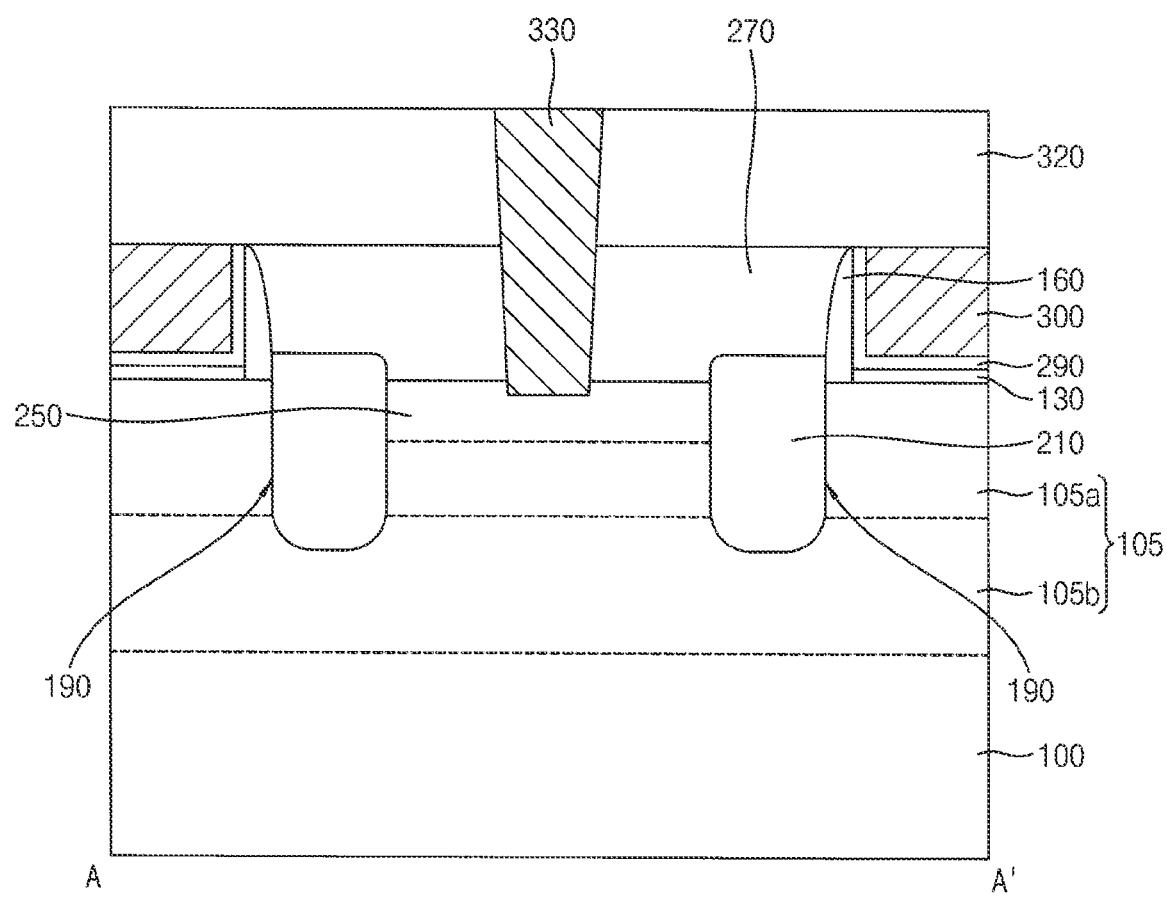
FIGS. 35 to 37 are cross-sectional views taken along lines A-A', B-B', C-C' and D-D', respectively, in FIG. 34.
Figure 36:
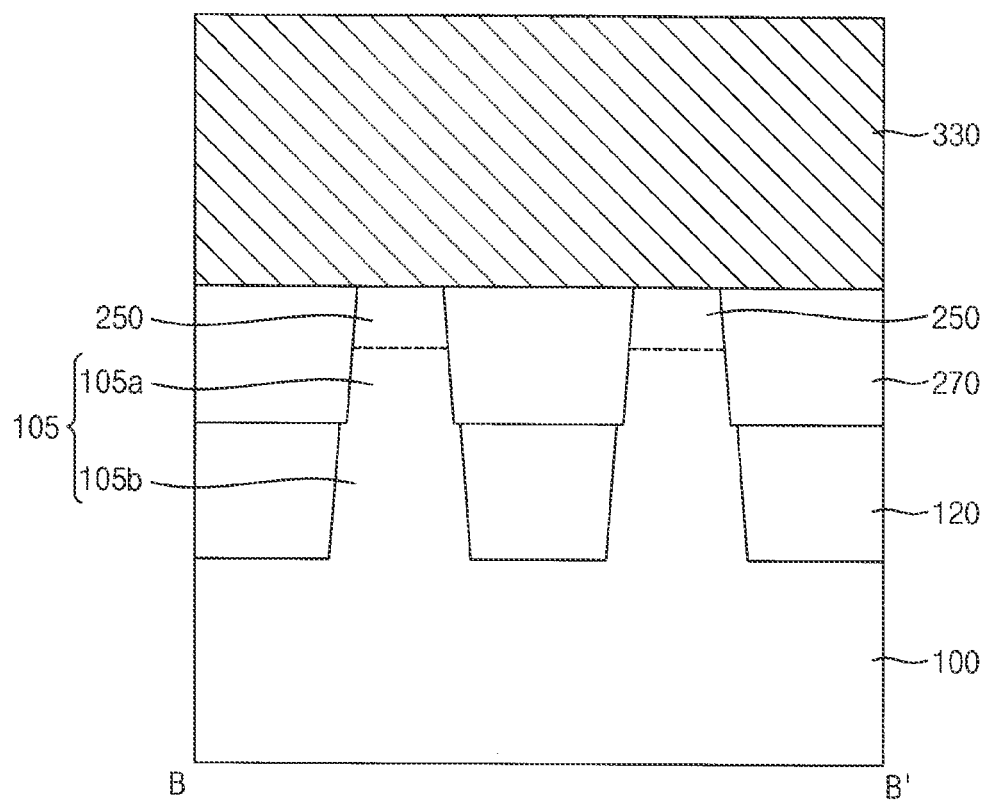
Figure 37:
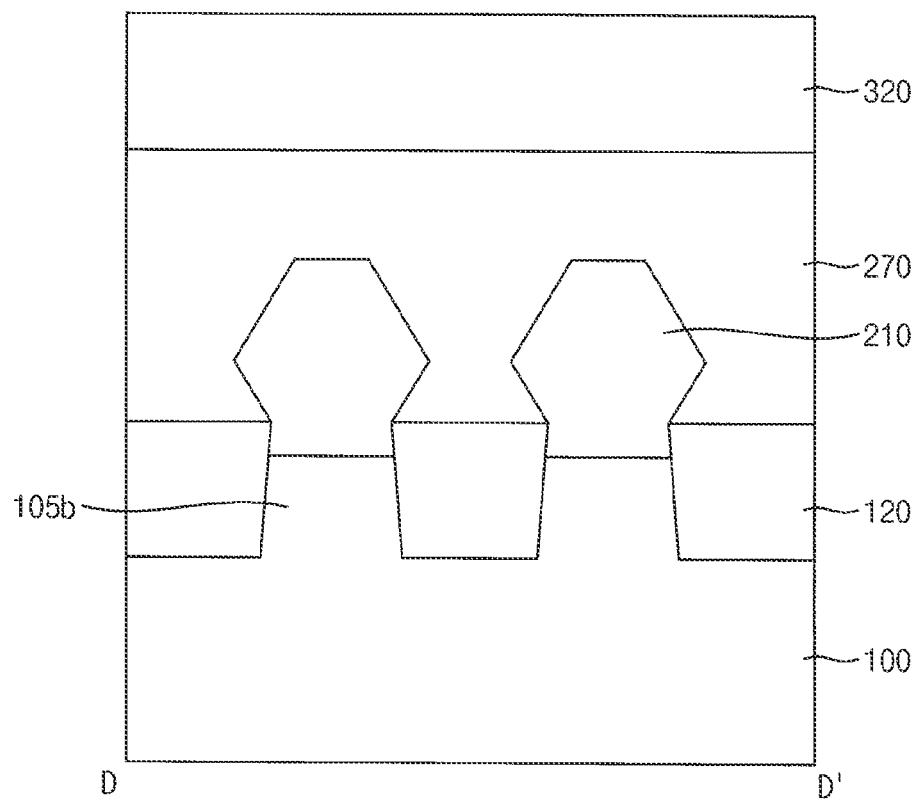

Referring to FIGS. 26 to 28, a high-k dielectric layer pattern 290 and a gate electrode 300 may be formed to fill each of the openings 280.

In particular, a high-k dielectric layer may be formed on the exposed top surfaces of the gate insulation layer patterns 130, along sides of the openings 280, and on a top surface of the insulating interlayer 270, and a gate electrode layer may be formed on the high-k dielectric layer to sufficiently fill remaining portions of the openings 280.

The high-k dielectric layer may be formed of a metal oxide having a high dielectric constant, e.g., hafnium oxide, tantalum oxide, or zirconium oxide. The gate electrode layer may be formed of a material having a low resistance, for example, a metal such as aluminum, copper, or tantalum, or a metal nitride thereof, by an ALD process, a physical vapor deposition (PVD) process, or the like. In an example of the illustrated embodiment, a heat treatment process, for example, a rapid thermal annealing (RTA) process, a spike rapid thermal annealing (spike RTA) process, a flash rapid thermal annealing (flash RTA) process or a laser annealing process may be further performed. Alternatively, the gate electrode layer may be formed of doped polysilicon.

The gate electrode layer and the high-k dielectric layer may be planarized until the top surface of the insulating interlayer 270 may be exposed to form the high-k dielectric layer pattern 290 on a top surface of each of the gate insulation layer pattern 130 and along sides of each of the openings 280, and the gate electrode 300 filling a remaining portion of each of the openings 280 on the high-k dielectric layer pattern 290. In an embodiment according to the inventive concepts, the planarization process may be performed by a CMP process and/or an etch back process.

The gate insulation layer pattern 130, the high-k dielectric layer pattern 290 and the gate electrode 300 sequentially stacked may form a gate structure, and the gate structure and the source/drain layer region adjacent thereto may form an NMOS transistor.

Referring to FIGS. 1 to 5 again, a second insulating interlayer 320 may be formed on the first insulating interlayer 270 to cover the NMOS transistor, and a contact plug 330 may be formed on the epitaxial layer 200 through the first and second insulating interlayers 270 and 320.

In an embodiment according to the inventive concepts, the contact plug 330 may be formed through an upper portion of the epitaxial layer 200 to sufficiently contact the epitaxial layer 200. In an embodiment according to the inventive concepts, the contact plug 330 may be formed on the epitaxial layer 200 to overlap the relatively thick central portion of the impurity region 240. Thus, even though a high voltage may be applied to the impurity region 240 via the contact plug 330, the junction leakage may be prevented or reduced.

By the above-described processes, an ESD protection device having a reduced junction leakage may be manufactured.

Another embodiment of an ESD protection device in accordance with the inventive concepts will be described with reference to FIGS. 29 to 33. The ESD protection device is similar to that illustrated in FIGS. 1 to 5. Thus, like reference numerals designate like elements, and detailed descriptions of similar elements and features may be omitted hereinafter.

Referring to FIGS. 29 to 33, the ESD protection device may include a substrate 100, a gate structure, a epitaxial layer 200, a impurity region 240, and a contact plug 330. The ESD protection device may further include an isolation layer 120, a gate spacer 160, and first and second insulating interlayers 270 and 320.

The epitaxial layer 200 may be formed in a recess 180 in the active fin 105 between the gate structures.

In an example of this embodiment according to the inventive concepts, the epitaxial layer 200 may extend in a first direction as viewed in plan, and a plurality of segments of an epitaxial layer 200 may be formed in a second direction substantially perpendicular to the first direction. The epitaxial layer 200 may be relatively wide at a portion thereof adjacent to the gate structure, and thus neighboring segments of the epitaxial layer 200 may be connected to each other near the gate structure.

For example, an upper portion of each of the epitaxial layer 200 that is not adjacent to the gate structure may have a cross section, taken along the second direction, in the shape of a pentagon or hexagon; however, upper portions of the epitaxial layer 200 that are adjacent to the gate structure may have a cross section, taken along the second direction, whose shape is a series of pentagons or hexagons.

The portion of the epitaxial layer 200 adjacent to the gate structure may have a top surface disposed at a level above that of other portions of layer 200. Thus, a central portion of the epitaxial layer 200, along the first direction, may have a top surface disposed at a level beneath those of edge portions of layer 200.

In an embodiment according to the inventive concepts, the ESD protection device illustrated in FIGS. 1 to 5 may be employed by a logic device, and the EDS protection device shown in FIGS. 29 to 33 may be employed by a static random access memory (SRAM) device; however, the inventive concepts are not be limited to such applications. Alternatively, both of the ESD protection device of FIGS. 1 to 5 and the ESD protection device of FIGS. 29 to 33 may be employed by either a logic device or a SRAM device. When both a logic device and a SRAM device are provided, an upper portion of the epitaxial layer 200 adjacent to the gate structure may have a discrete pentagonal or hexagonal cross section and another upper portion of the epitaxial layer may have a cross section in the form of a series of pentagons or hexagons.

Furthermore, the manufacturing of the ESD protection device of FIGS. 29 to 33 may be carried out in such a way that the segments of the epitaxial layer 200 connect to each other during the SEG process.

Another embodiment of an ESD protection device in accordance with the inventive concepts will be described in detail with reference to FIGS. 34 to 37. The ESD protection device may be similar to that illustrated in FIGS. 1 to 5, except for the epitaxial layer and the impurity region. Thus, like reference numerals designate like elements, and detailed descriptions of similar elements may be omitted hereinafter.

Referring to FIGS. 34 to 37, the ESD protection device may include a substrate 100, a gate structure, a epitaxial layer 210, a impurity region 250, and a contact plug 330. The ESD protection device may further include an isolation layer 120, a gate spacer 160, and first and second insulating interlayers 270 and 320.

The substrate 100 may include a well region (not shown) and/or a halo region (not shown) doped with n-type impurities, e.g., phosphorus or arsenic.

In an example of this embodiment, a plurality of gate structures may be formed in a first direction, and each of the gate structures may extend in a second direction substantially perpendicular to the first direction.

The epitaxial layer 210 may be formed in a recess 190 in a portion of an active fin 105 between the gate structures.

A bottom of the recess 190 may be disposed at a level beneath that of the top surface of the lower portion 105b of the active fin 105. Alternatively, the bottom of the recess 190 may be disposed at a level above that of the bottom of the upper portion 105a of the active fin 105.

In an embodiment according to the inventive concepts, two recesses 190 may be formed between neighboring gate structures. Thus, even though the gate structures are spaced apart from each other, each of the recesses 190 therebetween may not be wide in the first direction.

Thus, the portions of the epitaxial layer 210, which may be grown the recesses 190, respectively, by an SEG process, may sufficiently fill the recesses 190, and the top surface of (the portions of) the epitaxial layer 210 may be disposed at a level above that of the top surface of the active fin 105. The epitaxial layer 210 may include single crystalline silicon-germanium doped with p-type impurities, e.g., boron or aluminum.

In an example of this embodiment according to the inventive concepts, the impurity region 250 may have a constant thickness along the first direction on the upper portion 105a of the active fin 105. Thus, the bottom of the impurity region 250 may be flat, and a junction leakage may be prevented or reduced. The impurity region 250 may be doped with p-type impurities, e.g., boron or aluminum.

The epitaxial layer 210 and the impurity region 250 may serve as a source/drain region of the ESD protection device. The gate structure and the source/drain region may form a positive-channel metal oxide semiconductor (PMOS) transistor.

The contact plug 330 may be formed through the first and second insulating interlayers 270 and 320, and contact the top surface of the impurity region 250. In an example of this embodiment according to the inventive concepts, the contact plug 330 may penetrate an upper portion of the impurity region 250 so as to sufficiently contact the impurity region 250.

When a high voltage is applied via the contact plug 330 to this embodiment the ESD protection device in accordance with the inventive concepts, the junction leakage may be prevented or reduced because a profile of the bottom the impurity region 250 contacting the contact plug 330 may be flat.

The ESD protection device may include an NMOS transistor instead of the PMOS transistor, and in this case, the well region and the halo region may be doped with p-type impurities, and the epitaxial layer 210 and the impurity region 250 may be doped with n-type impurities.

FIGS. 38 to 45 illustrate another embodiment of a method of manufacturing an ESD protection device in accordance with the inventive concepts.

This method may be used for manufacturing the ESD protection device illustrated in FIGS. 34 to 37; however, the method is not limited thereto. Additionally, this method may include processes similar to those illustrated in and described with reference to FIGS. 1 to 28, and thus detailed descriptions of the similar processes may be omitted hereinafter.

First, processes similar to those illustrated in and described with reference to FIGS. 6 to 10 may be performed. However, before forming the trench 110 on the substrate 100, n-type impurities, e.g., phosphorus or arsenic, may be implanted into the substrate 100 to form a well region (not shown). Additionally, after forming the active fin 105, n-type impurities, e.g., phosphorus or arsenic, may be implanted into the substrate 100 to form a halo region (not shown).

Figure 38:
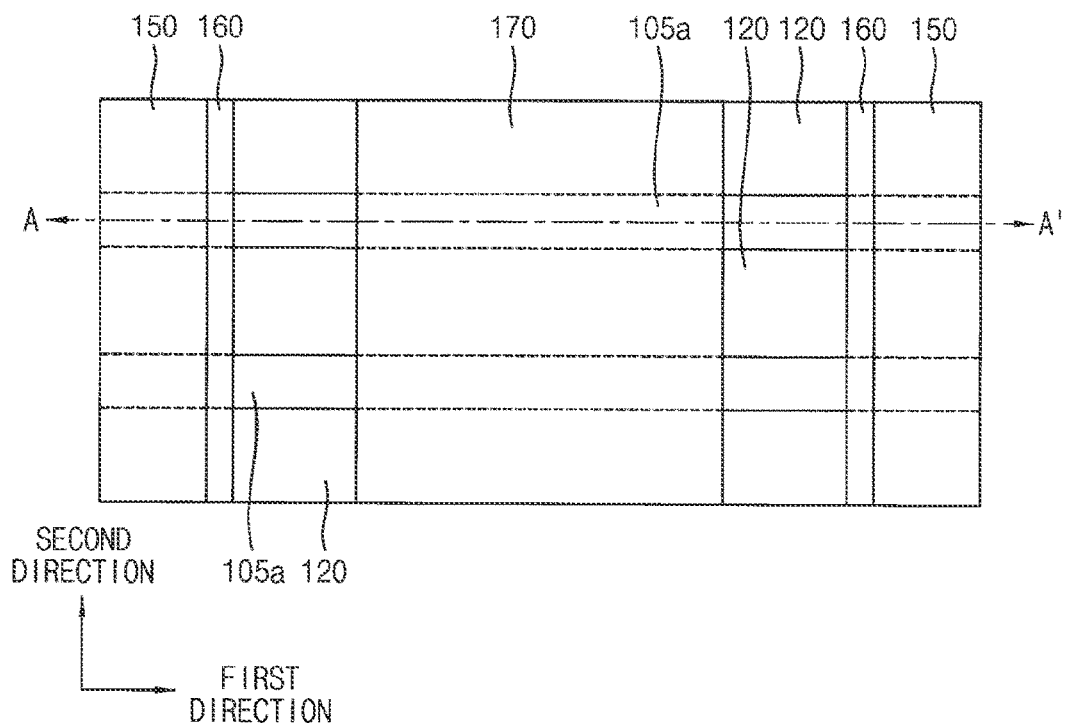
FIGS. 38 to 45 illustrate another embodiment of a method of manufacturing an ESD protection device in accordance with the inventive concepts, with FIGS. 38, 40 and 42 being plan views, FIGS. 39, 41, 43 and 45 being cross-sectional views taken along line A-A' of corresponding ones of the plan views, and FIG. 44 being a cross-sectional view cut along a line D-D' of the corresponding plan view of FIG. 42.
Figure 39:
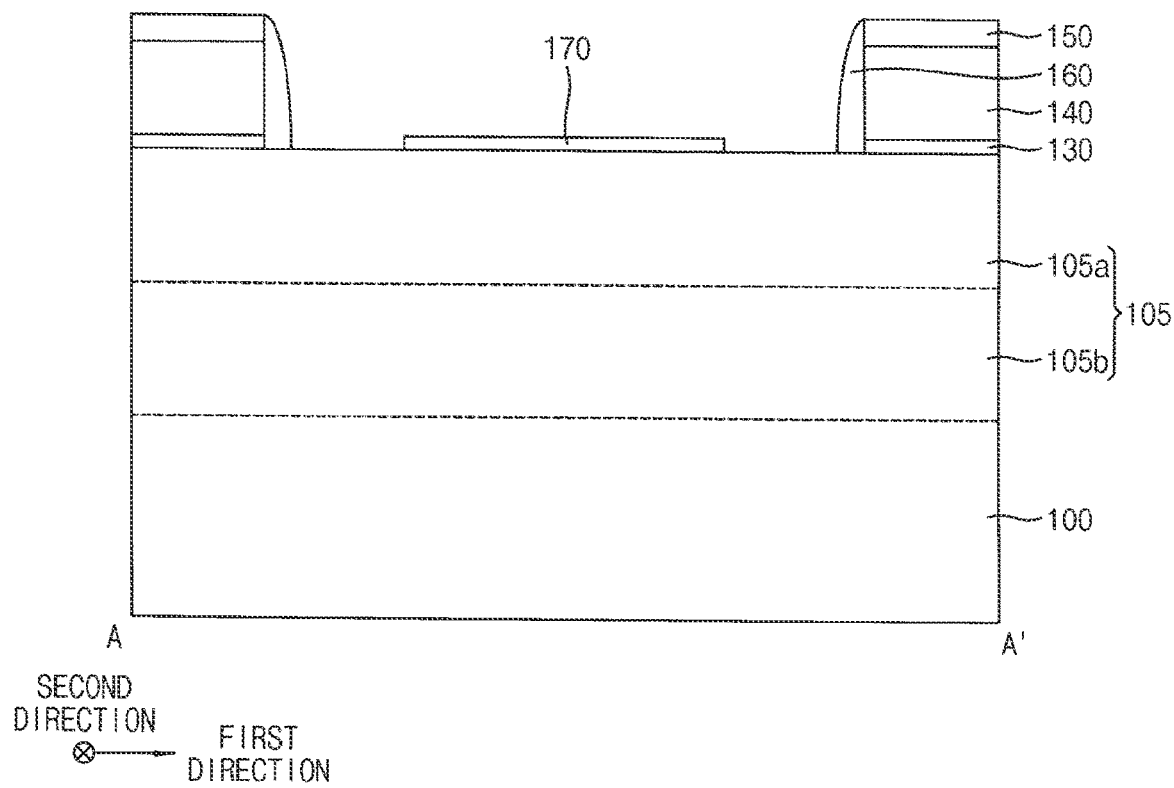

Referring to FIGS. 38 and 39, a process similar to that illustrated in and described with reference to FIGS. 11 and 12 may be performed to form a gate spacer 160 on sides of the dummy gate structure. However, when the gate spacer 160 is formed, a first mask 170 partially covering a portion of the active fin 105 between the dummy gate structures may be formed on the upper portion 105*a* of the active fin 105.

That is, a spacer layer may be formed on the dummy gate structures, the active fin 105 and the isolation layer 120, a photoresist pattern (not shown) partially covering the portion of the active fin 105 between the dummy gate structures may be formed on the spacer layer, and the spacer layer may be anisotropically etched to form the gate spacer 160 and the first mask 170. The spacer layer may be formed of a nitride, e.g., silicon nitride or silicon oxycarbonitride.

The first mask 170 may cover a central portion of the active fin 105 between the dummy gate structures. The first mask 170 may be formed to extend in the second direction on the active fin 105 and the isolation layer 120. Alternatively, the first mask 170 may be formed to cover only the central portion of each active fin 105.

Figure 40:
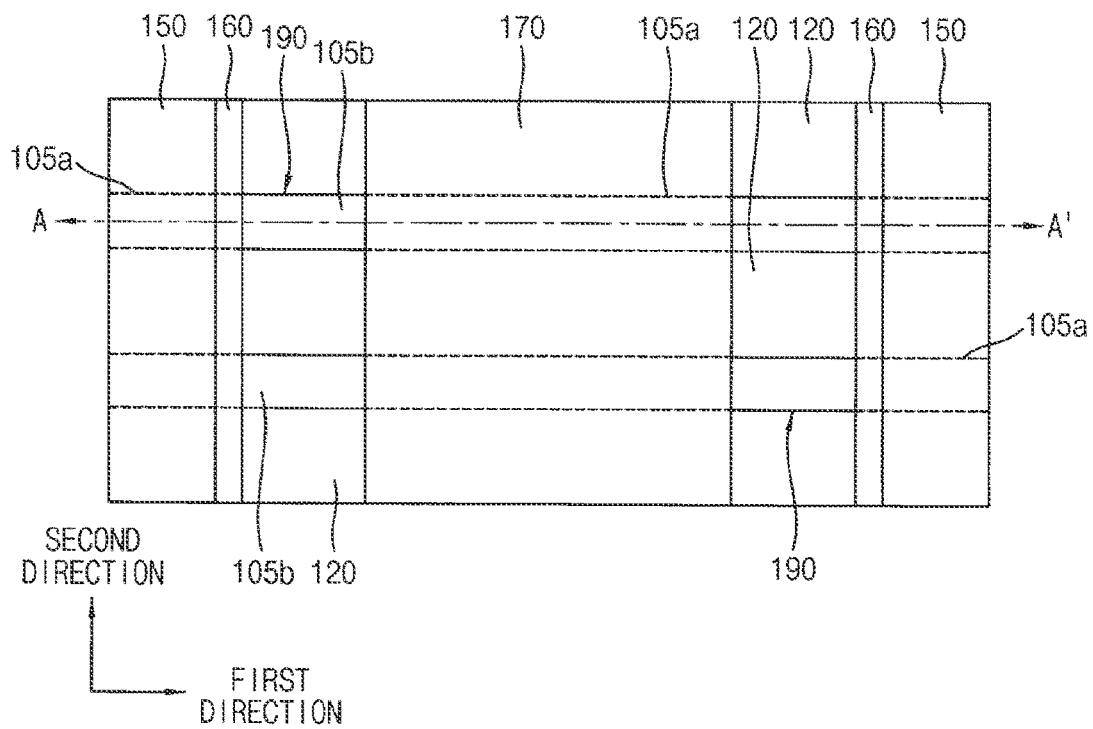
Figure 41:
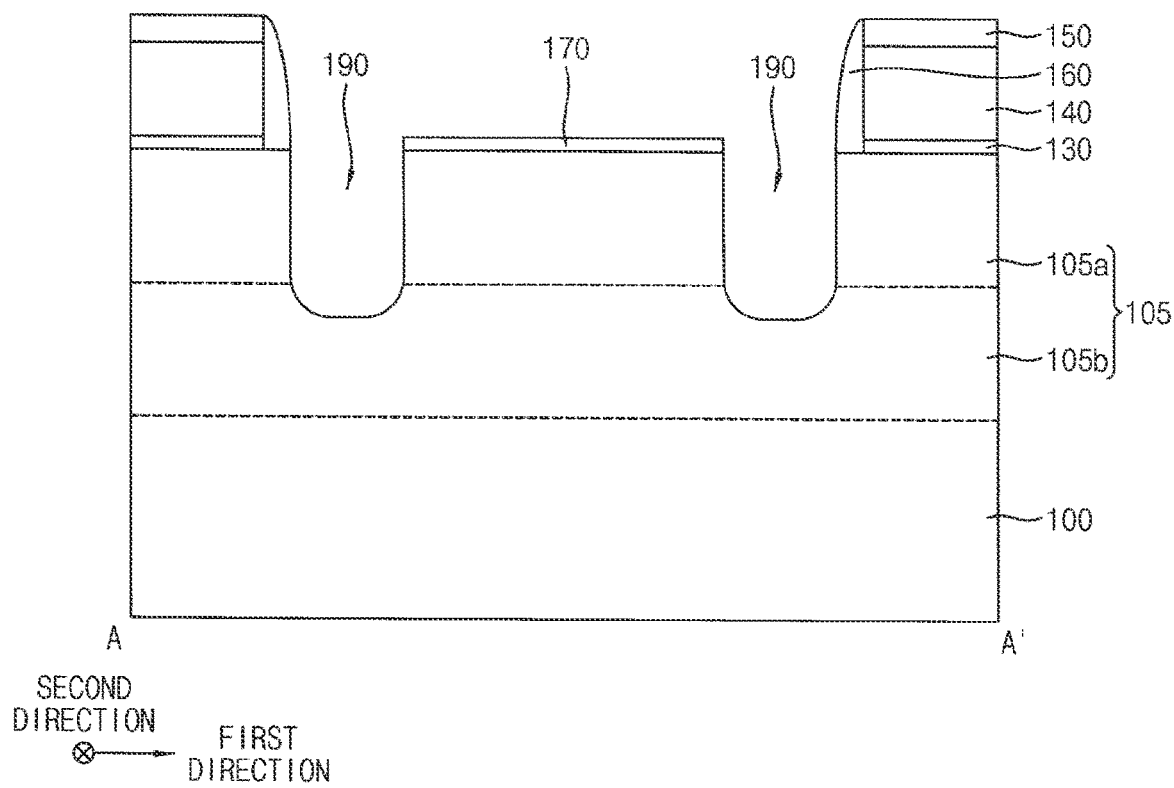

Referring to FIGS. 40 and 41, a process similar to that illustrated in and described with reference to FIGS. 13 to 15 may be performed.

Thus, the active fin 105 may be partially removed using the dummy gate structures, the gate spacers 160 and the first mask 170 as an etch mask to form a recess 190.

In an example of this embodiment according to the inventive concepts, the recess 190 may be formed by partially removing both of the upper portion 105*a* and the lower portion 105*b* of the active fin 105, and thus a bottom of the recess 190 may be disposed at a level beneath that of a top surface of the lower portion 105*b* of the active fin 105. Alternatively, the recess 190 may be formed by partially removing only the upper portion 105*a* of the active fin 105, and thus the bottom of the recess 190 may be disposed at a level above that of the bottom of the upper portion 105*a* of the active fin 105.

In the illustrated embodiment according to the inventive concepts, two recesses 190 are formed between neighboring two dummy gate structures of the plurality of dummy gate structures. Thus, even though the dummy gate structures are spaced apart from each other by a large distance, the width of each of the recesses 190 in the first direction can be minimal.

Figure 42:
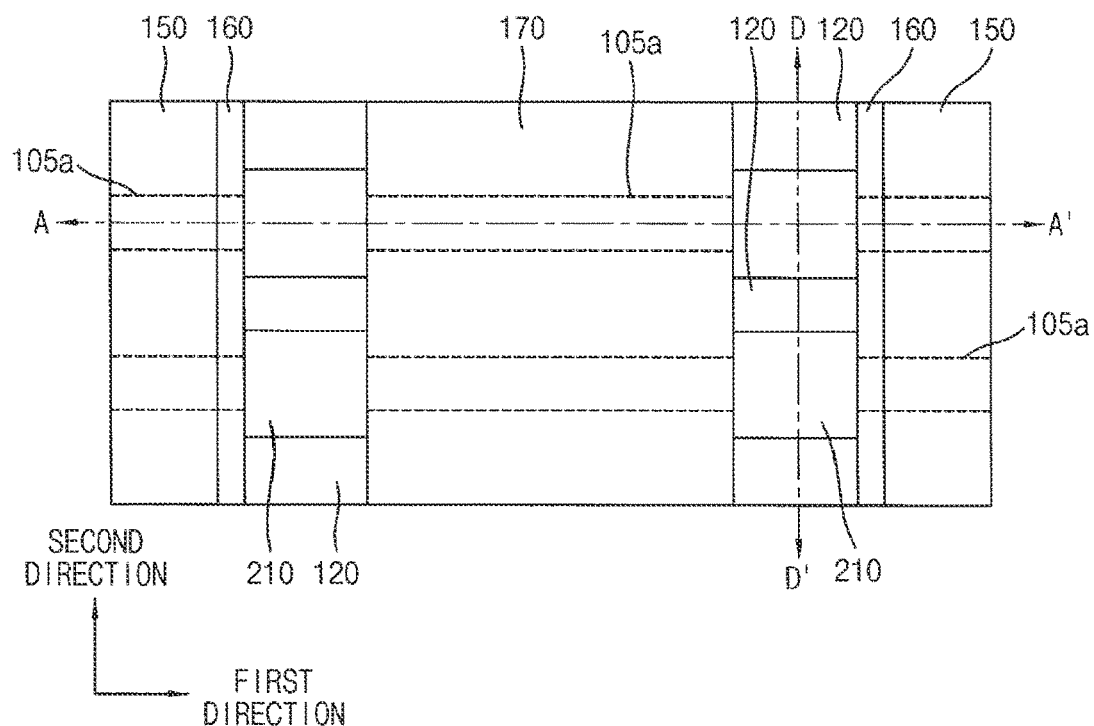
Figure 43:
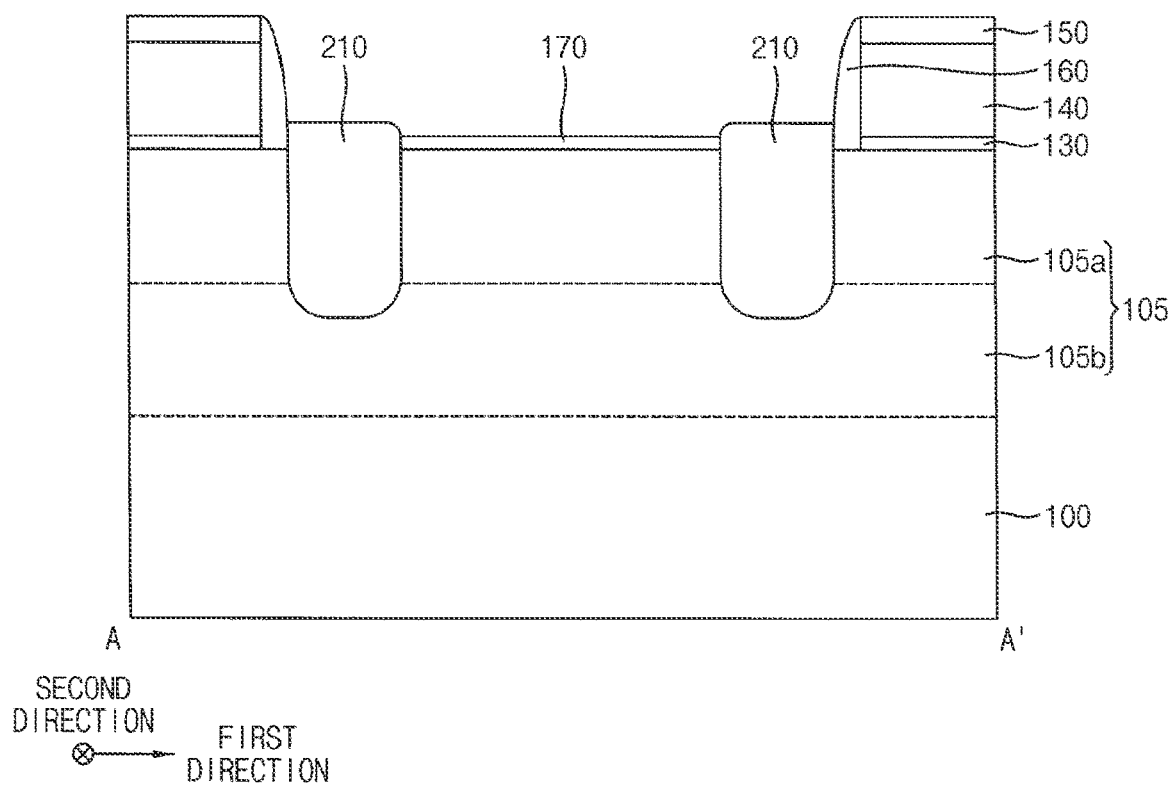
Figure 44:
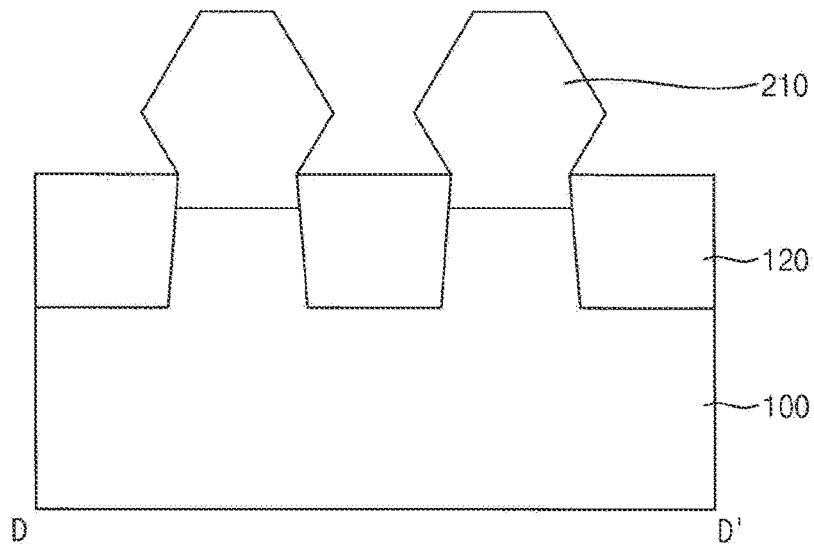

Referring to FIGS. 42 to 44, a process similar to that illustrated in and described with reference to FIGS. 17 to 20 may be performed to form an epitaxial layer 210 on the top surface of the active fin 105 to fill the recess 190.

In an embodiment according to the inventive concepts, an SEG process may be performed using a portion of the active fin 105 exposed by the recess 190, i.e., a top surface of the lower portion 105*b* of the active fin 105 and sides of the upper portion 105*a* of the active fin 105 as a seed to form the epitaxial layer 200.

The SEG process may be performed using a silicon source gas, e.g., dichlorosilane ($SiH_2Cl_2$), and a germanium source gas, e.g., germane ($GeH_4$), so that a single crystalline silicon-germanium layer may be formed. In an embodiment according to the inventive concepts, a p-type impurity source gas, e.g., diborane ($B_2H_6$), may be also used to form a single crystalline silicon-germanium layer doped with p-type impurities.

Figure 45:
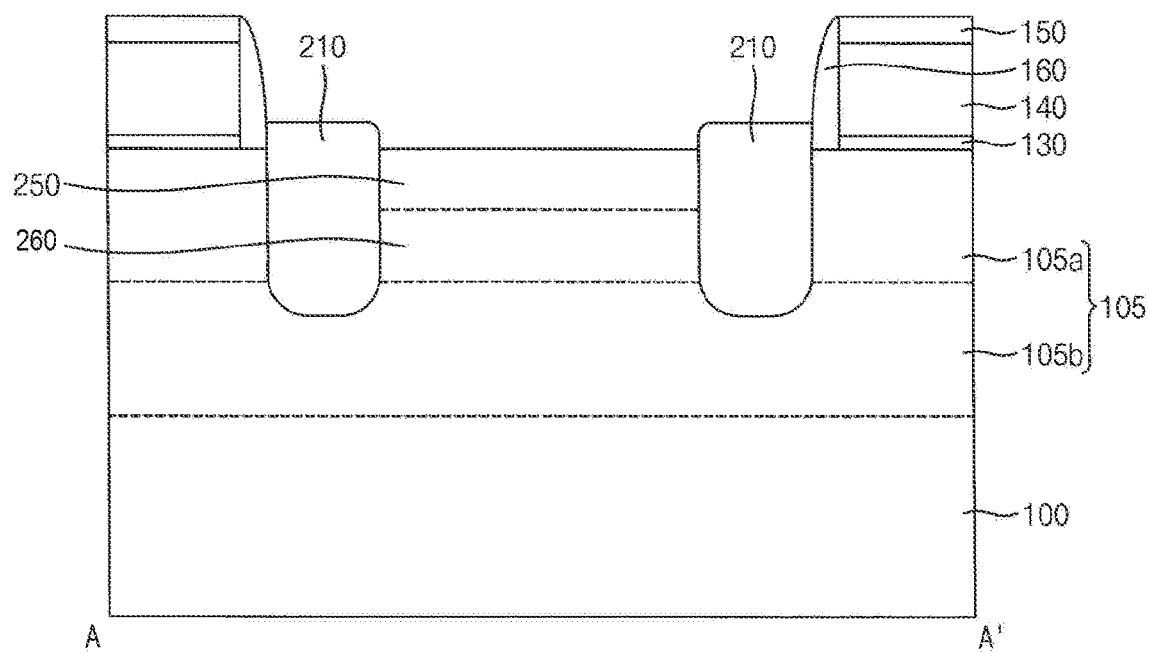

The epitaxial layer 210 including the single crystalline silicon-germanium layer doped with p-type impurities may be grown not only in a vertical direction but also in a horizontal direction, and thus an upper portion of the epitaxial layer 210 may be formed to have a cross section in the second direction in the shape of a pentagon or hexagon. As described above, the recess 190 may have a relatively small width in the first direction, and thus a discrete portion of the epitaxial layer 210, which may be formed by the SEG process, may sufficiently fill each recess 190. Thus, a maximum width of each discrete portion of the epitaxial layer 210, as taken in the first direction, is less than a minimum distance in the first direction between the neighboring gate structures. Furthermore, as shown in FIG. 45, the first impurity region 250 and the second impurity region 260 are located in a region of the active fin 105 that is interposed in the first direction between the discrete portions of the epitaxial layer 210. Also, a top surface of the epitaxial layer 210 may be formed at a level above that of the active fin 105.

Referring to FIG. 45, the first mask 170 may be removed by a cleaning process, and impurities may be implanted into an upper portion of the active fin 105 to form an impurity region 250.

In an embodiment according to the inventive concepts, the impurity region 250 may be formed by implanting p-type impurities, e.g., boron or aluminum. The ion implantation process may be performed using the dummy gate structures and the gate spacer 160 as an ion implantation mask, and an annealing process may be further performed so that the impurities may diffuse to neighboring portions of the active fin 105.

Thus, the impurities may be implanted into the epitaxial layer 210 and an upper portion of the active fin 105 therebetween, such that the upper portion of the active fin 105 constitutes an impurity region 250. In an embodiment according to the inventive concepts, the impurity region 250 may be formed to have a uniform thickness in the first direction. That is, the bottom of the impurity region 250 may be flat, which may prevent or reduce a junction leakage.

The epitaxial layer 210 and the impurity region 250 may serve as a source/drain region of the ESD protection device.

Next, as was described with reference to FIGS. 34-37, processes similar to those illustrated in and described with reference to FIGS. 21 to 28 may be performed.

Thus, a gate structure including a gate insulation layer pattern 130, a high-k dielectric layer pattern 290 and a gate electrode 300 sequentially stacked may be formed, and the gate structure and the source/drain region may form a PMOS transistor.

A second insulating interlayer 320 may be formed on the first insulating interlayer 270 to cover the PMOS transistor, and a contact plug 330 may be formed through the first and second insulating interlayers 270 and 320 to contact a top surface of the impurity region 250 between the epitaxial layer 210. Thus, the ESD protection device may be manufactured.

In an embodiment according to the inventive concepts, the contact plug 330 may be formed through an upper portion of the impurity region 250 to sufficiently contact the impurity region 250. The impurity region 250 may have a flat bottom, and thus the junction leakage may be prevented or reduced even though a high voltage may be applied to the contact plug 330.

When the ESD protection device includes an NMOS transistor instead the PMOS transistor, the well region and the halo region may be doped with p-type impurities, and the epitaxial layer 210 and the impurity region 250 may be doped with n-type impurities.

Figure 46:
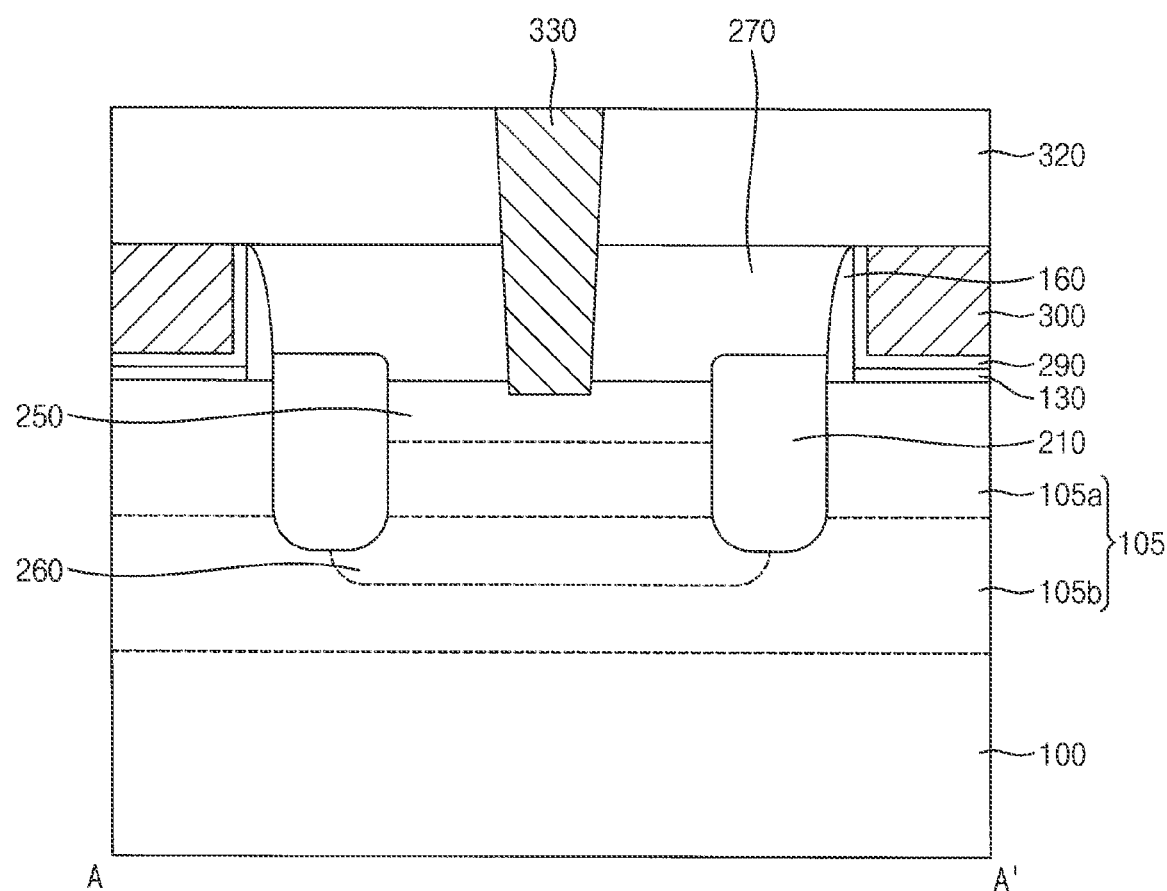
FIG. 46 is a cross-sectional view illustrating an ESD protection device in accordance with an embodiment according to the inventive concepts.

FIG. 46 illustrates another example of an ESD protection device in accordance with the inventive concepts. The ESD protection device may be similar to that illustrated in FIGS. 34 to 37, except for the impurity region. Thus, like reference numerals designate like elements, and detailed descriptions of similar elements may be omitted hereinafter.

Referring to FIG. 46, the ESD protection device may include a substrate 100, a gate structure, an epitaxial layer 210, a first impurity region 250, a second impurity region 260 and a contact plug 330. The ESD protection device may further include an isolation layer 120, a gate spacer 160, and first and second insulating interlayers 270 and 320.

The second impurity region 260 may be formed at a portion of the active fin 105 under the first impurity region 250, and may have a bottom disposed at a level beneath that of the epitaxial layer 210. Because the impurity region 250 is formed at an upper portion of the upper portion 105a of the active fin 105, the second impurity region 260 may be formed at a lower portion of the upper portion 105a of the active fin 105 and an upper portion of the lower portion 105b of the active fin 105. The bottom of the impurity region 250 and the top surface of the third impurity region 260 may contact each other. The third impurity region 260 may include p-type impurities, e.g., boron or aluminum.

The second impurity region 260 may be relatively thick and have a smooth bottom profile. Thus, when a high voltage is applied via the contact plug 330, a junction leakage may be prevented or reduced due to the second impurity region 260 under the impurity region 250 contacting the contact plug 330.

The epitaxial layer 210 and the first and second impurity regions 250 and 260 may serve as a source/drain region of the ESD protection device, and the gate structure and the source/drain region may form a PMOS transistor.

The ESD protection device may include an NMOS transistor instead of the PMOS transistor, and in this case, the well region and the halo region may be doped with p-type impurities, and the epitaxial layer 210 and the first and second impurity regions 250 and 260 may be doped with n-type impurities.

Figure 47:
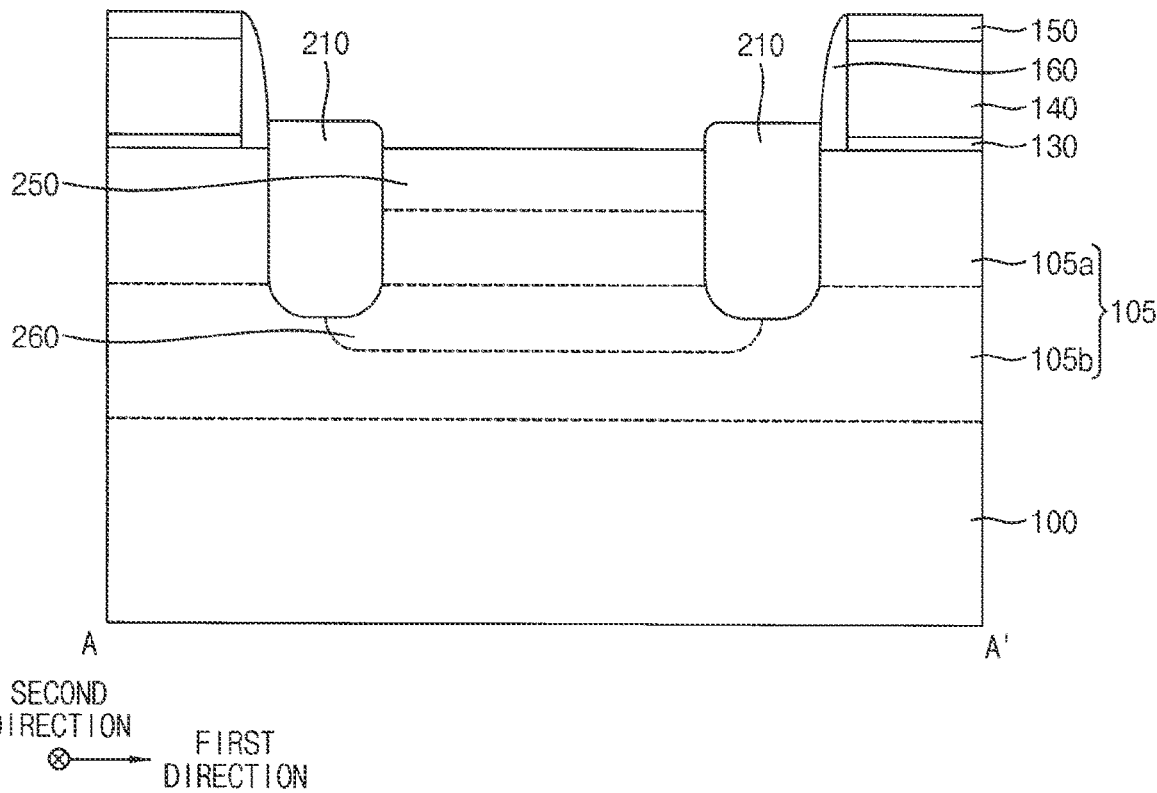
FIG. 47 is a cross-sectional view illustrating stages of a method of manufacturing an ESD protection device in accordance with an embodiment according to the inventive concepts.
Figure 48:
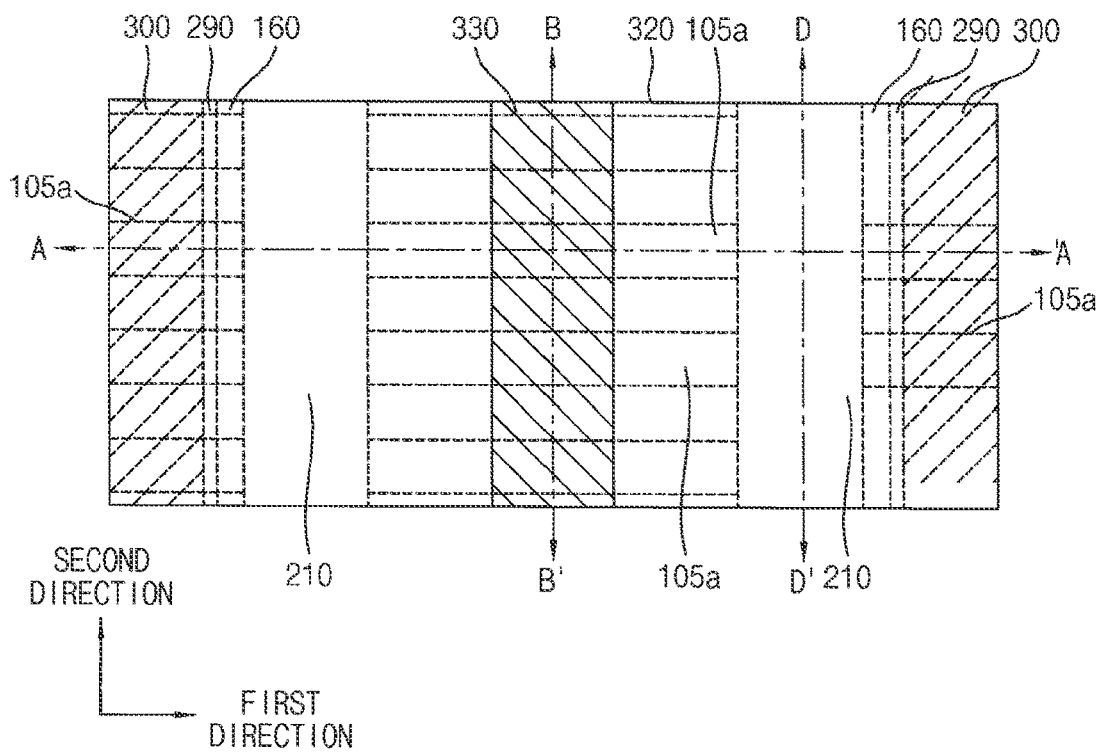
FIG. 48 is a plan view of another embodiment of an ESD protection device in accordance with the inventive concepts.
Figure 49:
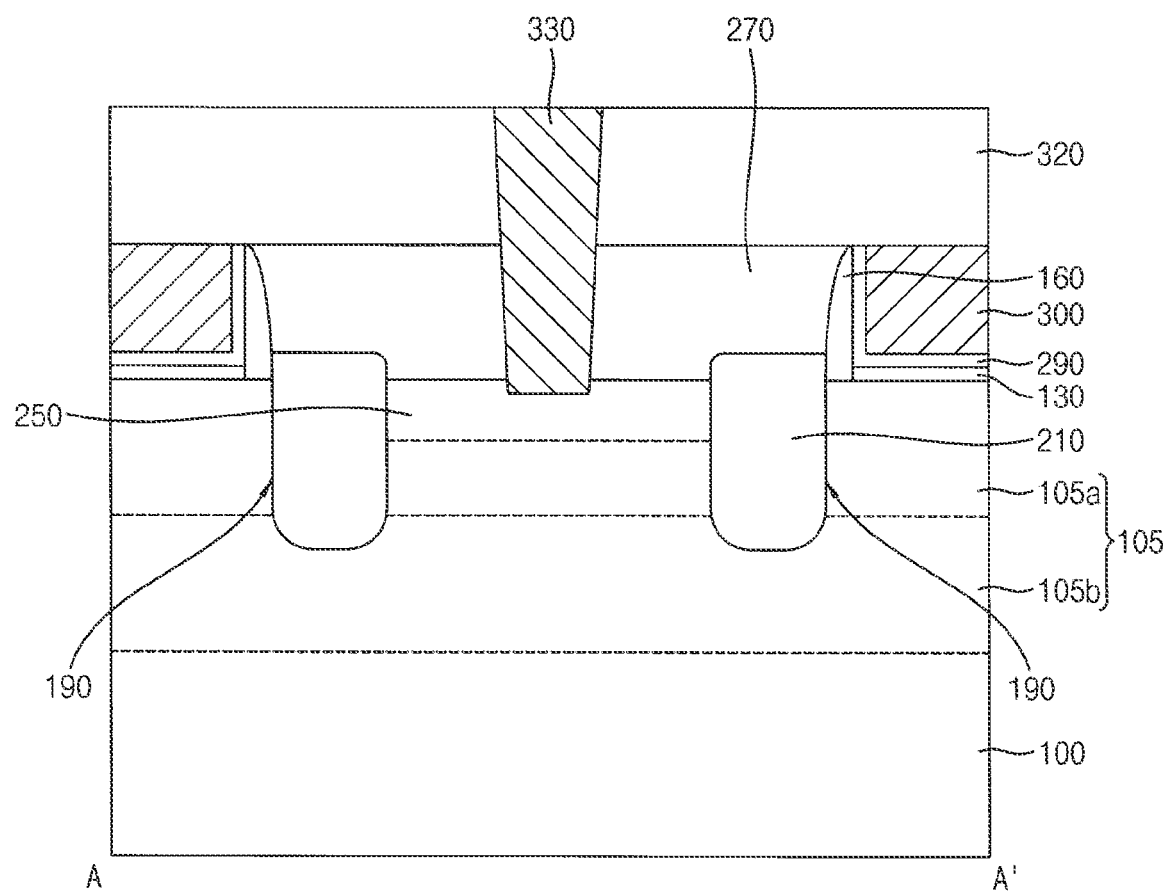
FIGS. 49, 50 to 51 are cross-sectional views taken along lines A-A', B-B' and D-D', respectively, of FIG. 48.
Figure 50:
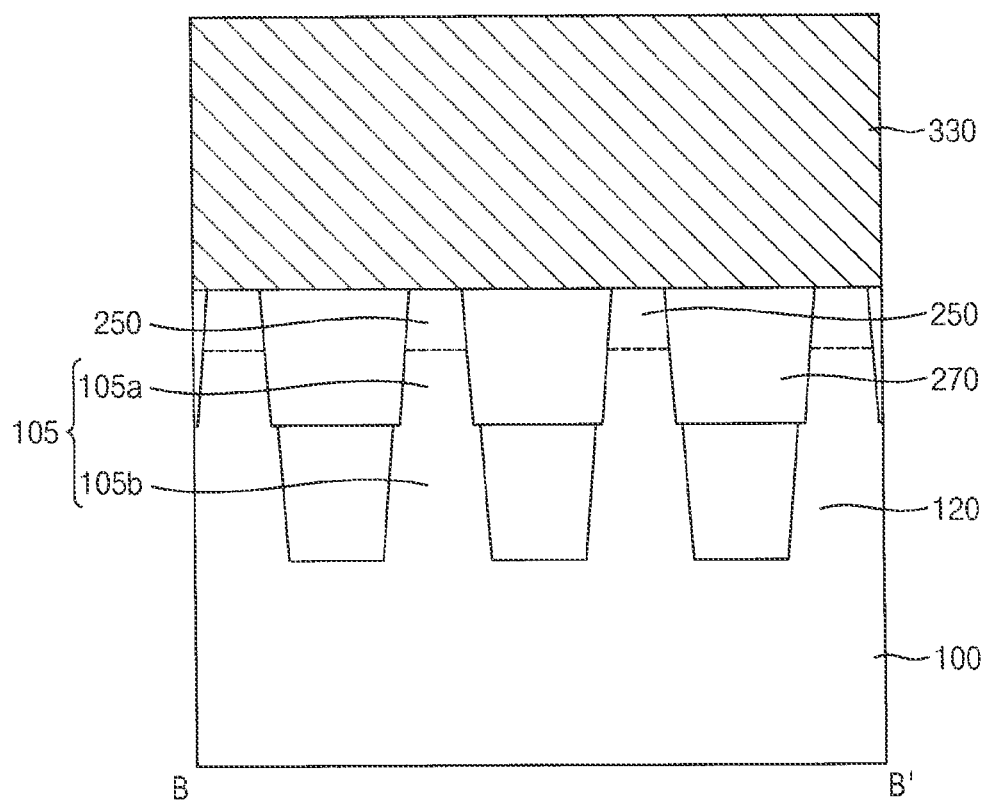
Figure 51:
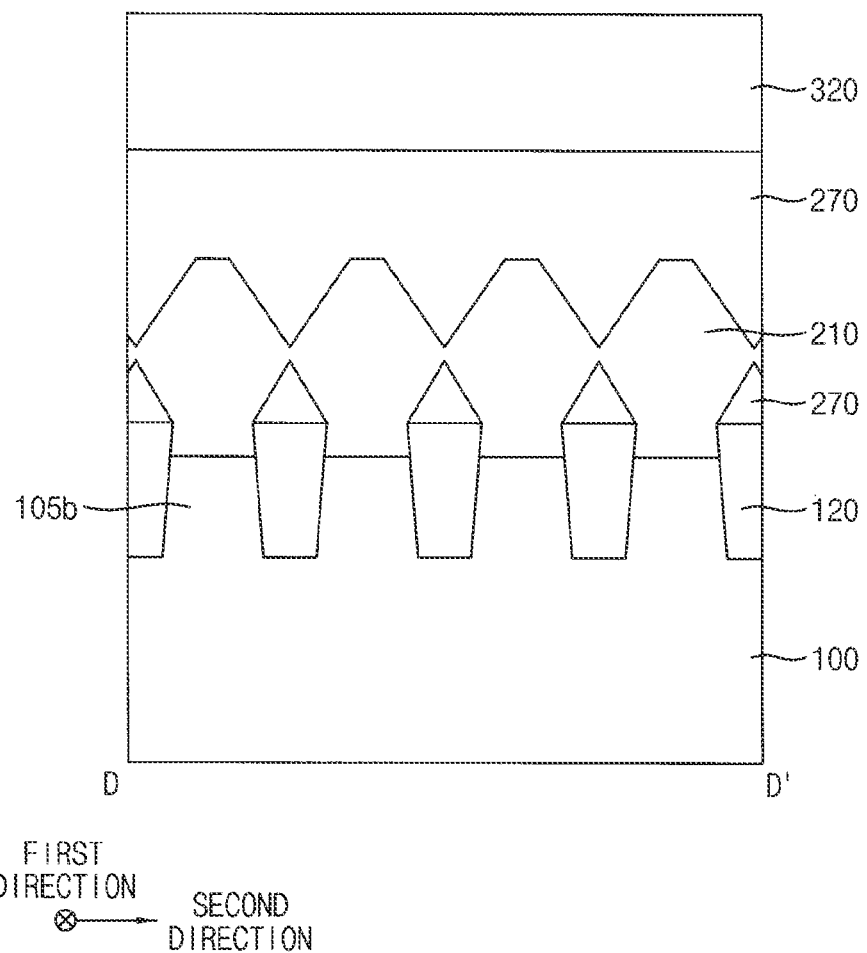
Figure 52:
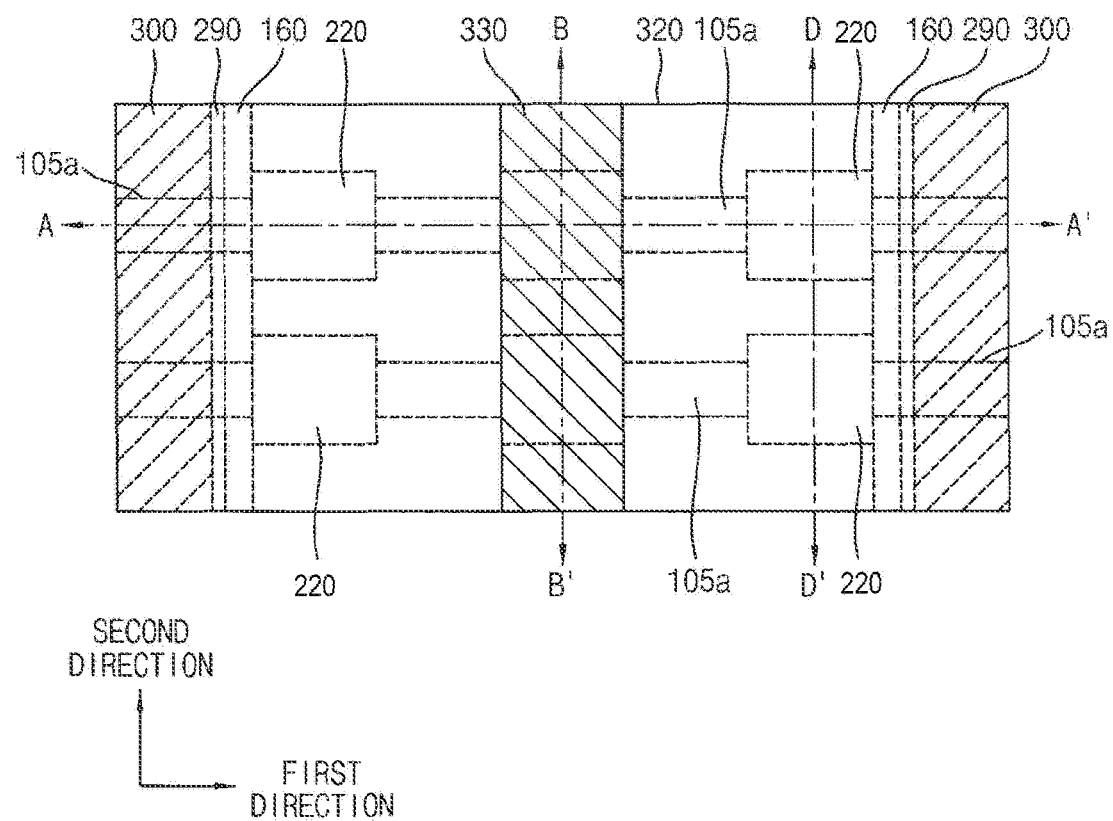
FIG. 52 is a plan view of another embodiment of an ESD protection device in accordance with the inventive concepts.
Figure 53:
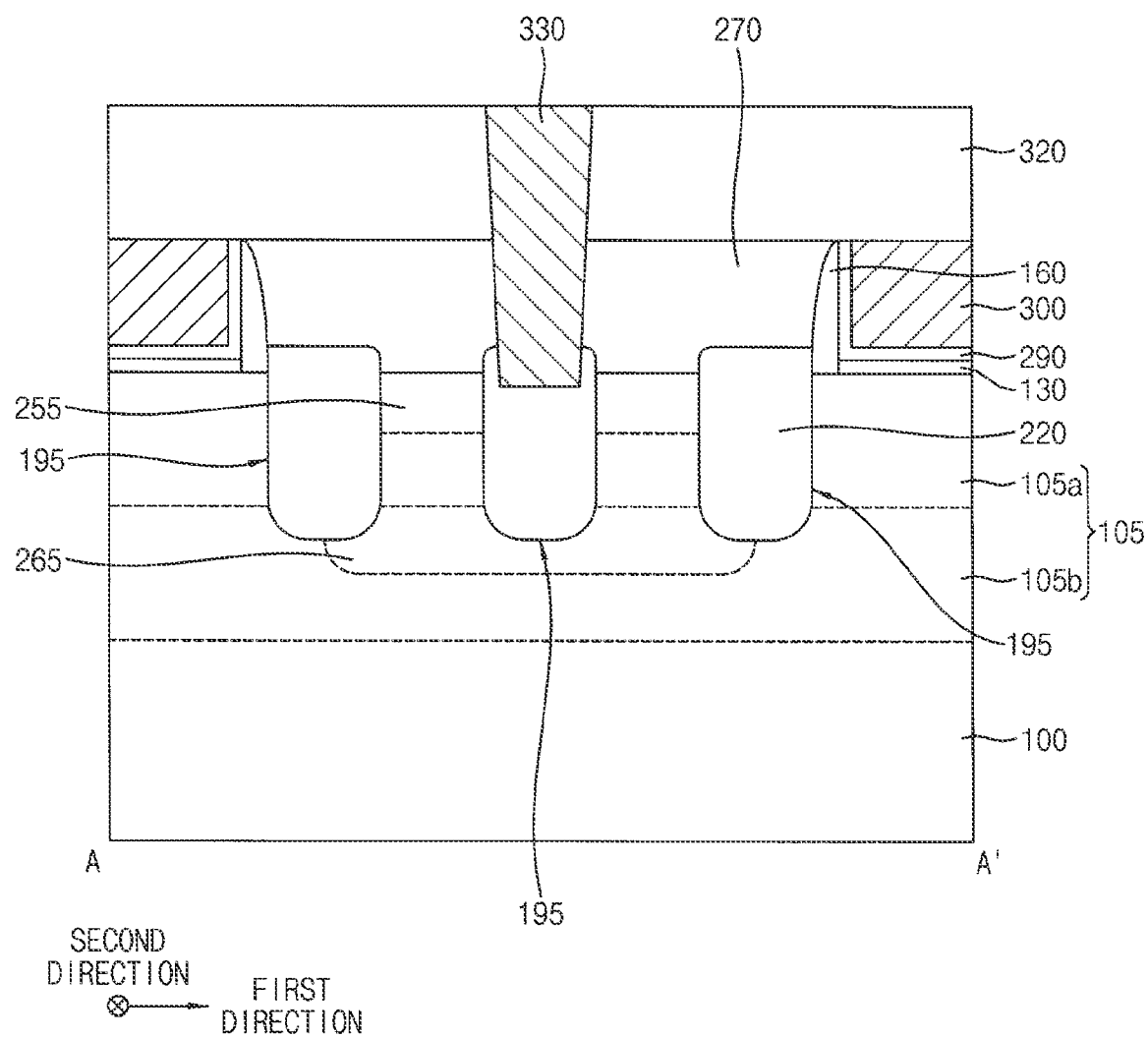
FIGS. 53, 54 and 55 are cross-sectional views taken along lines A-A', B-B' and D-D' of FIG. 52, respectively.
Figure 54:
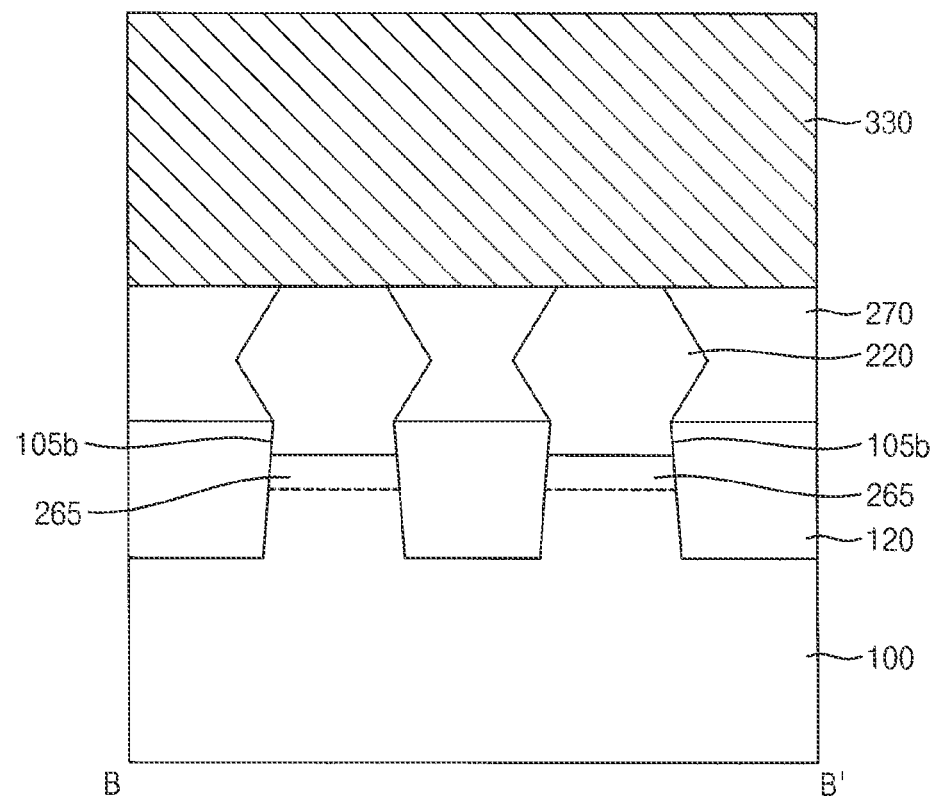
Figure 54:
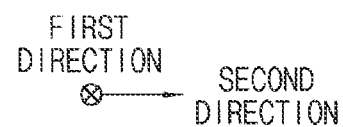
Figure 55:
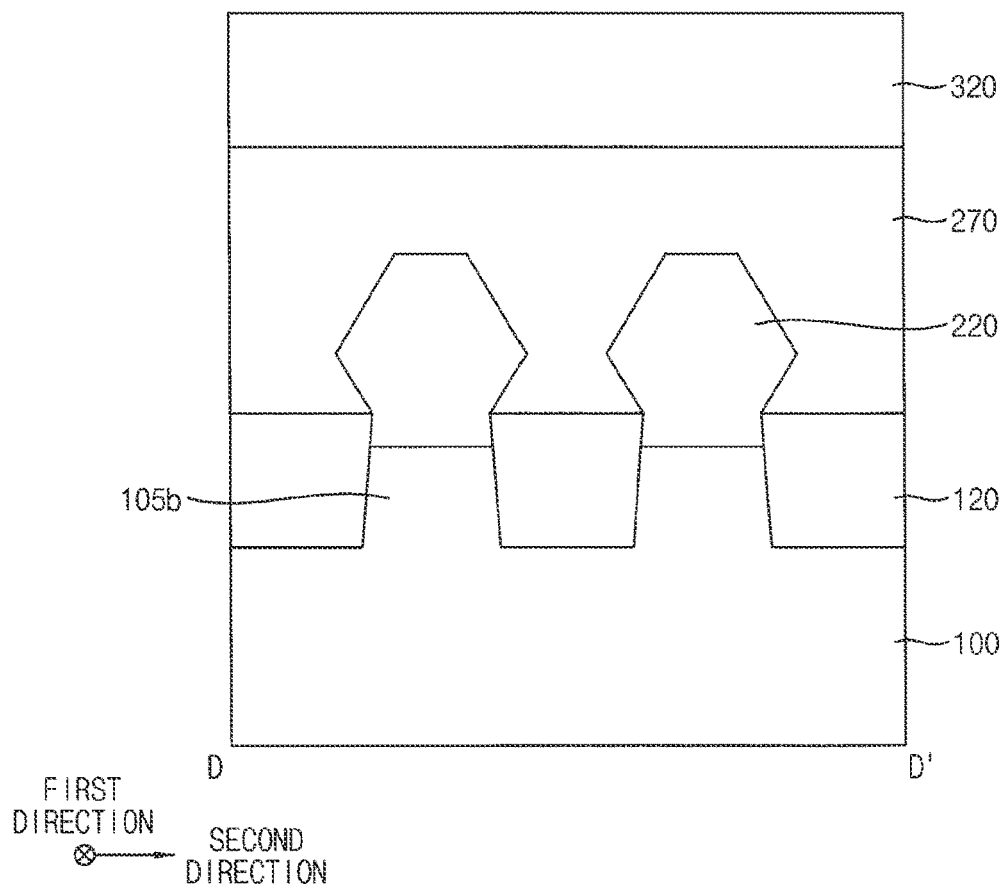

FIG. 47 illustrates a stage of an embodiment of a method of manufacturing an ESD protection device in accordance with the inventive concepts. This method may be used for manufacturing the ESD protection device illustrated with reference to FIG. 46; however, the method is not limited thereto. Additionally, this method may include processes similar to those illustrated in and described with reference to FIGS. 34 to 45, and thus detailed descriptions of these similar processes may be omitted hereinafter.

First, processes similar to those illustrated in and described with reference to FIGS. 38 to 45 may be performed.

Referring to FIG. 47, p-type impurities may be implanted into the active fin 105 by an ion implantation process using a first ion implantation mask (not shown). In an embodiment according to the inventive concepts, the first ion implantation mask may expose the exposed active fin 105 and a portion of the epitaxial layer 210 adjacent thereto, and thus the p-type impurities may be implanted into the active fin 105 in which the impurity region 250 is formed, and the portion of the epitaxial layer 210 adjacent thereto. Hereinafter, a portion of the active fin 105 under the impurity region 250 and into which the p-type impurities have been implanted may be referred to as a second impurity region 260.

In an embodiment according to the inventive concepts, the second impurity region 260 may be formed such that its bottom is situated in the lower portion 105b of the active fin 105.

After removing the first ion implantation mask, a process similar to that illustrated in and described with reference to FIGS. 34 to 37 may be performed to complete the ESD protection device.

When the ESD protection device includes an NMOS transistor, the well region and the halo region may be doped with p-type impurities, and the epitaxial layer 210 and the first and second impurity regions 250 and 260 may be doped with n-type impurities.

FIGS. 48-51 illustrate another embodiment of an ESD protection device according to the inventive concepts. The ESD protection device may be similar to that illustrated in and described with reference to FIGS. 34 to 37, except for the shape of the epitaxial layer. Thus, like reference numerals designate like elements, and detailed descriptions of similar elements may be omitted hereinafter.

Referring to FIGS. 48 to 51, the ESD protection device may include a substrate 100, a gate structure, an epitaxial layer 210, an impurity region 250, and a contact plug 330. The ESD protection device may further include an isolation layer 120, a gate spacer 160, and first and second insulating interlayers 270 and 320.

The epitaxial layer 210 may be formed in a recess 190 in a portion of an active fin 105 between the gate structures. In an embodiment according to the inventive concepts, two recesses 190 may be formed between neighboring gate structures. Thus, even though the gate structures are spaced apart from each other by a large distance, each of the recesses 190 therebetween may be relatively narrow in the first direction.

The epitaxial layer 210, which may be grown in each of the recesses 190 by an SEG process, may have portions that sufficiently fill the recesses 190, respectively, and a top surface of the epitaxial layer 210 may be disposed at a level above that of a top surface of the active fin 105. Thus, these portions of the epitaxial layer 210 are discrete bodies of the epitaxial material spaced from each other in the first direction. In an embodiment according to the inventive concepts, a plurality of segments of an epitaxial layer 210 may be formed in the second direction, and neighboring segments of the epitaxial layer 210 in the second direction may be connected to each other. That is, each of the portions of the epitaxial layer 210 (namely, the discrete bodies of epitaxial material) between the gate structures may extend contiguously in the second direction to cross the plurality of active fins 105. An upper part of each portion of the epitaxial layer 210 may have a cross section in the second direction in the shape of a series of connected pentagons or hexagons.

In an embodiment according to the inventive concepts, an ESD protection device of the type illustrated in and described with reference to FIGS. 34 to 37 may be employed by a logic device, and an EDS protection device of the type illustrated in and described with reference to FIGS. 48 to 51 may be employed by an SRAM device; however, the embodiment according to the inventive concepts is not limited thereto. Alternatively, both the ESD protection device of FIGS. 34 to 37 and the ESD protection device of FIGS. 48 to 51 may be employed by either a logic device or a SRAM device. When both a logic device and SRAM device are provided, an upper portion of the epitaxial layer 210 may have a pentagonal or hexagonal cross section and another upper portion of the epitaxial layer 210 may have a cross section in the form of a series of pentagons or hexagons.

Furthermore, note, in a method of manufacturing the ESD protection device of FIGS. 48 to 51 the SEG process may form the segments of the epitaxial layer 210 as connected to each other.

FIGS. 52 to 55 illustrate another embodiment of an ESD protection device in accordance with the inventive concepts. The ESD protection device may be similar to that illustrated in FIG. 46, except for the epitaxial layer and the impurity region. Thus, like reference numerals designate like elements, and detailed descriptions of the similar elements may be omitted hereinafter.

Referring to FIGS. 52 to 55, the ESD protection device may include a substrate 100, a gate structure, an epitaxial layer 220, a first impurity region 255, a second impurity region 265 and a contact plug 330. The ESD protection device may further include an isolation layer 120, a gate spacer 160, and first and second insulating interlayers 270 and 320.

The substrate 100 may include a well region (not shown) and/or a halo region (not shown) doped with p-type impurities, e.g., boron or aluminum.

The epitaxial layer 220 may be formed in a recess 195 in an active fin 105 between the gate structures.

The recess 195 may be formed by partially removing both of an upper portion 105a and a lower portion 105b of the active fin 105, and thus a bottom of the recess 195 may be disposed at a level beneath that of the top of the lower portion 105b of the active fin 105. Alternatively, the recess 195 may be formed by partially removing only the upper portion 105a of the active fin 105, and thus the bottom of the third recess 195 may be disposed at a level above that of the bottom of the upper portion 105a of the active fin 105.

In an embodiment according to the inventive concepts, a plurality of recesses 195 may be formed between neighboring two structures. Thus, even though the gate structures are spaced apart from each other by a large distance, each of the recesses 195 therebetween may be relatively narrow in the first direction. In an example of the illustrated embodiment, the recess 195 may be formed at regions adjacent to the neighboring gate structures, respectively, and at a central region therebetween. Thus, three recesses 195 may be formed between the neighboring two gate structures.

Thus, the epitaxial layer 220, which may be grown in each of the recesses 195 by an SEG process, may sufficiently fill each of the recesses 195, and a top surface of the epitaxial layer 220 may be disposed at a level above that of a top surface of the active fin 105. In an embodiment according to the inventive concepts, the epitaxial layer 220 may include single crystalline silicon or single crystalline silicon carbide doped with n-type impurities, e.g., phosphorus or arsenic.

The first and second regions 255 and 265 may be similar to the first and second impurity regions 250 and 260, respectively, except that they may be divided into two portions and include impurities of different conductivity types. Thus, the first impurity region 255 may have a uniform thickness, in the first direction, and the second impurity region 265 may be relatively thick and have a smooth bottom profile. The first and second impurity regions 255 and 265 may include n-type impurities, for example, phosphorus or arsenic.

The epitaxial layer 220 and the first and second impurity regions 255 and 265 may serve as a source/drain region of the ESD protection device, and the gate structure and the source/drain region may form an NMOS transistor.

The contact plug 330 may be formed through the first and second insulating interlayers 270 and 320 to contact the top of at least one of the sections of the epitaxial layer 220. In an example of the illustrated embodiment, the contact plug 330 may contact the top of a central one of three sections of the epitaxial layer 220 between neighboring gate structures. In an embodiment according to the inventive concepts, the contact plug 330 may penetrate an upper portion of the epitaxial layer 220 to sufficiently contact the epitaxial layer 220.

When a high voltage is applied via the contact plug 330, the second impurity region 265 under the epitaxial layer 220 contacting the contact plug 330 may be sufficiently thick and have a flat bottom profile, so that a junction leakage may be prevented or reduced.

The ESD protection device may include a PMOS transistor instead of the NMOS transistor, and in this case, the well region and the halo region may be doped with n-type impurities, and the epitaxial layer 220 and the first and second impurity regions 255 and 265 may be doped with p-type impurities.

FIGS. 56 to 63 illustrate stages of another embodiment of a method of manufacturing an ESD protection device in accordance with the inventive concepts.

This method may be used for manufacturing the ESD protection device illustrated with reference to FIGS. 52 to 55; however, the method may not be limited thereto. Additionally, this method may include processes similar to those illustrated in and described with reference to FIGS. 46 to 47 or FIGS. 34 to 45, and thus detailed descriptions of the similar processes may be omitted hereinafter.

First, processes similar to those illustrated in and described with reference to FIGS. 6 to 10 may be performed.

Figure 56:
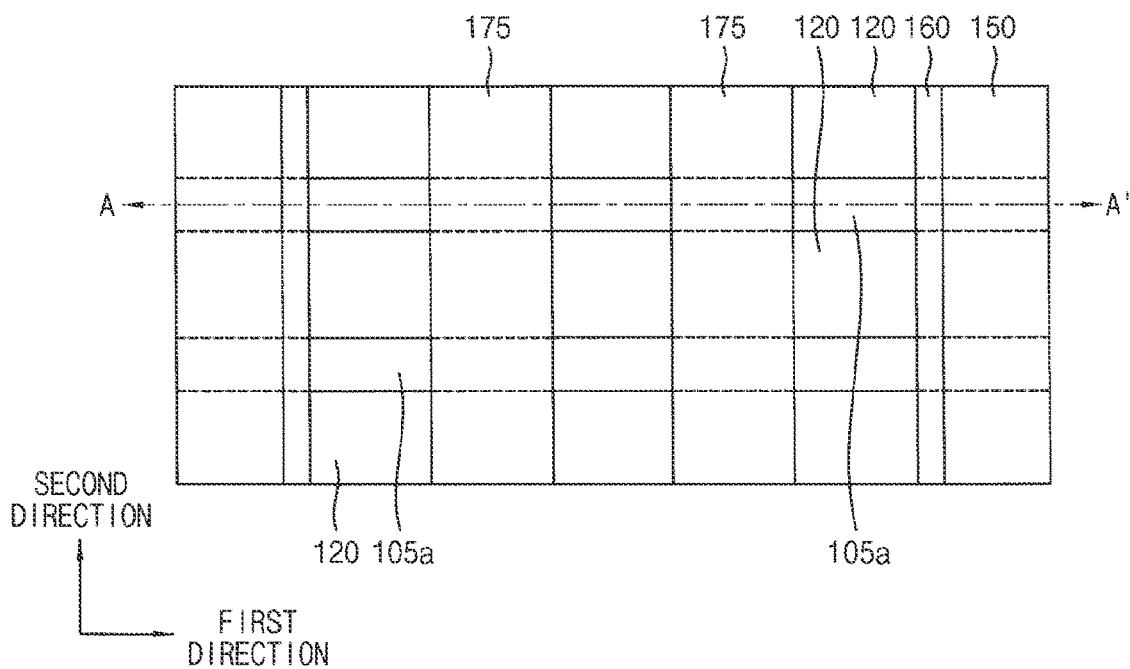
FIGS. 56 to 63 illustrate stages of another embodiment of a method of manufacturing an ESD protection device in accordance with the inventive concepts, with FIGS. 56, 58 and 60 being plan views, with FIGS. 57, 59, 61 and 63 being cross-sectional views taken along a line A-A' of the corresponding plan views, and with FIG. 62 being a cross-sectional view taken in a direction corresponding to line D-D' of FIG. 52.
Figure 57:
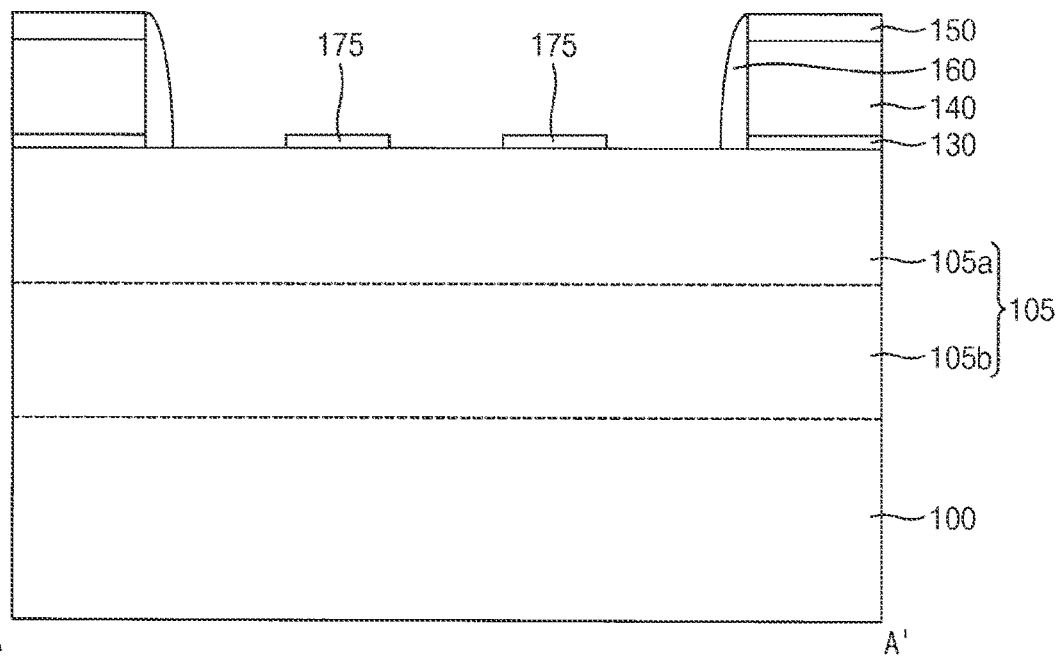

Referring to FIGS. 56 and 57, a process similar to that illustrated in and described with reference to FIGS. 38 and 39 may be performed to form a gate spacer 160 on a side of the dummy gate structure, and a second mask 175 partially covering a portion of the active fin 105 between the dummy gate structures.

In an embodiment according to the inventive concepts, a mask 175 may be formed to partially cover the portion of the active fin 105 between the dummy gate structures. The mask 175 may be formed on the active fin 105 and the isolation layer 120 to extend in the second direction. Alternatively, the mask 175 may be formed only on a central portion of the active fin 105.

Figure 58:
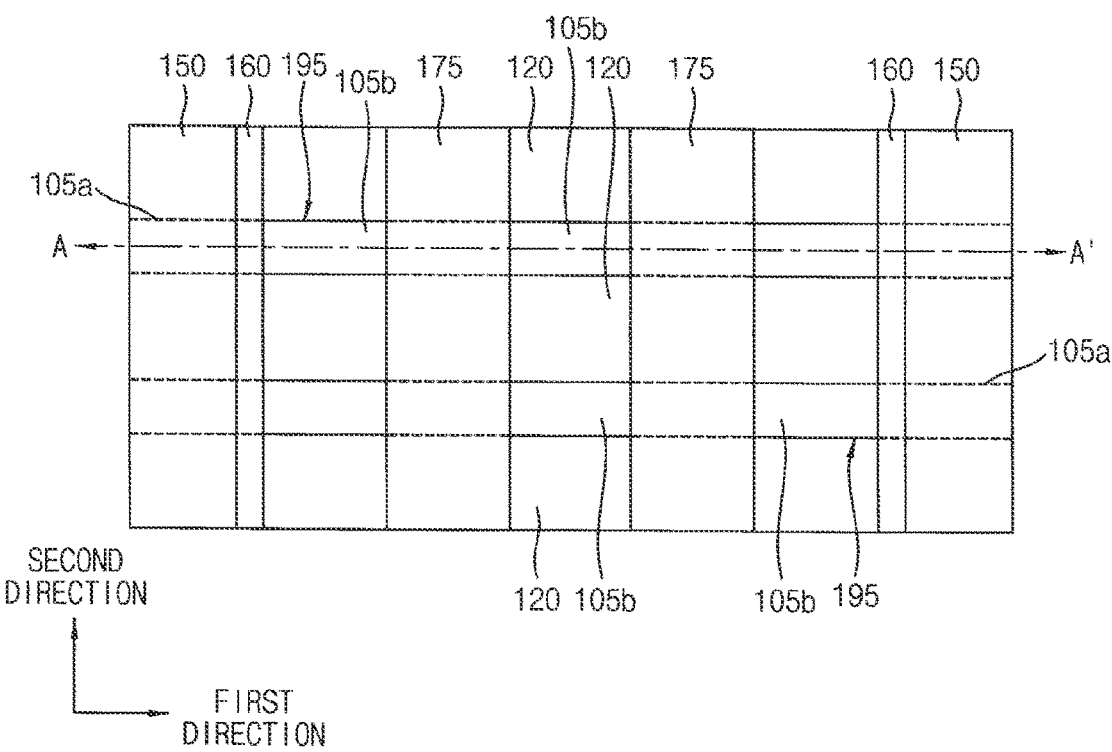
Figure 59:
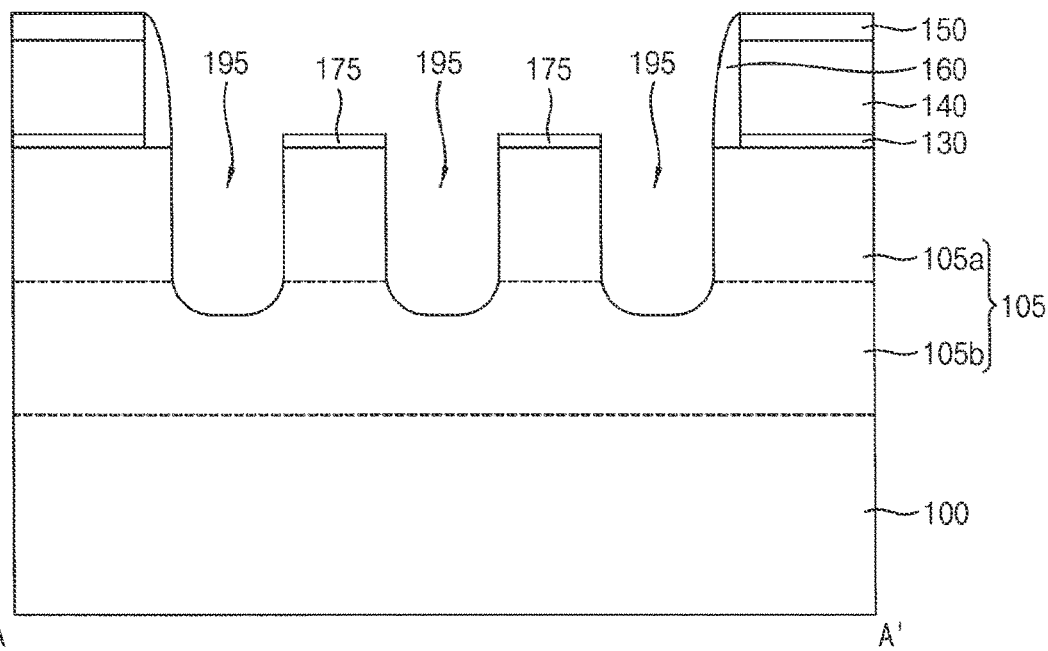

Referring to FIGS. 58 and 59, a process similar to that illustrated in and described with reference to FIGS. 40 and 41 may be performed.

Thus, the active fin 105 may be partially removed using the dummy gate structures, the gate spacers 160 and the second mask 175 as an etch mask to form a recess 195.

In an embodiment according to the inventive concepts, the recess 195 may be formed by partially removing both of the upper portion 105a and the lower portion 105b of the active fin 105, and thus the bottom of the recess 195 may be disposed at a level beneath that of the top surface of the lower portion 105b of the active fin 105. Alternatively, the recess 195 may be formed by partially removing only the upper portion 105a of the active fin 105, and thus the bottom of the recess 195 may be disposed at a level above that of the bottom of the upper portion 105a of the active fin 105.

In an embodiment according to the inventive concepts, a plurality of third recesses 195 may be formed between neighboring dummy gate structures. Thus, even though the dummy gate structures are spaced apart from each other at a large distance, each of the recesses 195 therebetween may be relatively narrow in the first direction. In an example of the illustrated embodiment, a recess 195 may be formed at regions adjacent to the neighboring dummy gate structures, respectively, and at a central region therebetween. Thus, three recesses 195 may be formed between neighboring dummy gate structures.

Figure 60:
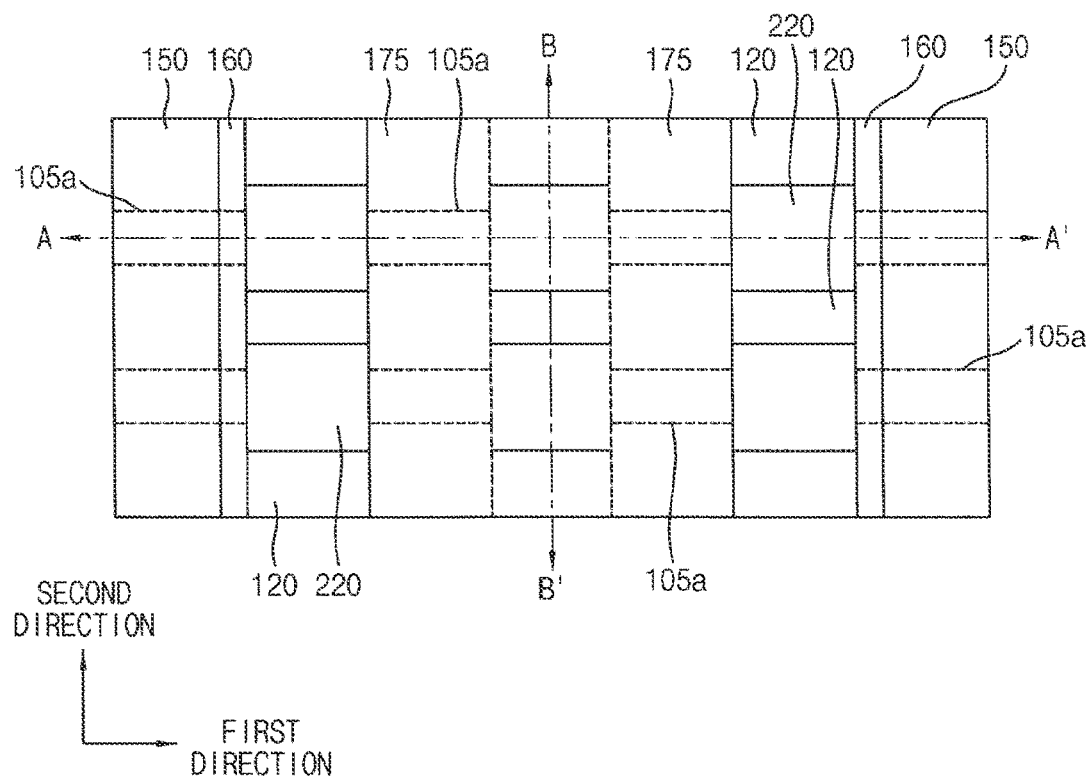
Figure 61:
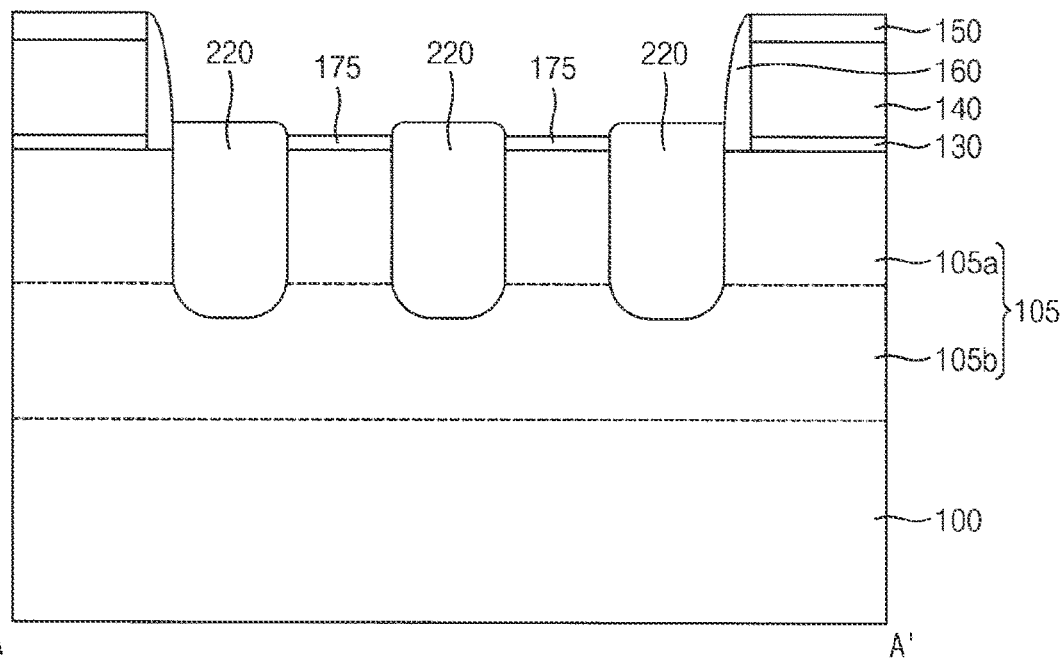
Figure 62:
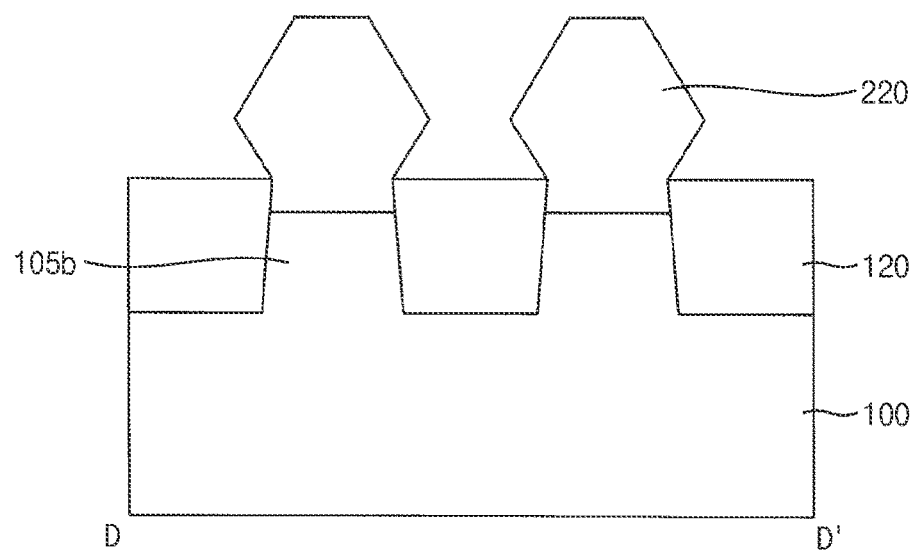

Referring to FIGS. 60 to 62, a process similar to that illustrated in and described with reference to FIGS. 42 to 44 may be performed to form an epitaxial layer 220 on the top surface of the active fin 105 to fill the recess 195.

In an embodiment according to the inventive concepts, an SEG process may be performed using a silicon source gas, e.g., disilane ($Si_2H_6$), so that a single crystalline silicon layer may be formed. In an embodiment according to the inventive concepts, an n-type impurity source gas, e.g., phosphine ($PH_3$), may be also used to form the single crystalline silicon layer doped with n-type impurities. Alternatively, the SEG process may be performed using not only a silicon source gas, e.g., disilane ($Si_2H_6$), but also a carbon source gas, e.g., methylsilane ($SiH_3CH_3$), to form a single crystalline silicon carbide layer. In an embodiment according to the inventive concepts, an n-type impurity source gas, e.g., phosphine ($PH_3$), may be also used to form the single crystalline silicon carbide layer doped with n-type impurities.

As described above, the recess 195 may be relatively narrow in the first direction, and thus the third epitaxial layer 220, which may be formed by the SEG process, may sufficiently fill the recess 195. Thus, a top surface of the epitaxial layer 220 may be disposed at a level higher than that of the active fin 105.

Figure 63:
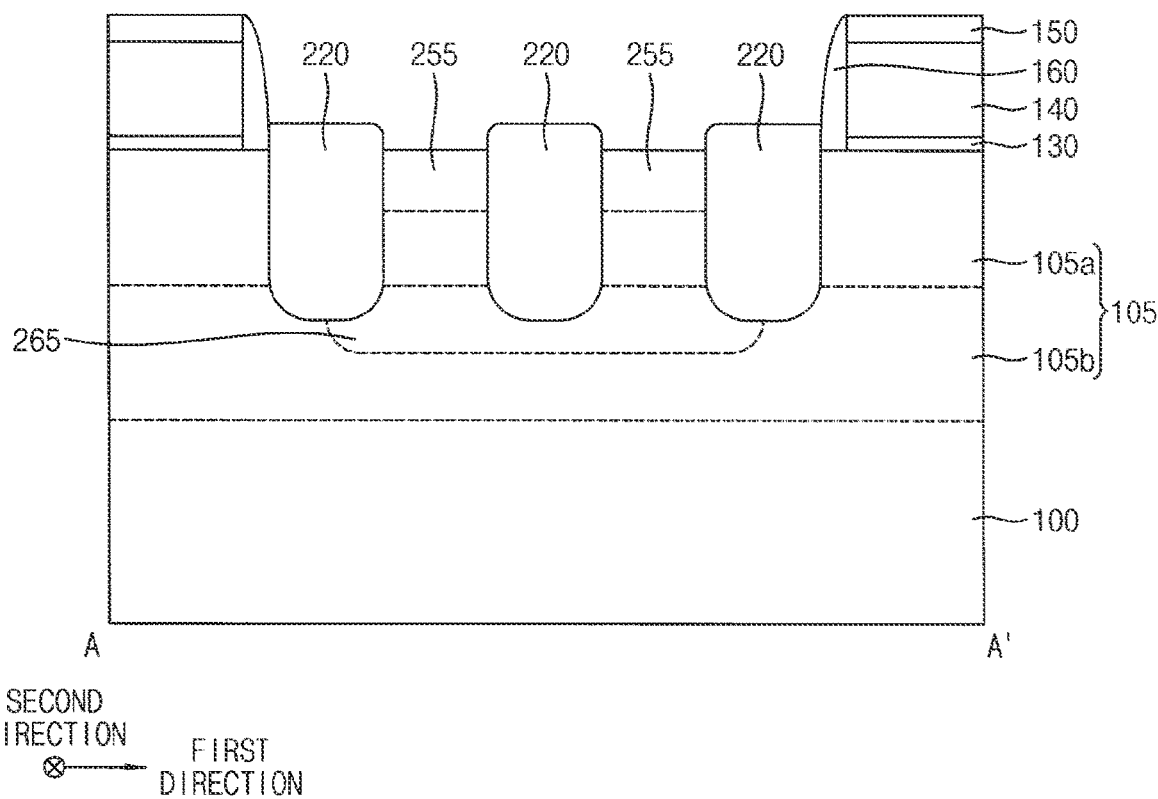
Figure 64:
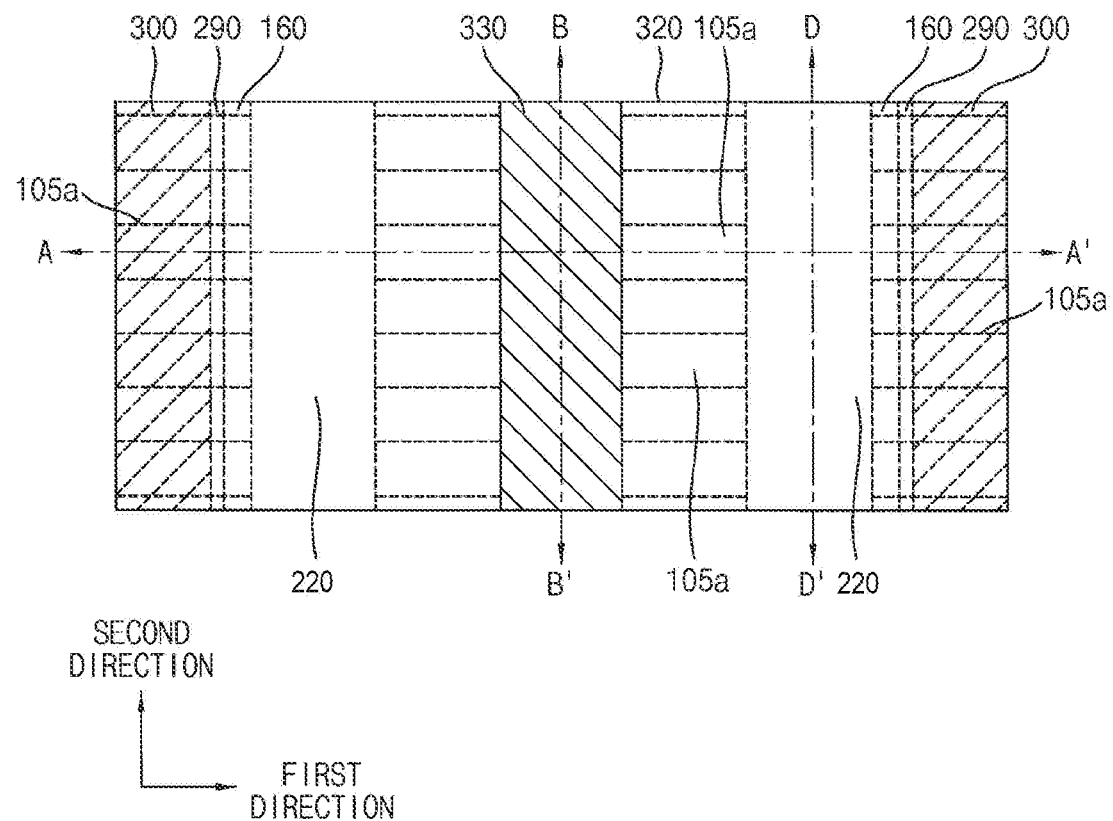
FIG. 64 is a plan view illustrating another embodiment of an ESD protection device in accordance with the inventive concepts.

Referring to FIG. 63, a process similar to that illustrated in and described with reference to FIGS. 46 to 47 may be performed.

Thus, impurities may be implanted into the an upper portion of the active fin 105 to form first and second impurity regions 255 and 265.

In an embodiment according to the inventive concepts, the first and second impurity regions 255 and 265 may be doped with n-type impurities, e.g., phosphorus or arsenic. In an embodiment according to the inventive concepts, the first impurity region 255 may be formed at an upper portion of the upper portion 105a of the active fin 105 to have a uniform thickness in the first direction, and the second impurity region 265 may be formed under the first impurity region 255 and have a bottom disposed at a level beneath that of that of the epitaxial layer 220.

Referring to FIGS. 52 to 55 again, a process similar to those illustrated with reference to FIGS. 34 to 37 may be performed to complete the ESD protection device.

However, the contact plug 330 may be may be formed through the first and second insulating interlayers 270 and 320 to contact a top of at least one of the segments (discrete portions) of the epitaxial layer 220. A maximum width of each segment (discrete portion) of the epitaxial layer 220, as taken in the first direction, is less than a minimum distance in the first direction between the neighboring gate structures. Furthermore, as shown in the figure, the first impurity region 255 and the second impurity region 265 are located in a region of the active fin 105 that is interposed in the first direction between the segments (discrete portions) of the epitaxial layer 220. In an embodiment according to the inventive concepts, the contact plug 330 may penetrate an upper portion of the third segment (discrete portion) of the epitaxial layer 220 to sufficiently contact the epitaxial layer 220.

When the ESD protection device includes a PMOS transistor instead of the NMOS transistor, the well region and the halo region may be doped with n-type impurities, and the epitaxial layer 220 and the first and second impurity regions 255 and 265 may be doped with p-type impurities.

FIGS. 64 to 67 illustrate still another embodiment of an ESD protection device in accordance with the inventive concepts. The ESD protection device may be similar to that illustrated in FIGS. 52 to 55, except for the shape of the epitaxial layer. Thus, like reference numerals designate like elements, and detailed descriptions of similar elements may be omitted hereinafter.

Referring to FIGS. 64 to 67, the ESD protection device may include a substrate 100, a gate structure, an epitaxial layer 220, a first impurity region 255, a second impurity region 265 and a contact plug 330. The ESD protection device may further include an isolation layer 120, a gate spacer 160, and first and second insulating interlayers 270 and 320.

The epitaxial layer 220 may be formed in a third recess 195 in an active fin 105 between the gate structures.

In an embodiment according to the inventive concepts, a plurality of recesses 195 may be formed between neighboring gate structures. Thus, even though the gate structures are spaced apart from each other at a large distance, each of the recesses 195 therebetween may be relatively narrow in the first direction. In an example of the illustrated embodiment, recesses 195 may be formed at regions adjacent to the neighboring gate structures, respectively, and at a central region therebetween. Thus, three recesses 195 may be formed between the neighboring gate structures.

The epitaxial layer 220, which may be grown in each of the recesses 195 by an SEG process, may sufficiently fill each of the recesses 195, and the epitaxial layer 220 may have a top surface disposed at a level above that of a top surface of the active fin 105. In an embodiment according to the inventive concepts, a plurality of sections of the epitaxial layer 220 may be formed in the second direction, and neighboring sections of the epitaxial layer 220 in the second direction may be connected to each other. The upper portion of the sections of the epitaxial layer 220 may have a cross section, along the second direction, in the shape is of a series of pentagons or hexagons.

Figure 65:
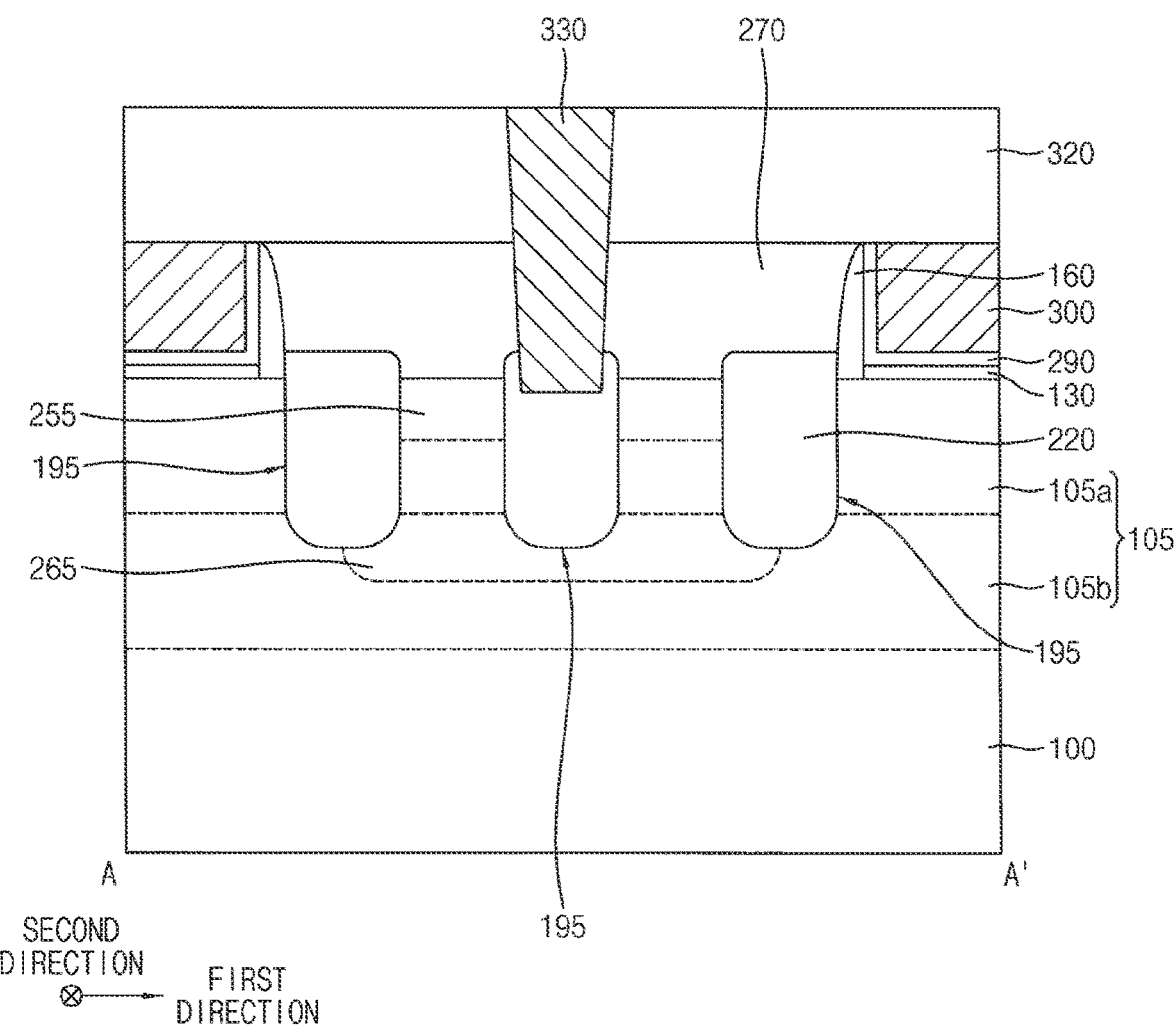
Figure 66:
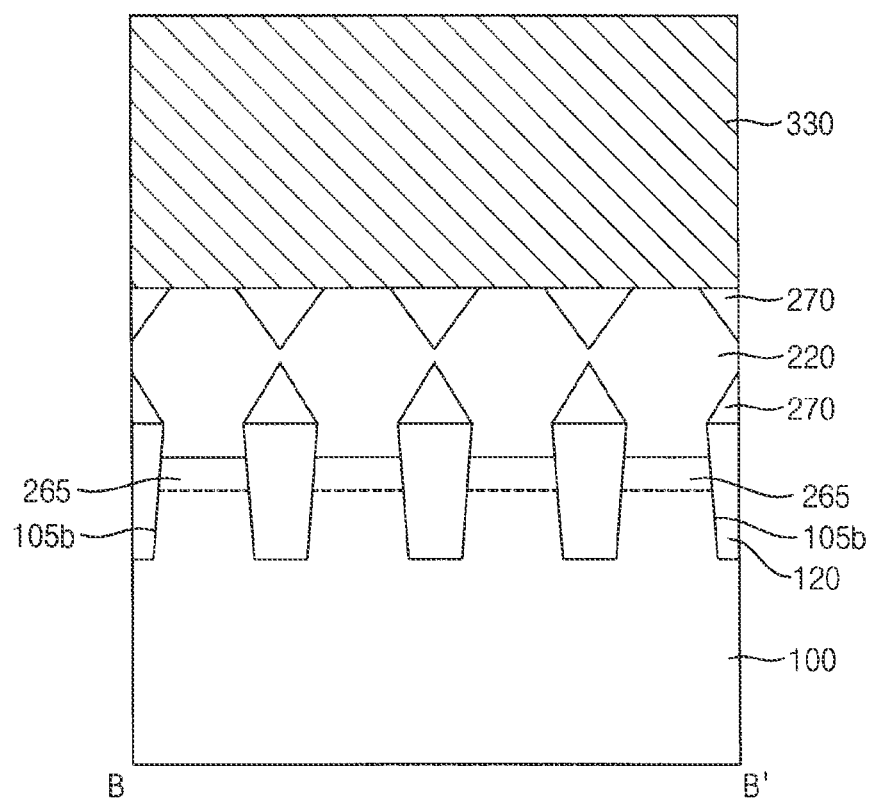
Figure 67:
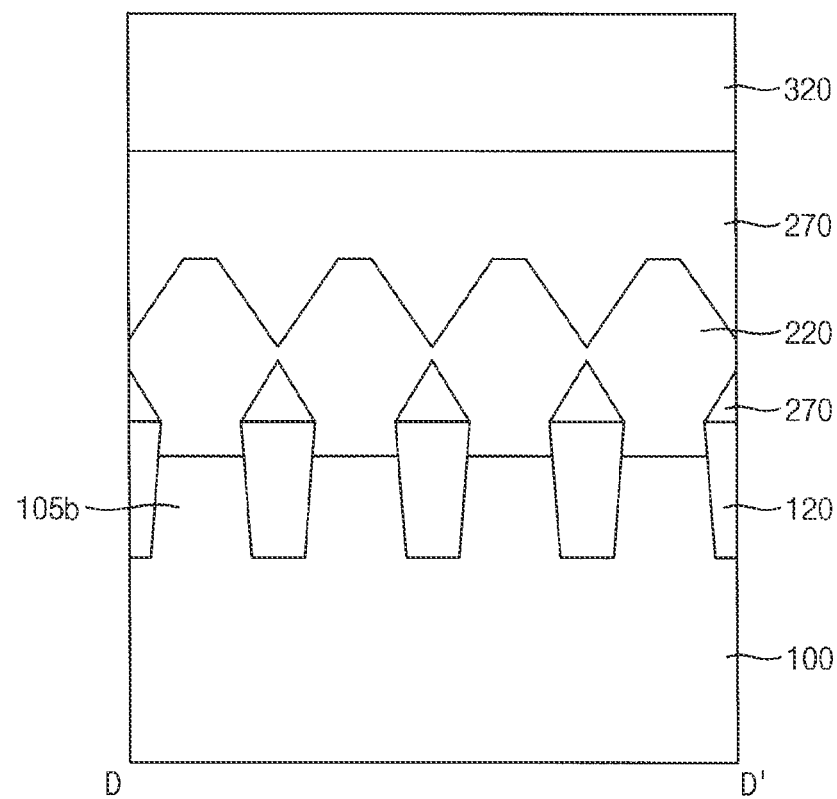

In an embodiment according to the inventive concepts, the ESD protection device illustrated with reference to FIGS. 52 to 55 may be employed by a logic device, and the EDS protection device shown in FIGS. 65 to 67 may be employed by an SRAM device; however, this embodiment may not be limited to such applications. Alternatively, the ESD protection device of FIGS. 52 to 55 and the ESD protection device of FIGS. 65 to 67 may be both employed by a logic device or an SRAM device. When both a logic device and an SRAM device are provided, one upper portion of the epitaxial layer 220 may have a pentagonal or hexagonal cross section and another upper portion of the epitaxial layer may have a cross section in the shape of a series of pentagons or hexagons.

Furthermore, note, the ESD protection device of FIGS. 64 to 67 may be manufactured in such a way that the sections of the epitaxial layer 220 may become connected to each other during the SEG process.

The above-described semiconductor devices and methods of manufacturing the semiconductor devices may be applied to various types of memory devices including a finFET and a source/drain layer formed by an SEG process. For example, any of the above-described semiconductor devices and methods of manufacturing the semiconductor devices may be applied to logic devices such as central processing units (CPUs), main processing units (MPUs), or application processors (APs). Additionally, any of the above-described semiconductor devices and methods of manufacturing the semiconductor devices may be applied to volatile memory devices such as DRAM devices or SRAM devices, or non-volatile memory devices such as flash memory devices, PRAM devices, MRAM devices, or RRAM devices.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of manufacturing an electrostatic discharge (ESD) protection device, the method comprising:
    forming a plurality of gate structures on a substrate, the substrate including an active fin extending in a first direction, and each gate structure of the plurality of gate structures extending in a second direction subtending an angle with the first direction and covering a respective part of the active fin;
    forming a recess on a portion of the active fin between gate structures;
    forming an epitaxial layer on the recess;
    implanting impurities into the epitaxial layer and the active fin to form an impurity region at a portion of the active fin under the epitaxial layer; and
    forming a contact plug contacting a top of the epitaxial layer,
    wherein:
    a central portion of the impurity region in the first direction has a thickness in a vertical direction substantially perpendicular to an upper surface of the substrate that is greater than a thickness in the vertical direction of an edge portion of the impurity region located to a side of the central portion in the first direction, the central portion and the edge portion of the impurity region entirely underlying the epitaxial layer, and a lowermost surface of the central portion of the impurity region being lower than a lowermost surface of the edge portion of the impurity region,
    a top of a central portion of the epitaxial layer is disposed at a level beneath that of an edge portion of the epitaxial layer in the first direction, and
    the contact plug overlaps the central portion of the impurity region in the vertical direction.

2. The method of claim 1, wherein the active fin includes a lower portion and an upper portion on the lower portion,
    wherein the method further comprises, prior to forming the plurality of gate structures on the substrate, forming an isolation layer to cover a side surface of the lower portion of the active fin, and
    wherein a bottom of the epitaxial layer is disposed at a level beneath that of a top of the lower portion of the active fin.

3. The method of claim 1, wherein the active fin includes a lower portion and an upper portion on the lower portion,
    wherein the method further comprises, prior to forming the plurality of gate structures on the substrate, forming an isolation layer to cover a side surface of the lower portion of the active fin, and
    wherein a bottom of the epitaxial layer is disposed at a level above that of a top of the lower portion of the active fin.

4. The method of claim 1, wherein the epitaxial layer extends in the first direction as viewed in plan, and is wider at portions thereof adjacent to the gate structures, respectively, than at a portion thereof located between the gate structures in the first direction.

5. The method of claim 1, wherein:
    the active fin is one of a plurality of active fins spaced apart from each other in the second direction,
    the epitaxial layer has a plurality of sections arranged in the second direction, and
    each of the sections of the epitaxial layer extends in the first direction as viewed in plan, and neighboring sections of the epitaxial layer in the second direction are connected to each other at portions thereof adjacent to the gate structures.

6. A method of manufacturing an electrostatic discharge (ESD) protection device, the method comprising:
    forming a plurality of gate structures spaced apart from each other in a first direction on a substrate, the substrate including an active fin extending in the first direction, and each gate structure of the plurality of gate structures extending in a second direction subtending an angle with the first direction and covering a respective part of the active fin;
    forming a plurality of recesses on portions, respectively, of the active fin between neighboring gate structures of the plurality of gate structures in the first direction;
    forming a plurality of epitaxial layers on the plurality of recesses, respectively, the plurality of epitaxial layers not vertically overlapping any gate structure of the plurality of gate structures;
    implanting impurities into the plurality of epitaxial layers and the active fin to form at least one impurity region in a portion of the active fin between the neighboring gate structures of the plurality of gate structures in the first direction, the at least one impurity region being located between neighboring epitaxial layers of the plurality of epitaxial layers in the first direction; and
    forming a contact plug to extend vertically at a location halfway between the neighboring gate structures of the plurality of gate structures, the contact plug contacting a top of one epitaxial layer of the plurality of epitaxial layers or the at least one impurity region.

7. The method of claim 6, wherein the at least one impurity region comprises an impurity region extending within an upper portion of the active fin interposed between the neighboring epitaxial layers of the plurality of epitaxial layers.

8. The method of claim 7, wherein the impurity region has an uppermost surface,
    and an uppermost surface of the plurality of epitaxial layers is disposed at a level above that of the uppermost surface of the impurity region.

9. The method of claim 6, wherein the at least one impurity region comprises a first impurity region extending within an upper portion of the active fin and interposed between the neighboring epitaxial layers of the plurality of epitaxial layers, and a second impurity region extending within a lower portion of the active fin and interposed between the neighboring epitaxial layers of the plurality of epitaxial layers.

10. The method of claim 6, wherein the contact plug contacts the top of the one epitaxial layer of the plurality of epitaxial layers.

\* \* \* \* \*